United States Patent
Shimizu et al.

(10) Patent No.: US 9,377,685 B2
(45) Date of Patent: *Jun. 28, 2016

(54) RESIST COMPOSITION AND METHOD OF FORMING RESIST PATTERN

(71) Applicant: Tokyo Ohka Kogyo Co., Ltd., Kawasaki (JP)

(72) Inventors: Hiroaki Shimizu, Kawasaki (JP); Tsuyoshi Nakamura, Kawasaki (JP); Jiro Yokoya, Kawasaki (JP); Hideto Nito, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/624,638

(22) Filed: Sep. 21, 2012

(65) Prior Publication Data

US 2013/0078572 A1   Mar. 28, 2013

(30) Foreign Application Priority Data

Sep. 22, 2011   (JP) .................................. 2011-207773
Sep. 27, 2011   (JP) .................................. 2011-211472

(51) Int. Cl.
*G03F 7/004*   (2006.01)
*G03F 7/38*    (2006.01)
*G03F 7/039*   (2006.01)

(52) U.S. Cl.
CPC ............ *G03F 7/0045* (2013.01); *G03F 7/0397* (2013.01); *G03F 7/38* (2013.01)

(58) Field of Classification Search
None
See application file for complete search history.

(56) References Cited

U.S. PATENT DOCUMENTS

| | | |
|---|---|---|
| 5,326,675 A | 7/1994 | Niki et al. |
| 5,429,910 A | 7/1995 | Hanawa |
| 5,595,856 A | 1/1997 | Mochizuki et al. |
| 5,627,010 A | 5/1997 | Pai et al. |
| 5,645,979 A | 7/1997 | Mochizuki et al. |

(Continued)

FOREIGN PATENT DOCUMENTS

| | | |
|---|---|---|
| JP | A-05-055102 | 3/1993 |
| JP | A-05-216244 | 8/1993 |

(Continued)

OTHER PUBLICATIONS

English Translation of JP2010160447.*

(Continued)

*Primary Examiner* — Cynthia H Kelly
*Assistant Examiner* — Anna Malloy
(74) *Attorney, Agent, or Firm* — Knobbe Martens Olson & Bear LLP

(57) ABSTRACT

A resist composition used in a method of forming a resist pattern including applying a resist composition comprising a base component that exhibits increased solubility in an alkali developing solution and a photo-base generator component to a substrate to form a resist film; subjecting the resist film to exposure; baking after subjecting the resist film to exposure, wherein at an exposed portion of the resist film, the base generated from the photo-base generator component upon exposure and an acid provided to the resist film in advance are neutralized, and at an unexposed portion of the resist film, the solubility of the base component in an alkali developing solution is increased by the action of acid provided to the resist film in advance; and subjecting the resist film to alkali development, thereby forming a negative-tone resist pattern.

9 Claims, 2 Drawing Sheets

(56) References Cited

U.S. PATENT DOCUMENTS

| | | | |
|---|---|---|---|
| 5,650,261 A * | 7/1997 | Winkle | 430/270.1 |
| RE35,821 E | 6/1998 | Niki et al. | |
| 5,945,517 A | 8/1999 | Nitta et al. | |
| 6,153,733 A | 11/2000 | Yukawa et al. | |
| 6,420,503 B1 | 7/2002 | Jayaraman et al. | |
| 6,653,043 B1 | 11/2003 | Hanabata | |
| 6,815,142 B1 | 11/2004 | Kimura et al. | |
| 7,625,690 B2 | 12/2009 | Mizutani et al. | |
| 7,968,276 B2 | 6/2011 | Takeshita | |
| 8,268,529 B2 | 9/2012 | Dazai et al. | |
| 8,486,605 B2 | 7/2013 | Takeshita et al. | |
| 2002/0160316 A1 * | 10/2002 | Richter et al. | 430/324 |
| 2002/0160318 A1 | 10/2002 | Richter et al. | |
| 2002/0187436 A1 | 12/2002 | Richter et al. | |
| 2003/0008240 A1 | 1/2003 | Elian et al. | |
| 2003/0211417 A1 | 11/2003 | Fryd et al. | |
| 2004/0110085 A1 | 6/2004 | Iwai et al. | |
| 2006/0234164 A1 | 10/2006 | Rhodes et al. | |
| 2007/0105040 A1 | 5/2007 | Toukhy et al. | |
| 2008/0153030 A1 | 6/2008 | Kobayashi et al. | |
| 2008/0248420 A1 | 10/2008 | Kanna | |
| 2009/0155715 A1 | 6/2009 | Chen et al. | |
| 2009/0155718 A1 | 6/2009 | Chen et al. | |
| 2009/0197204 A1 | 8/2009 | Shiono et al. | |
| 2009/0317743 A1 | 12/2009 | Shiono et al. | |
| 2010/0035192 A1 | 2/2010 | Ando et al. | |
| 2010/0047724 A1 | 2/2010 | Takeshita et al. | |
| 2010/0143844 A1 | 6/2010 | Takeshita et al. | |
| 2010/0178618 A1 | 7/2010 | Hatakeyama et al. | |
| 2010/0304297 A1 | 12/2010 | Hatakeyama et al. | |
| 2010/0310985 A1 | 12/2010 | Mori et al. | |
| 2011/0014570 A1 | 1/2011 | Mizutani et al. | |
| 2011/0033803 A1 | 2/2011 | Hatakeyama et al. | |
| 2011/0091812 A1 * | 4/2011 | Hatakeyama et al. | 430/284.1 |
| 2011/0117499 A1 | 5/2011 | Matsumiya et al. | |
| 2011/0233048 A1 | 9/2011 | Kuramoto et al. | |
| 2011/0318691 A1 * | 12/2011 | Tsuchimura et al. | 430/285.1 |
| 2012/0177891 A1 | 7/2012 | Millward et al. | |
| 2012/0202158 A1 | 8/2012 | Hatakeyama et al. | |
| 2013/0017500 A1 * | 1/2013 | Yokoya et al. | 430/325 |
| 2013/0164693 A1 | 6/2013 | Takeshita et al. | |

FOREIGN PATENT DOCUMENTS

| | | |
|---|---|---|
| JP | A-06-186754 | 7/1994 |
| JP | A-06-194847 | 7/1994 |
| JP | A-07-253676 | 10/1995 |
| JP | A-07-261393 | 10/1995 |
| JP | A-08-095246 | 4/1996 |
| JP | A-08-220754 | 8/1996 |
| JP | A-09-208554 | 8/1997 |
| JP | A-10-077264 | 3/1998 |
| JP | A-11-035551 | 2/1999 |
| JP | A-11-035552 | 2/1999 |
| JP | A-11-035573 | 2/1999 |
| JP | A-11-322707 | 11/1999 |
| JP | 2000010270 A * | 1/2000 |
| JP | A-2000-235263 | 8/2000 |
| JP | A-2000-267298 | 9/2000 |
| JP | A-2000-330270 | 11/2000 |
| JP | A-2003-241385 | 8/2003 |
| JP | A-2006-291177 | 10/2006 |
| JP | A-2007-173274 | 7/2007 |
| JP | A-2007-279493 | 10/2007 |
| JP | A-2007-334036 | 12/2007 |
| JP | A-2008-174515 | 7/2008 |
| JP | A-2008-247747 | 10/2008 |
| JP | A-2009-002999 | 1/2009 |
| JP | A-2009-025723 | 2/2009 |
| JP | A-2009-080452 | 4/2009 |
| JP | A-2010-002870 | 1/2010 |
| JP | A-2010-032994 | 2/2010 |
| JP | A-2010-040849 | 2/2010 |
| JP | 2010152299 A * | 7/2010 |
| JP | 2010160447 A * | 7/2010 |
| JP | A-2010-152299 | 7/2010 |
| JP | A-2010-160447 | 7/2010 |
| JP | A-2010-217855 | 9/2010 |
| JP | A-2010-277043 | 12/2010 |
| JP | A-2011-008001 | 1/2011 |
| JP | A-2011-008237 | 1/2011 |
| JP | A-2011-013569 | 1/2011 |
| JP | A-2011-508246 | 3/2011 |
| JP | A-2011-102974 | 5/2011 |
| JP | A-2011-118198 | 6/2011 |
| JP | A-2011-128226 | 6/2011 |
| JP | A-2011-225645 | 11/2011 |
| JP | A-2012-018197 | 1/2012 |
| JP | A-2013-114219 | 6/2013 |
| JP | A-2013-174663 | 9/2013 |
| JP | A-2014-214399 | 11/2014 |
| TW | 201027244 A1 | 7/2010 |
| WO | WO 2004/074242 A2 | 9/2004 |
| WO | WO 2009/074522 A1 | 6/2009 |
| WO | WO 2010/064631 A1 | 6/2010 |

OTHER PUBLICATIONS

English Translation of JP2010152299.*
English Translation of JP2000010270.*
Ebihara, et al., Proceedings of SPIE (U.S.), vol. 5256, pp. 985-994 (2003).
Gil, et al., Proceedings of SPIE (U.S.), vol. 5754, pp. 119-128 (2005).
Borodovsky, Proceedings of SPIE (U.S.), vol. 6153, pp. 615301-1 to 615301-19 (2006).
Landie et al., "Fundamental Investigation of Negative Tone Development (NTD) for the 22nm node (and beyond)" Proceedings of SPIE, vol. 7972, pp. 797206-1-797206-12, 2011.
Office Action issued on Dec. 18, 2013 in U.S. Appl. No. 13/467,549.
Office Action issued on Aug. 23, 2013 in U.S. Appl. No. 13/667,237.
Office Action issued on Sep. 13, 2013 in U.S. Appl. No. 13/624,639.
Office Action mailed Mar. 27, 2014 in U.S. Appl. No. 13/667,237.
Office Action mailed Apr. 2, 2014 in U.S. Appl. No. 13/626,549.
Office Action issued on Jun. 5, 2014 in U.S. Appl. No. 13/732,632.
Office Action issued on Jun. 18, 2014 in U.S. Appl. No. 13/614,017.
Office Action issued on Jun. 18, 2014 in U.S. Appl. No. 13/718,269.
Notice of Allowance in U.S. Appl. No. 13/732,632, mailed Oct. 7, 2014.
Office Action in U.S. Appl. No. 13/850,685, mailed Oct. 20, 2014.
Office Action in U.S. Appl. No. 13/624,639, mailed Oct. 30, 2014.
Cho et al. Polymer Bound Photobase Generators and Photoacid Generators for Pitch Division Lithography. Apr. 16, 2011. Proc. of SPIE vol. 7972 p. 797221-1 to 797221-8.
Office Action in U.S. Appl. No. 13/626,549, mailed May 15, 2015.
Office Action in Japanese Application No. 2011-280211, mailed Jun. 16, 2015.
Office Action in Japanese Application No. 2012-003412, mailed Jul. 21, 2015.
Office Action in Japanese Application No. 2012-022408, mailed Aug. 18, 2015.
Office Action in Taiwanese Patent Application No. 101135300, mailed Oct. 26, 2015.
Office Action in Japanese Patent Application No. 2012-140216, mailed Jan. 5, 2016.
Yaguchi, H; "Photoinduced Depolymerization of Poly(olefin sulfone)s Possessing Photobase Generating Groups in the Side Chain" Macromolecules 2007, 40, pp. 9332-9338.
Office Action in U.S. Appl. No. 14/581,209, mailed Sep. 8, 2015.

* cited by examiner

RESIST COMPOSITION AND METHOD OF FORMING RESIST PATTERN

TECHNICAL FIELD

The present invention relates to a method of forming a resist pattern in which a negative resist pattern is formed by developing with an alkali developing solution.

This application claims priority under 35 U.S.C. §119(a)-(d) to Japanese Patent Application No. 2011-207773, filed Sep. 22, 2011, and Japanese Patent Application No. 2011-211472, filed Sep. 27, 2011, the entire contents of which are incorporated herein by reference.

DESCRIPTION OF RELATED ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed, for example, using a lithography method or a nanoimprint method or the like. In lithography techniques, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, organic solvents such as aromatic solvents, aliphatic hydrocarbon solvents, ether solvents, ketone solvents, ester solvents, amide solvents and alcohol solvents are used as the developing solution (for example, see Patent Documents 1 and 2).

In recent years, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as a sensitivity to the exposure light source and a resolution capable of reproducing patterns of minute dimensions. As resist materials which satisfy such requirements, chemically amplified resists are known.

As a chemically amplified composition, a composition including a base component that exhibits a changed solubility in a developing solution under the action of acid and an acid-generator component that generates acid upon exposure is generally used. For example, in the case where an alkali developing solution is used as a developing solution (alkali developing process), a base component which exhibits increased solubility in an alkali developing solution under action of an acid is used.

Conventionally, a resin (base resin) is typically used as the base component of a chemically amplified resist composition. Resins that contain structural units derived from (meth) acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin contains a plurality of structural units for improving lithography properties and the like. For example, a structural unit having a lactone structure and a structural unit having a polar group such as a hydroxy group are used, as well as a structural unit having an acid decomposable group which is decomposed by the action of acid generated from an acid generator to form an alkali soluble group (for example, see Patent Document 3). When the base resin is an acrylic resin, as the acid decomposable group, in general, resins in which the carboxy group of (meth)acrylic acid or the like has been protected with an acid dissociable group such as a tertiary alkyl group or an acetal group are used.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted by applying a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

As a lithography technique which has been recently proposed, a double patterning method is known in which patterning is conducted two or more times to form a resist pattern (for example, see Non-Patent Documents 2 and 3). There are several different types of double patterning process, for example, (1) a method in which a lithography step (from application of resist compositions to exposure and developing) and an etching step are performed twice or more to form a pattern and (2) a method in which the lithography step is successively performed twice or more. According to the double patterning method, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus.

Moreover, a double exposure process has also been proposed in which a resist film is formed, and the resist film is subjected to exposure twice or more, followed by development to form a resist pattern (for example, see Patent Document 4). Like the double patterning process described above, this type of double exposure process is also capable of forming a resist pattern with a high level of resolution, and also has an advantage in that fewer number of steps is required than the above-mentioned double patterning process.

In a positive tone development process using a positive type, chemically amplified resist composition (i.e., a chemically amplified resist composition which exhibits increased alkali solubility in an alkali developing solution upon exposure) in combination with an alkali developing solution, as described above, the exposed portions of the resist film are dissolved and removed by an alkali developing solution to thereby form a resist pattern. The positive tone process using a combination of a positive chemically amplified resist composition and an alkali developing solution is advantageous over a negative tone development process in which a negative type, chemically amplified resist composition is used in combination with an alkali developing solution in that the structure of the photomask can be simplified, a satisfactory contrast for forming an image can be reliably obtained, and the characteristics of the formed resist pattern are excellent. For these reasons, currently, positive-tone development process using a combination of a positive chemically amplified resist composition and an alkali developing solution is mainly employed in the formation of an extremely fine resist pattern.

DOCUMENTS OF RELATED ART

[Patent Document]
[Patent Document 1] Japanese Unexamined Patent Application, First Publication No. Hei 6-194847
[Patent Document 2] Japanese Unexamined Patent Application, First Publication No. 2009-025723
[Patent Document 3] Japanese Unexamined Patent Application, First Publication No. 2003-241385
[Patent Document 4] Japanese Unexamined Patent Application, First Publication No. 2010-040849
[Non-Patent Documents]
[Non-Patent Document 1] Proceedings of SPIE (U.S.), vol. 5754, pp. 119-128 (2005)
[Non-Patent Document 2] Proceedings of SPIE (U.S.), vol. 5256, pp. 985-994 (2003)
[Non-Patent Document 3] Proceedings of SPIE (U.S.), vol. 6153, pp. 615301-1-19 (2006)

SUMMARY OF THE INVENTION

As further progress is made in lithography techniques and the application field for lithography techniques expands, further improvement in various lithography properties is demanded in a positive-tone developing process using a combination of a positive chemically amplified resist composition and an alkali developing solution. For example, in the case of the formation of an extremely small pattern such as an isolated trench pattern, an extremely small and dense contact hole pattern in the positive tone development process, a region where the optical strength becomes weak is likely to be generated especially in the film thickness direction, thereby deteriorating the resolution of the resist pattern, and improving in resolution of the resist pattern is difficult, and various defects in the shape of the resist pattern are likely to occur.

Therefore, in the formation of the aforementioned extremely small pattern, a method of forming a resist pattern (negative pattern) in which regions where the optical strength becomes weak are selectively dissolved and removed is useful. As a method of forming a negative pattern using a chemically amplified resist composition used in a positive-tone developing process which is the mainstream, a method in which a developing solution containing an organic solvent (organic developing solution) is used in combination with a chemically amplified resist composition is known. However, negative-tone developing process using the organic developing solution is inferior to a positive-tone developing process using an alkali developing solution in combination with a chemically amplified resist composition in terms of environment, apparatus and cost.

In order to solve these problems, a new method of forming a resist pattern exhibiting high resolution and having an excellent shape is demanded.

In order to satisfying these demand, as a method of forming a negative pattern having high resolution by an alkali developing solution, the present inventors have found a method capable of forming a negative pattern in which a resist film is formed from a resist composition containing a base component that exhibits increased solubility in an alkali developing solution by the action of acid and containing a photo-base generator component that generates a base upon exposure, so that exposed portions are retained and unexposed portions are dissolved and removed by an alkali developing solution, thereby forming a negative pattern, and have filed a patent application on the method (see Japanese Patent Application No. 2011-106577). In the method of forming a negative pattern, a resist film is formed by applying a resist composition containing a base component (A) that exhibits increased solubility in an alkali developing solution by the action of acid and a photo-base generator component (C) that generates a base upon exposure onto the substrate, and the resist film is then subjected to exposure, and then bake (post exposure bake (PEB) is conducted. During this process, at the exposed portions of the resist film, an acid provided to the resist film in advance is neutralized by a base generated from a photo-base generator component upon exposure. On the other hand, at the unexposed portions of the resist film, the solubility of the base component in an alkali developing solution is increased by the action of the acid. Therefore, the resist film after PEB is subjected to an alkali development, the unexposed portion of the resist film is dissolved and removed, and thereby forming a negative-tone resist pattern.

However, In the method described above, sensitivity is likely to deteriorate. Deterioration of sensitivity causes a reduced throughput, and therefore, improvement in the sensitivity is required.

The present invention takes the above circumstances into consideration, with an object of providing a method of forming a resist pattern by which a resist pattern with high resolution and high sensitivity can be formed by an alkali developing process, and a resist composition suitable for the aforementioned method.

As a result of intensive studies, the present inventors have found a method capable of forming a negative pattern in which a resist film formed from a resist composition containing a base component that exhibits increased solubility in an alkali developing solution by the action of acid and containing a photo-base generator component that generates a base upon exposure, so that the exposed portions are retained and unexposed portions are dissolved and removed by an "alkali developing solution" (see Japanese Patent Application No. 2011-106577).

As a result of intensive studies, the present inventors have obtained following findings.

In the positive-tone developing process to form a positive pattern by combination of a chemically amplified positive resist composition and an alkali developing solution, PEB is conducted to increase sufficiently the solubility of a base component in an alkali developing solution by the action of acid. If PEB is insufficiently conducted, resolution and sensitivity are deteriorated. However, in the aforementioned method of forming a negative pattern, as an unusual result, in the case where PEB temperature is greater than 100° C., sensitivity is deteriorated rapidly.

As a result of further studies of the present inventors, it has been found that the aforementioned problems could be solved by selecting a specific photo-base generator component. The present invention has been completed based on this finding.

The present invention has been completed based on the aforementioned findings and has the aspects described below.

A first aspect of the present invention is a resist composition which is used in a method of forming a resist pattern which includes: a step (1) in which a resist composition containing a base component that exhibits increased solubility in an alkali developing solution by the action of acid and a photo-base generator component that generates a base upon exposure is applied to a substrate to form a resist film; a step (2) in which the resist film is subjected to exposure; a step (3) in which baking is conducted after the step (2), such that, at an exposed portion of the resist film, the base generated from the photo-base generator component upon exposure and an acid provided to the resist film in advance are neutralized, and at an unexposed portion of the resist film, the solubility of the base component in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed, wherein the photo-base generator component includes a compound represented by general formula (C1-1-1) shown below.

[Chemical Formula 1]

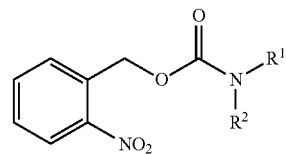

(C1-1-1)

In the formula, each of $R^1$ and $R^2$ independently represents a hydrogen atom, an alkyl group which may have a substituent, or a phenyl group which may have a substituent, provided that at least one of $R^1$ and $R^2$ represents an alkyl group or a phenyl group, and $R^1$ and $R^2$ may be mutually bonded to form a ring together with the nitrogen atom in the formula.

A second aspect of the present invention is a method of forming a resist pattern which includes: a step (1) in which a resist composition is applied on a substrate to form a resist film, the resist composition containing a base component that exhibits increased solubility in an alkali developing solution by the action of acid and a photo-base generator component that generates a base upon exposure and contains a compound represented by general formula (C1-1-1) shown below; a step (2) in which the resist film is subjected to exposure; a step (3) in which baking is conducted after the step (2), such that, at an exposed portion of the resist film, the base generated from the photo-base generator component upon exposure and an acid provided to the resist film in advance are neutralized, and at an unexposed portion of the resist film, the solubility of the base component in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed.

[Chemical Formula 2]

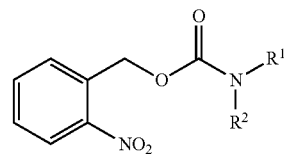

(C1-1-1)

In the formula, each of $R^1$ and $R^2$ independently represents a hydrogen atom, an alkyl group which may have a substituent, or a phenyl group which may have a substituent, provided that at least one of $R^1$ and $R^2$ represents an alkyl group or a phenyl group, and $R^1$ and $R^2$ may be mutually bonded to form a ring with the nitrogen atom in the formula.

A third aspect of the present invention is a method of forming a resist pattern which includes: a step (1) in which a resist composition containing a base component that exhibits increased solubility in an alkali developing solution by the action of acid and a photo-base generator component that generates a base upon exposure is applied to a substrate to form a resist film; a step (2) in which the resist film is subjected to exposure; a step (3) in which baking is conducted after the step (2), such that, at an exposed portion of the resist film, the base generated from the photo-base generator component upon exposure and an acid provided to the resist film in advance are neutralized, and at an unexposed portion of the resist film, the solubility of the base component in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed.

In the present description and claims, the term "exposure" is used as a general concept that includes irradiation with any form of radiation.

The term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic divalent saturated hydrocarbon, unless otherwise specified.

A "halogenated alkyl group" is a group in which part or all of the hydrogen atoms of an alkyl group are substituted with a halogen atom, and a "halogenated alkylene group" is a group in which part or all of the hydrogen atoms of an alkylene group is substituted with a halogen atom. Examples of the halogen atom include a fluorine atom, a chlorine atom, a bromine atom and an iodine atom.

A "hydroxyalkyl group" is a group in which part or all of the hydrogen atoms within an alkyl group have been substituted with a hydroxyl group.

The term "structural unit" refers to a monomer unit that contributes to the formation of a polymeric compound (resin, polymer, copolymer).

According to the present invention, there are provided a method of forming a resist pattern by which a resist pattern with high resolution and having an excellent shape can be formed by an alkali developing process, and a resist composition suitable for the aforementioned method.

DETAILED DESCRIPTION OF THE INVENTION

<<Resist Composition>>

Figure 1:
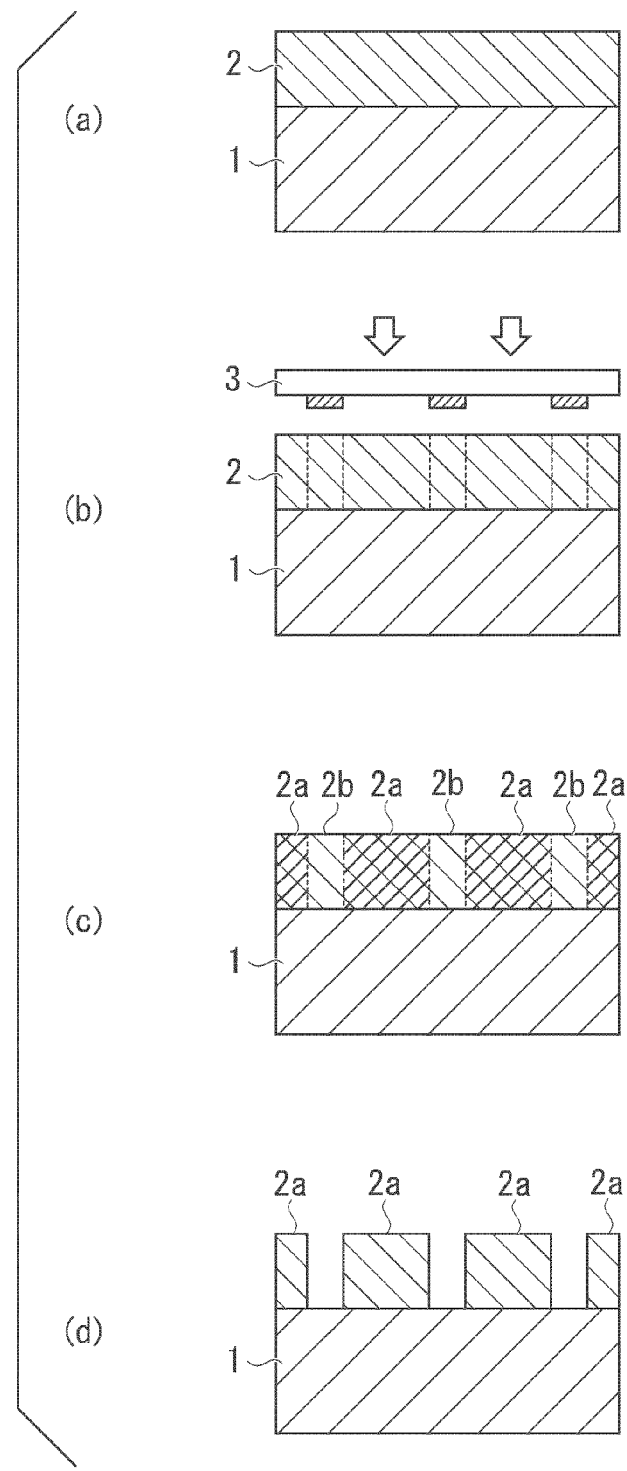
FIG. 1 is a schematic diagram showing an example of one embodiment of the method of forming a resist pattern according to the present invention.

A resist composition according to a first aspect of the present invention is a resist composition which is used in a method of forming a resist pattern which includes: a step (1) in which a resist composition containing a base component that exhibits increased solubility in an alkali developing solution by the action of acid and a photo-base generator component that generates a base upon exposure is applied to a substrate to form a resist film; a step (2) in which the resist film is subjected to exposure; a step (3) in which baking is conducted after the step (2), such that, at an exposed portion of the resist film, the base generated from the photo-base generator component upon exposure and an acid provided to the resist film in advance are neutralized, and at an unexposed portion of the resist film, the solubility of the base component in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed, wherein the resist composition is used in the step (1).

The resist composition of the present invention includes a base component (A) (hereafter, referred to as "component (A)") which exhibits increased solubility in an alkali developing solution under action of an acid, and a photo-base generator component (C) (hereafter, referred to as "component (C)") which generates base upon exposure, and is used in the aforementioned step (1).

The method of forming a resist pattern including the aforementioned steps (1) to (4) will be described later.

In the present invention, a "negative-tone resist pattern" refers to a resist pattern in which an unexposed portion of the resist film is dissolved and removed by an alkali developing solution, and an exposed portion remains as a pattern. The resist composition capable of forming the negative-tone resist pattern is frequently referred to as "negative resist composition". That is, the resist composition of the present invention is a negative resist composition.

An "acid provided to the resist film in advance" includes an acid which is derived from an acid supply component and which is added to the resist composition used for forming the resist film in advance, or an acid derived from an acid supply component and attached to the resist film prior to baking in step (3).

As the acid supply component (hereafter, referred to as "component (Z)"), an acidic compound component (hereafter, referred to as "component (G)") and an acid generator component (hereafter, referred to as "component (B)") can be mentioned.

The acidic compound is a compound which exhibits acidity by itself, that is, a compound which has a function as a proton donor.

As the acid generator component, a thermal-acid generator component which generates acid by heating, and a photo-acid generator component which generates acid upon exposure can be mentioned.

As the component (Z), one type may be used, or two or more types of compounds may be used in combination. For example, an acidic compound and an acid generator component are used in combination, and a thermal-acid generator component and an photo-acid generator component are also used in combination. The specific examples of the component (Z) will be described later.

In the method of forming a resist pattern according to the third aspect of the present invention, a resist composition which includes at least a base component (A) (hereafter, referred to as "component (A)") which exhibits increased solubility in an alkali developing solution under action of an acid, and a photo-base generator component (C) (hereafter, referred to as "component (C)") which generates base upon exposure.

The resist composition used in the aforementioned first aspect of the present invention further includes an acid supply component (hereafter, referred to as "component (G)"), in addition to the component (A) and the component (C). The resist composition used in the aforementioned second aspect of the present invention may or may not include the component (Z).

As the component (Z), an acidic compound component (hereafter, referred to as "component (Z)") and an acid generator component (hereafter, referred to as "component (B)") can be mentioned. In addition, an acid amplifier component (hereafter, referred to as "component (H)") and at least the component (G) and component (B) may be used in combination.

Hereinbelow, each of these components will be described.

<Base Component; Component (A)>

The component (A) is a base component which exhibits increased solubility in an alkali developing solution under action of an acid.

The term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound which can be used as a base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "resin" refers to a polymer having a molecular weight of 1,000 or more.

The molecular weight of the polymeric compound is the weight average molecular weight in terms of the polystyrene equivalent value determined by gel permeation chromatography (GPC).

As the component (A), a base component which exhibits increased polarity by the action of acid (hereafter, referred to as "component (A0)") is preferably used.

In the present invention, in the case of using the component (A0), since the polarity of the component (A0) at the exposed portions changes before and after baking treatment in the step (3), an excellent development contrast can be obtained by an alkali developing process.

The component (A0) may be a resin component that exhibits increased polarity under the action of acid, a low molecular weight material that exhibits increased polarity under the action of acid, or a mixture thereof.

It is preferable that the component (A0) is a resin component which exhibits increased polarity by the action of acid, and it is particularly preferable that the component (A0) includes a polymeric compound (A1) (hereafter, referred to as "component (A1)") which has a structural unit (a1) containing an acid decomposable group that exhibits increased polarity by the action of acid.

The component (A1) preferably includes at least one structural unit selected from the group consisting of a structural unit (a0) containing a $-SO_2-$containing cyclic group and a structural unit (a2) containing a lactone-containing cyclic group, as well as the structural unit (a1).

Furthermore, it is preferable that the component (A1) include a structural unit (a3) containing a polar group-containing aliphatic hydrocarbon group, as well as the structural unit (a1) and at least one structural unit selected from the group consisting of the structural unit (a0) and the structural unit (a2).

In addition to the structural unit (a1) or in addition to the structural unit (a1) and structural unit (a0), it is preferable that the component (A1) further includes a structural unit (a2') derived from an acrylate ester which may have the hydrogen atom bonded to the carbon atom on the α-position substituted with a substituent and contains a lactone-containing cyclic group.

In addition to the structural unit (a1) or in addition to the structural unit (a1) and at least one selected from the structural unit (a0) and structural unit (a2'), it is preferable that the component (A1) further include a structural unit (a3') derived from an acrylate ester containing a polar group-containing aliphatic hydrocarbon group and may have the hydrogen atom bonded to the carbon atom on the α-position substituted with a substituent.

In the present descriptions and the claims, the expression "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

The acrylate ester may have a hydrogen atom bonded to the carbon atom on the α-position may be substituted with a substituent. Examples of the substituent bonded to the carbon atom on the α-position include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

In the present specification, an acrylic acid and acrylate ester in which the hydrogen atom bonded to the carbon atom on the α-position has been substituted with a substituent are referred to as an "α-substituted acrylic acid" and an "α-substituted acrylate ester", respectively.

Further, acrylic acid and α-substituted acrylic acid are collectively referred to as "(α-substituted) acrylic acid", and acrylate esters and α-substituted acrylate esters are collectively referred to as "(α-substituted) acrylate ester".

As the alkyl group for the substituent at the α-position in the α-substituted acrylate ester, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group at the α-position include groups in which part or all of the hydrogen atoms of the aforementioned alkyl group for the substituent at the α-position are substituted with halogen atoms. Examples of the halogen atom include a fluorine atom, a chlorine atom, a bromine atom and an iodine atom, and a fluorine atom is particularly preferred.

It is preferable that a hydrogen atom, an alkyl group of 1 to 5 carbon atoms or a halogenated alkyl group of 1 to 5 carbon atoms is bonded to the α-position of the acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

[Structural Unit (a1)]

The structural unit (a1) is a structural unit containing an acid decomposable group which exhibits increased polarity by the action of acid.

The term "acid decomposable group" refers to a group in which at least a part of the bond within the structure thereof is cleaved by the action of acid.

Examples of acid decomposable groups which exhibit increased polarity by the action of acid include groups which are decomposed by the action of acid to form a polar group.

Examples of the polar group include a carboxy group, a hydroxy group, an amino group and a sulfo group ($-SO_3H$). Among these, a polar group containing $-OH$ in the structure thereof (hereafter, referred to as "OH-containing polar group") is preferable, a carboxy group or a hydroxy group is more preferable, and a carboxy group is particularly desirable.

Specific examples of an acid decomposable group include a group in which the aforementioned polar group has been protected with an acid dissociable group (such as a group in which a hydrogen atom of the OH-containing polar group has been protected with an acid dissociable group) can be given.

An "acid dissociable group" is a group exhibits acid dissociable properties that at least the bond between an acid dissociable group and an atom adjacent to the acid dissociable group is cleaved by the action of acid. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than the acid dissociable group is generated, thereby increasing the polarity. As a result, the polarity of the entire component (A1) is increased. When the polarity of the polymer is increased, the solubility of the polymer in a developing solution is relatively changed. When an alkali developing solution is used, the solubility in the alkali developing solution is increased.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

The term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula —C($R^{71}$)($R^{72}$)($R^{73}$) can be given. In the formula, each of $R^{71}$ to $R^{73}$ independently represents a linear alkyl group of 1 to 5 carbon atoms. The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic cyclic group" refers to a monocyclic group or polycyclic group that has no aromaticity.

In the "aliphatic cyclic group-containing acid dissociable group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these aliphatic cyclic hydrocarbon groups, part of the carbon atoms constituting the ring may be replaced with an ethereal oxygen atom (—O—).

Examples of aliphatic cyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable group on the ring skeleton of the aliphatic cyclic group is bonded, an alkyl group can be mentioned. Examples of the alkyl group include the same groups as those represented by $R^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 3]

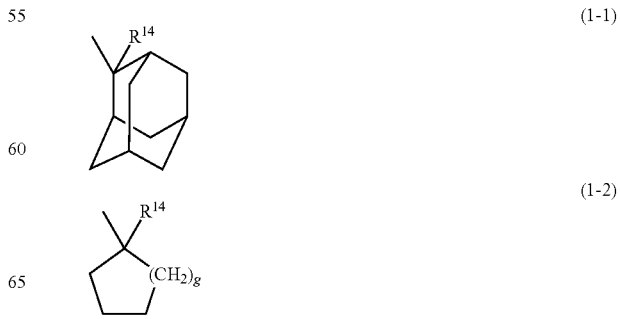

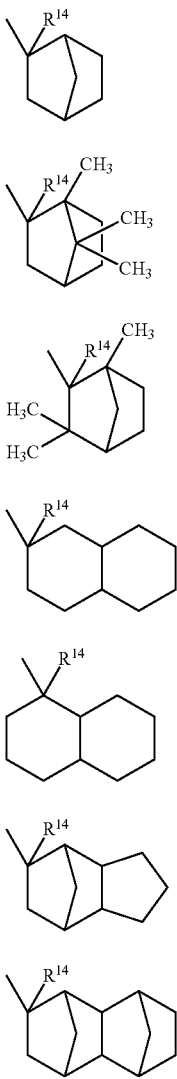

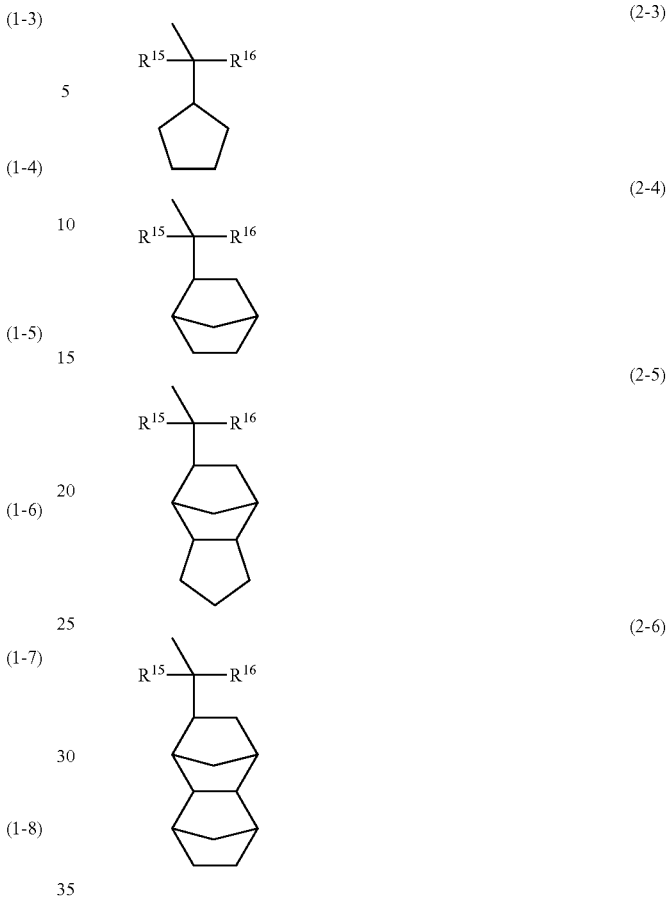

In the formulas above, $R^{14}$ represents an alkyl group; and g represents an integer of 0 to 8.

[Chemical Formula 4]

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is most desirable.

g is preferably an integer of 0 to 3, more preferably 1 to 3, and still more preferably 1 or 2.

In formulas (2-1) to (2-6), as the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. The acid acts to break the bond between the acetal-type acid dissociable group and the oxygen atom to which the acetal-type, acid dissociable group is bonded, thereby forming an OH-containing polar group such as a carboxy group or a hydroxy group.

Examples of acetal-type acid dissociable groups include groups represented by general formula (p1) shown below.

[Chemical Formula 5]

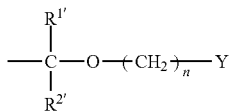

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the lower alkyl group for $R^{1'}$ and $R^{2'}$, the same alkyl groups as those described above as the substituent on the α-position of the aforementioned alkylester can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable group (p1) is a group represented by general formula (p1-1) shown below.

[Chemical Formula 6]

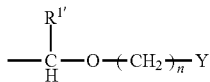

(p1-1)

In the formula, $R^{1'}$, n and Y are the same as defined above.

As the alkyl group for Y, the same alkyl groups as those described above for the substituent which may be bonded to the carbon atom on the α-position of the aforementioned α-substituted acrylate ester can be mentioned.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable group containing an aliphatic cyclic group" can be used.

Further, as the acetal-type, acid dissociable group, groups represented by general formula (p2) shown below can also be used.

[Chemical Formula 7]

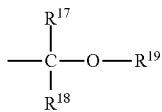

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

Examples of the structural unit (a1) include a structural unit which derived from an acrylate ester which may have the hydrogen atom bonded to the carbon atom on the α-position substituted with a substituent and contains an acid decomposable group which exhibits increased polarity by the action of acid; a structural unit in which at least part of the hydrogen atoms of the hydroxy group in a structural unit derived from a hydroxystyrene or hydroxystyrene derivatives has been protected with a substituent containing an acid decomposable group; and a structural unit in which at least part of the hydrogen atom of —C(=O)—OH in a structural unit derived from a vinylbenzoic acid or vinylbenzoic acid derivatives has been protected with a substituent containing an acid decomposable group.

Preferable examples of the acid decomposable group include the aforementioned tertiary alkyl ester-type acid dissociable groups and acetal-type acid dissociable groups.

In the present descriptions and the claims, the expression "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

An "acrylate ester" may have a hydrogen atom bonded to the carbon atom on the α-position substituted with a substituent. Examples of the substituent bonded to the carbon atom on the α-position include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

In the present specification, an acrylate ester in which the hydrogen atom bonded to the carbon atom on the α position has been substituted with a substituent is referred to as an "α-substituted acrylate ester". Further, acrylate esters and α-substituted acrylate esters are collectively referred to as "(α-substituted) acrylate ester".

As the alkyl group for the substituent at the α-position in the α-substituted acrylate ester, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group at the α-position include groups in which part or all of the hydrogen atoms of the aforementioned alkyl group for the substituent at the α-position are substituted with halogen atoms. Examples of the halogen atom include a fluorine atom, a chlorine atom, a bromine atom and an iodine atom, and a fluorine atom is particularly preferred.

Specific examples of the hydroxy alkyl group at the α-position include groups in which part or all of the hydrogen atoms of the aforementioned "alkyl group of 1 to 5 carbon atoms for the substituent at the α-position" are substituted with hydroxy group. The number of hydroxy groups within the hydroxyalkyl group is preferably 1 to 5, and most preferably 1.

It is preferable that a hydrogen atom, an alkyl group of 1 to 5 carbon atoms or a halogenated alkyl group of 1 to 5 carbon atoms is bonded to the α-position of the acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

A "structural unit derived from a hydroxystyrene or hydroxystyrene derivatives" refers to a structural unit that is formed by the cleavage of the ethylenic double bond of a hydroxystyrene or derivative thereof.

The term "hydroxystyrene derivatives" includes compounds in which the hydrogen atom at the α-position of a hydroxystyrene has been substituted with another substituent such as an alkyl group and a halogenated alkyl group, and derivatives thereof. Examples of the hydroxystyrene derivatives include a compound in which a hydrogen atom of the hydroxy group within hydroxystyrene has been substituted with an organic group and which may have a hydrogen atom bonded to the carbon atom on the α-position is substituted with a substituent, and a compound in which a substituent other than a hydroxy group is bonded to a benzene ring within hydroxystyrene which may have the hydrogen atom bonded to the carbon atom on the α-position substituted with a substituent A carbon atom on the α-position refers to the carbon atom bonded to the benzene ring, unless specified otherwise.

As the substituent with which a hydrogen atom on the α-position of a hydroxystylene is substituted, the same substituents as those described above for the substituent to be bonded to the carbon atom on the α-position of the α-substituted acrylate ester. In particular, it is preferable that a hydrogen atom, an alkyl group of 1 to 5 carbon atoms or a halogenated alkyl group of 1 to 5 carbon atoms is bonded to the α-position of the hydroxystylene, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

Examples of the substituent other than a hydroxy group, which may be bonded to the benzene ring of a hydroxystyrene which may have a hydrogen atom bonded to the carbon atom on the α-position substituted with a substituent, include a halogen atom, an alkyl group of 1 to 5 carbon atoms and a halogenated alkyl group of 1 to 5 carbon atoms, $-COOX^e$ ($X^e$ represents a hydrogen atom or an organic group). Examples of the halogen atom include a fluorine atom, a chlorine atom, a bromine atom and an iodine atom, and a fluorine atom is particularly preferred.

A "structural unit derived from a vinylbenzoic acid or vinylbenzoic acid derivatives" refers to a structural unit that is formed by the cleavage of the ethylenic double bond of a vinylbenzoic acid or derivative thereof.

The term "vinylbenzoic acid derivatives" includes compounds in which the hydrogen atom at the α-position of a vinylbenzoic acid has been substituted with another substituent such as an alkyl group and a halogenated alkyl group, and derivatives thereof. Examples of the vinylbenzoic acid derivatives include a compound in which a hydrogen atom of the carboxy group within the vinylbenzoic acid is substituted with an organic group and which may have the hydrogen atom bonded to the carbon atom on the α-position substituted with a substituent, and a compound in which a substituent other than a hydroxy group or carboxy group is bonded to a benzene ring within vinylbenzoic acid which may have the hydrogen atom bonded to the carbon atom on the α-position substituted with a substituent. A carbon atom on the α-position refers to the carbon atom bonded to the benzene ring, unless specified otherwise.

As the substituent with which a hydrogen atom bonded to the carbon atom on the α-position of a vinylbenzoic acid is substituted, the same substituents as those described above for the substituent bonded to the carbon atom on the α-position of the α-substituted acrylate ester. In particular, it is preferable that a hydrogen atom, an alkyl group of 1 to 5 carbon atoms or a halogenated alkyl group of 1 to 5 carbon atoms is bonded to the carbon atom on the α-position of the hydroxystylene, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

Examples of the substituent other than a hydroxy group or carboxy group, which may be bonded to the benzene ring of a vinylbenzoic acid which may have a hydrogen atom bonded to the carbon atom on the α-position substituted with a substituent, include a halogen atom, an alkyl group of 1 to 5 carbon atoms and a halogenated alkyl group of 1 to 5 carbon atoms. Examples of the halogen atom include a fluorine atom, a chlorine atom, a bromine atom and an iodine atom, and a fluorine atom is particularly preferred.

Among these, as the structural unit (a1), a structural unit derived from an acrylate ester which may have the hydrogen atom bonded to the carbon atom on the α-position substituted with a substituent is preferred.

Specific examples of the structural unit (a1) include a structural unit represented by general formula (a1-0-1) shown below and a structural unit represented by general formula (a1-0-2) shown below.

[Chemical Formula 8]

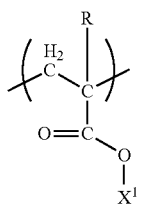
(a1-0-1)

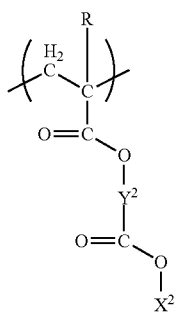
(a1-0-2)

In the formulas, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (a1-0-1), the alkyl group and the halogenated alkyl group for R are respectively the same alkyl group and the halogenated alkyl group as those described for a substituent which may be bonded to the carbon atom on the α-position of the aforementioned α-substituted acrylate ester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above.

$X^2$ is the same as defined above for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

A hydrocarbon "has a substituent" means that part or all of the hydrogen atoms within the hydrocarbon group is substituted with a substituent (a group or an atom other than hydrogen atom).

The hydrocarbon group may be either an aliphatic hydrocarbon group or an aromatic hydrocarbon group.

An "aliphatic hydrocarbon group" refers to a hydrocarbon group that has no aromaticity.

The divalent aliphatic hydrocarbon group as the divalent hydrocarbon group for $Y^2$ may be either saturated or unsaturated. In general, the divalent aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, an alicyclic hydrocarbon group (a group in which two hydrogen atoms have been removed from an aliphatic hydrocarbon ring), and a group in which the alicyclic hydrocarbon group is bonded to the terminal of the linear or branched aliphatic hydrocarbon group or interposed within the aforementioned linear or branched aliphatic hydrocarbon group, can be given. Examples of the linear or branched aliphatic hydrocarbon group include the same groups as described above.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group as a divalent hydrocarbon group for $Y^2$ preferably has 5 to 30 carbon atoms, more preferably 5 to 20, particularly preferably 6 to 15, and most preferably 6 to 10. Here, the number of carbon atoms within a substituent(s) is not included in the number of carbon atoms of the aromatic hydrocarbon group.

Examples of the aromatic ring in the aromatic hydrocarbon group include aromatic hydrocarbon rings such as benzene, biphenyl, fluorene, naphthalene, anthracene and phenanthrene and aromatic heterocycles in which part of the carbon atoms of the aromatic hydrocarbon ring have been substituted with a hetero atom. Examples of hetero atoms within the aromatic heterocycle include an oxygen atom, a nitrogen atom, and a sulfur atom.

Specific examples of the aromatic hydrocarbon group include a group in which two hydrogen atoms have been removed from the aromatic hydrocarbon ring (arylene group); a group in which one of hydrogen atom of the group in which one hydrogen atom has been removed from the aromatic hydrocarbon group (aryl group) is substituted with an alkylene group (for example, a group in which one hydrogen atom is removed from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and particularly preferably 1.

The aromatic hydrocarbon group may or may not have a substituent. For example, one or more of the hydrogen atoms bonded to the aromatic hydrocarbon ring in the aromatic hydrocarbon group may be substituted with a substituent. Examples of substituents include an alkyl group, an alkoxy group, a halogen atom, a halogenated alkyl group, a hydroxyl group and an oxygen atom (=O).

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

With respect to a "divalent linking group containing a hetero atom" for $Y^2$, a hetero atom is an atom other than carbon and hydrogen, and examples thereof include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, —NH—C(=O)—, =N— and a group represented by general formula —$Y^{21}$—O—$Y^{22}$—, —[$Y^{21}$—C(=O)—O]$_{m'}$—$Y^{22}$— and $Y^{21}$—O—C(=O)—$Y^{22}$— [in the formulas, each of $Y^{21}$ and $Y^{22}$ independently represents a divalent hydrocarbon group which may have a substituent, O represents an oxygen atom, and m' represents an integer of 0 to 3].

When $Y^2$ represents —NH—, H may be substituted with a substituent such as an alkyl group, an aryl group (an aromatic group) or the like. The substituent (an alkyl group, an aryl group or the like) preferably has 1 to 10 carbon atoms, more preferably 1 to 8, and particularly preferably 1 to 5.

In the formulas, —$Y^{21}$—O—$Y^{22}$—, —[$Y^{21}$—C(=O)—O]$_{m'}$—$Y^{22}$— or —$Y^{21}$—O—C(=O)—$Y^{22}$—, each of $Y^{21}$ and $Y^{22}$ independently represents a divalent hydrocarbon group which may have a substituent. As the divalent hydrocarbon group, the same groups as those described above for the "divalent hydrocarbon group which may have a substituent" in relation to $Y^2$ can be mentioned.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m'}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula —$Y^{21}$—O—$Y^{22}$—, —[$Y^{21}$—C(=O)—O]$_{m'}$—$Y^{22}$— or —$Y^{21}$—O—C(=O)—$Y^{22}$— is more preferable.

As the divalent linking group for $Y^2$, a linear or branched alkylene group, a divalent alicyclic hydrocarbon group or a divalent linking group containing a hetero atom is particularly desirable. Among these, a linear or branched alkylene group or a divalent linking group containing a hetero atom is more preferable.

Specific examples of the structural unit (a1) include structural units represented by general formulas (a1-1) to (a1-4) shown below.

[Chemical Formula 9]

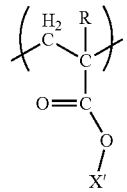

(a1-1)

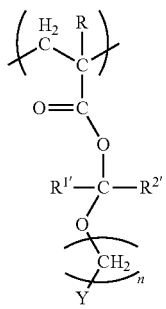
(a1-2)

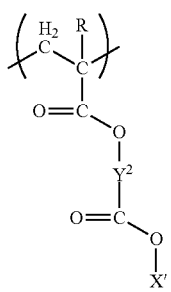
(a1-3)

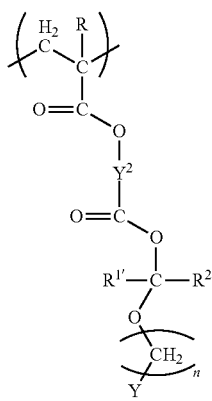
(a1-4)

In the formulas, R, $R^{1'}$, $R^{2'}$, n, Y and $Y^2$ are the same as defined above; and X' represents a tertiary alkyl ester-type acid dissociable group.

In the formulas, the tertiary alkyl ester-type acid dissociable group for X' include the same tertiary alkyl ester-type acid dissociable groups as those described above.

As $R^{1'}$, $R^{2'}$, n and Y are respectively the same as defined for $R^{1'}$, $R^{2'}$, n and Y in general formula (p1) described above in connection with the "acetal-type acid dissociable group".

$Y^2$ is the same as defined for $Y^2$ in general formula (a1-0-2).

Specific examples of structural units represented by general formulas (a1-1) to (a1-4) are shown below.

In the formulas shown below, $R^\alpha$ represents a hydrogen atom, a methyl group or a trifluoromethyl group.

[Chemical Formula 10]

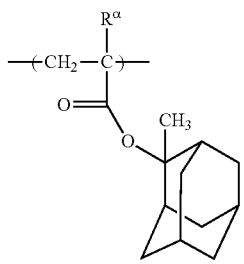
(a1-1-1)

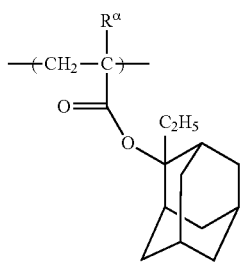
(a1-1-2)

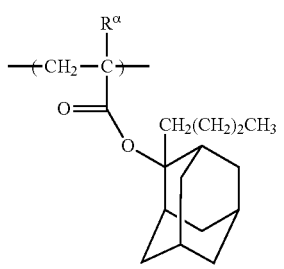
(a1-1-3)

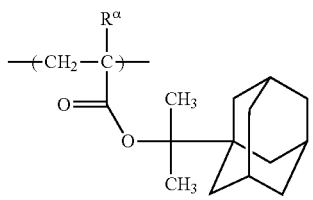
(a1-1-4)

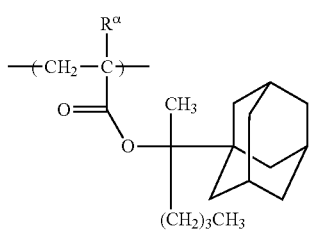
(a1-1-5)

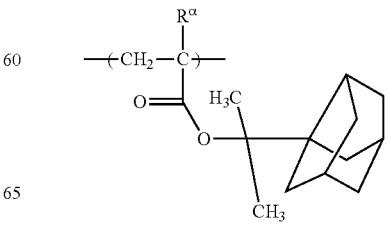
(a1-1-6)

-continued
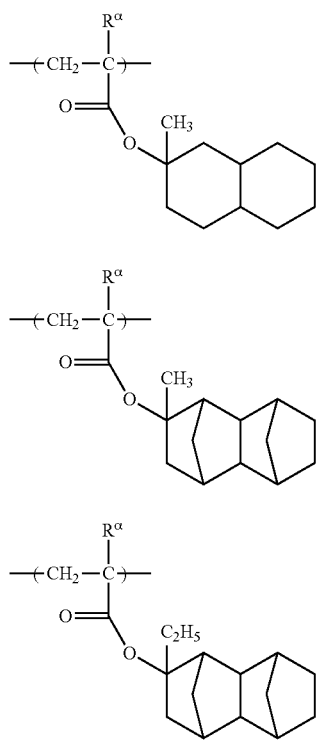
(a1-1-7)
(a1-1-8)
(a1-1-9)
[Chemical Formula 11]
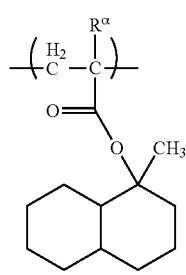
(a1-1-10)
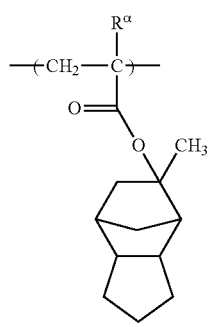
(a1-1-11)
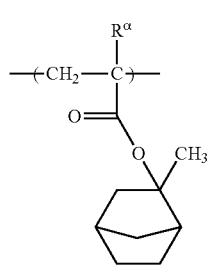
(a1-1-12)
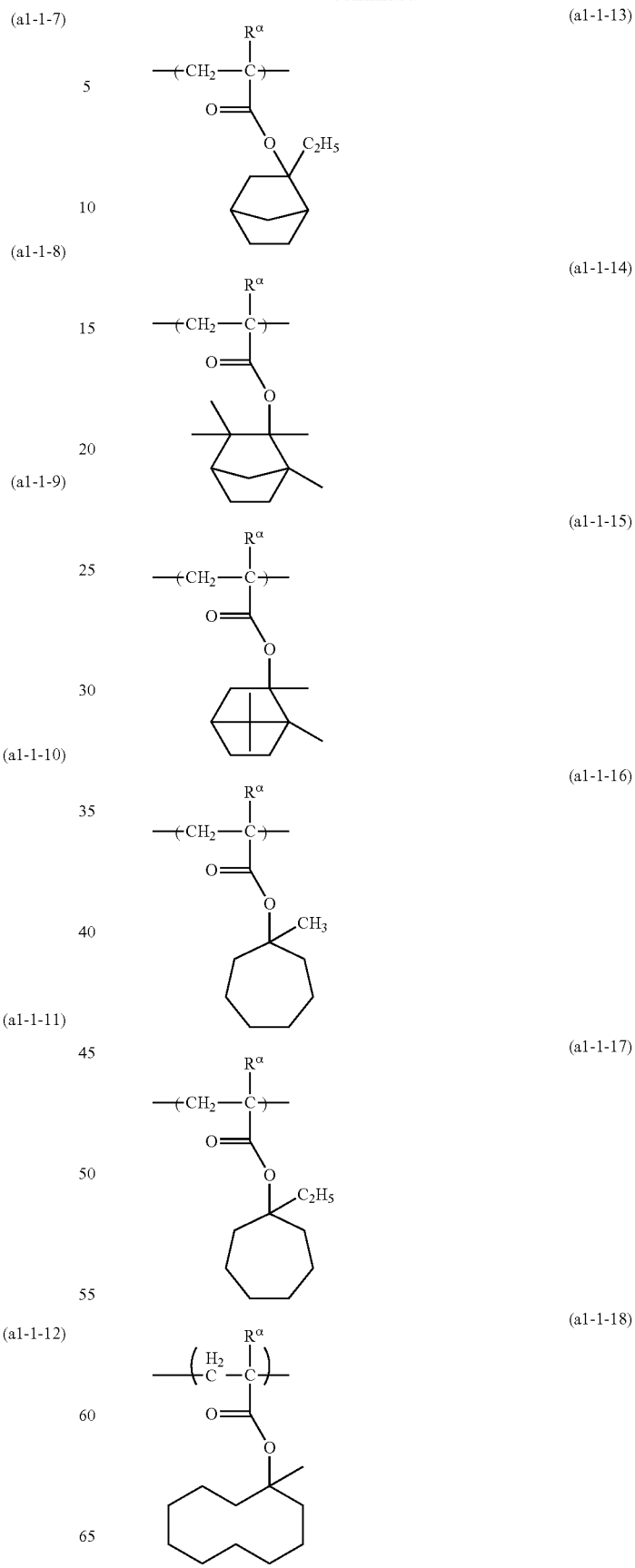

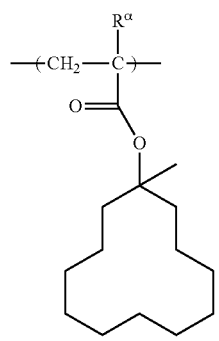
(a1-1-19)
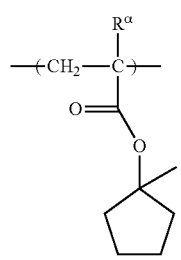
(a1-1-20)
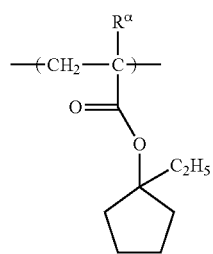
(a1-1-21)
[Chemical Formula 12]
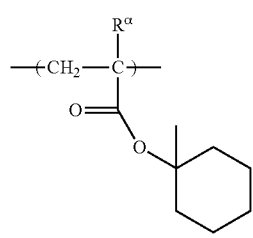
(a1-1-22)
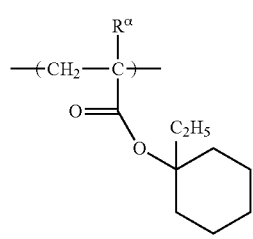
(a1-1-23)
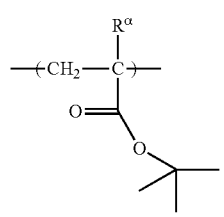
(a1-1-24)
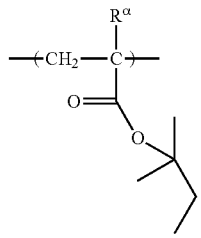
(a1-1-25)
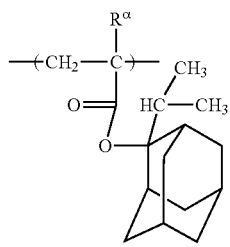
(a1-1-26)
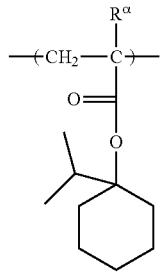
(a1-1-27)
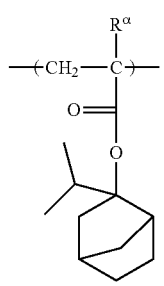
(a1-1-28)
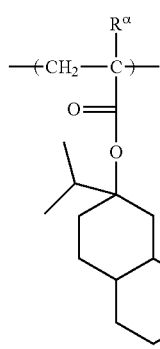
(a1-1-29)

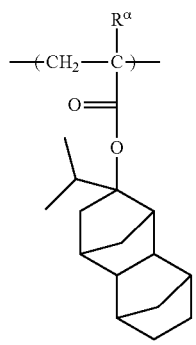
(a1-1-30)
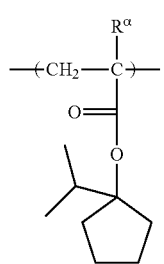
(a1-1-31)
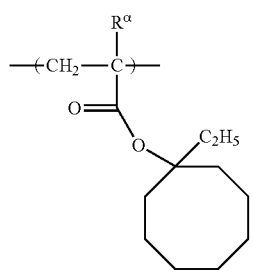
(a1-1-32)
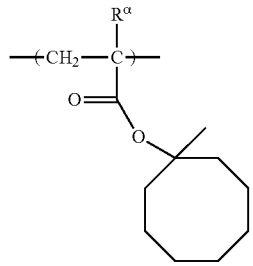
(a1-1-33)
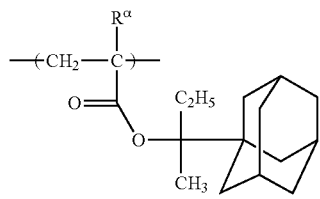
(a1-1-34)
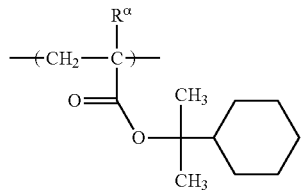
(a1-1-35)
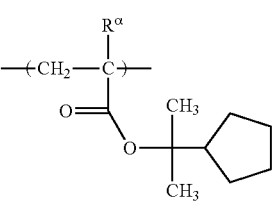
(a1-1-36)
[Chemical Formula 13]
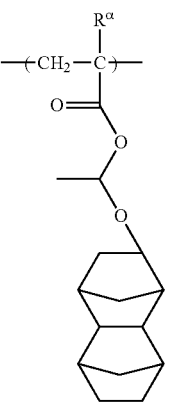
(a1-2-1)
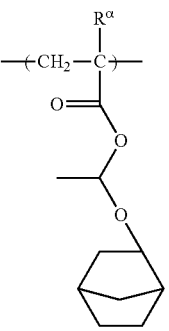
(a1-2-2)
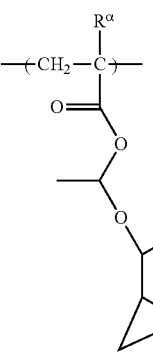
(a1-2-3)

(a1-2-4)
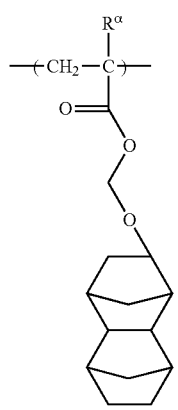
(a1-2-5)
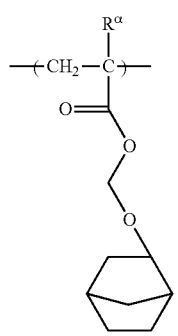
(a1-2-6)
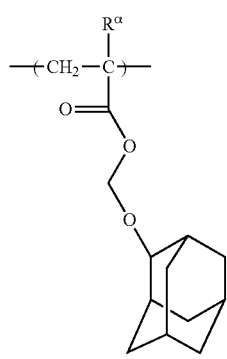
(a1-2-7)
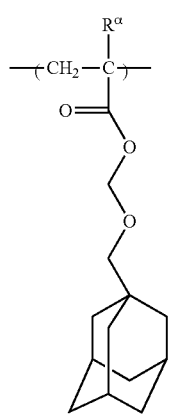
(a1-2-8)
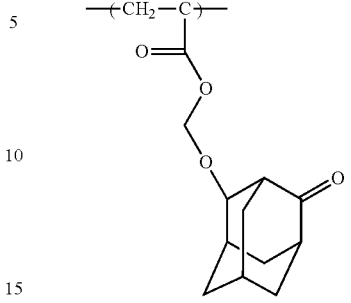
(a1-2-9)
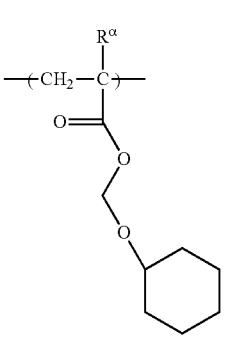
(a1-2-10)
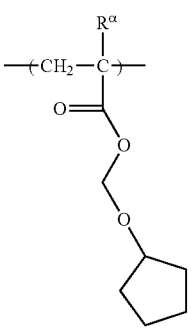
(a1-2-11)
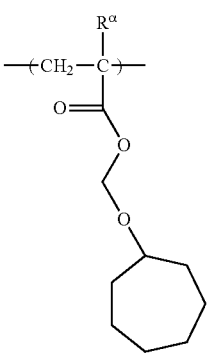

(a1-2-12) 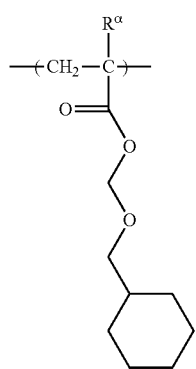
(a1-2-13) 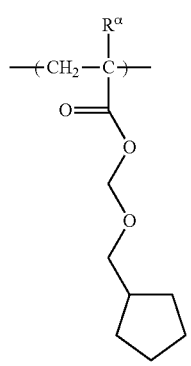
(a1-2-14) 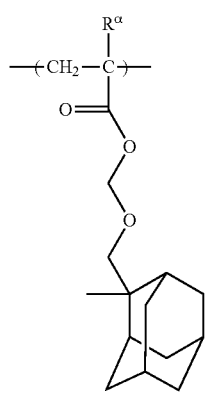
(a1-2-15) 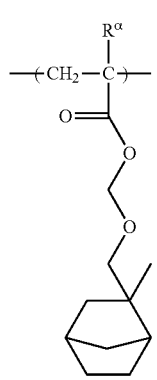
(a1-2-16) 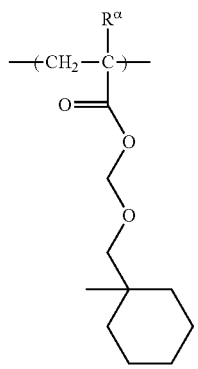
(a1-2-17) 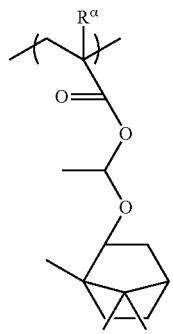
(a1-2-18) 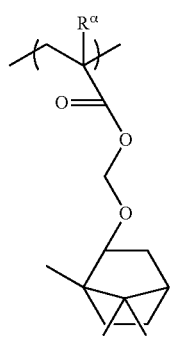
(a1-2-19) 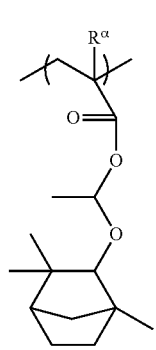

-continued
(a1-2-20)
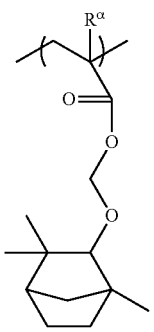
(a1-2-21)
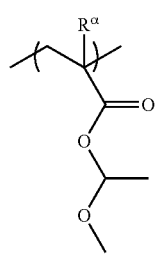
(a1-2-22)
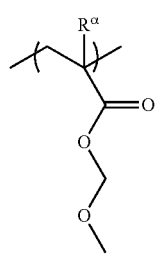
(a1-2-23)
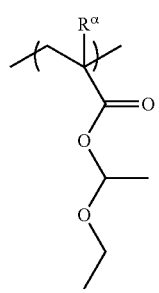
(a1-2-24)
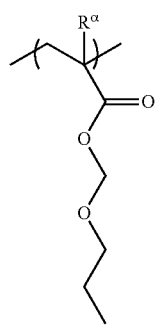
-continued
[Chemical Formula 14]
(a1-3-1)
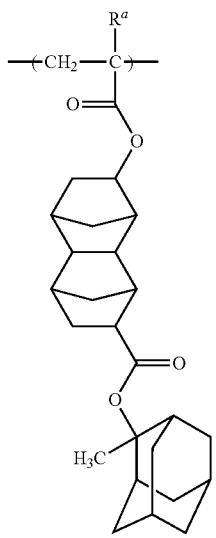
(a1-3-2)
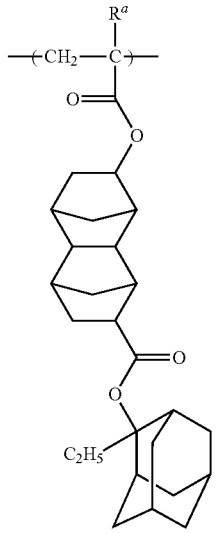
(a1-3-3)
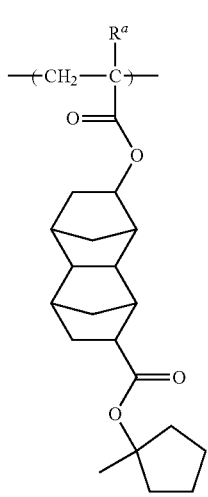

(a1-3-4)
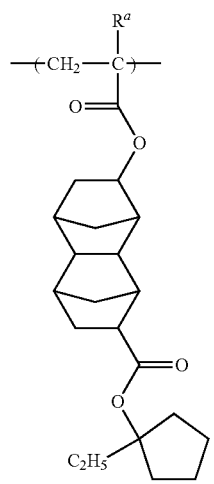
(a1-3-5)
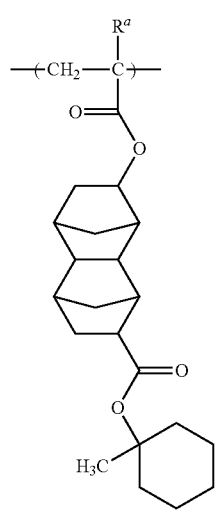
(a1-3-6)
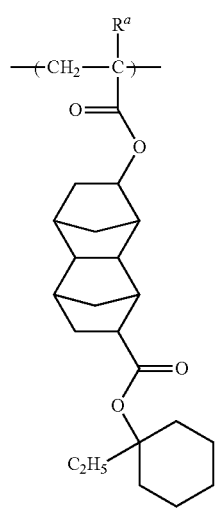
(a1-3-7)
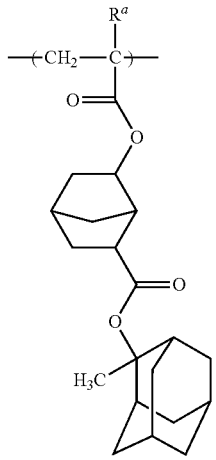
(a1-3-8)
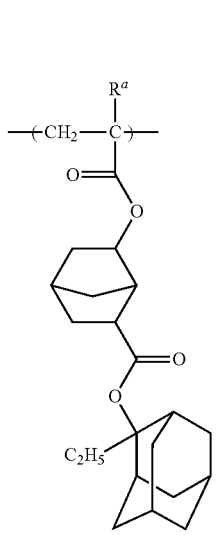
(a1-3-9)
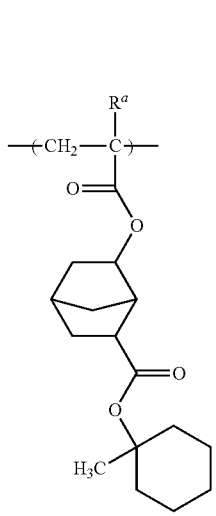

(a1-3-10)
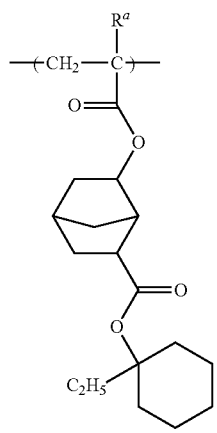
(a1-3-11)
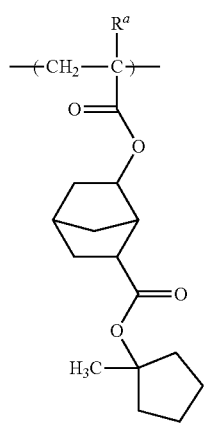
(a1-3-12)
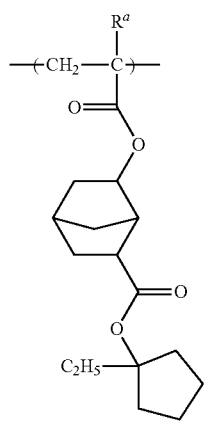
(a1-3-13)
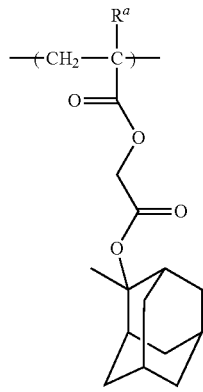
(a1-3-14)
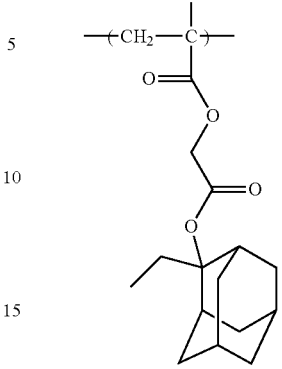
(a1-3-15)
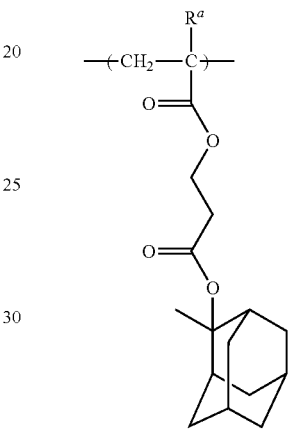
(a1-3-16)
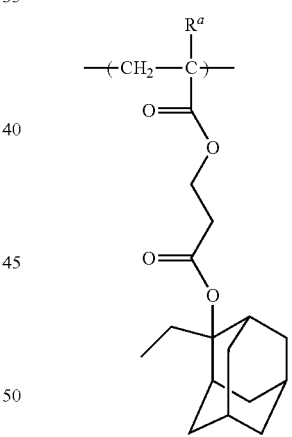
(a1-3-17)
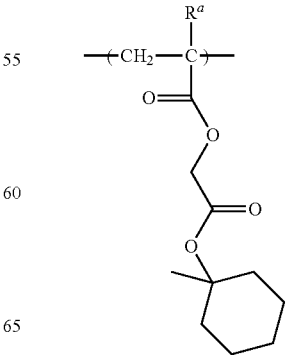

(a1-3-18) 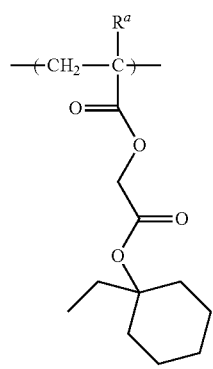
[Chemical Formula 15]
(a1-3-19) 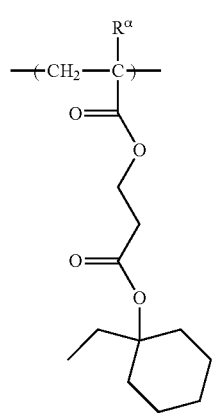
(a1-3-20)
(a1-3-21) 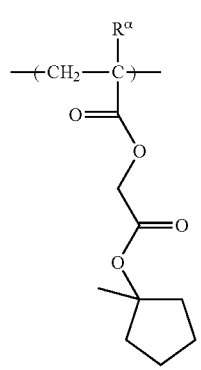
(a1-3-22) 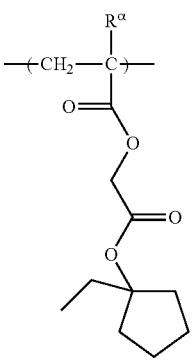
(a1-3-23) 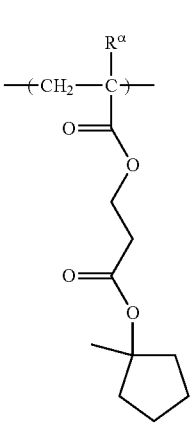
(a1-3-24) 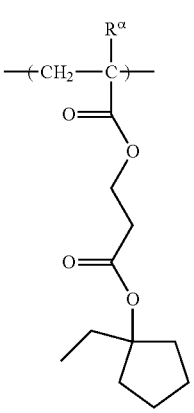

-continued
[Chemical Formula 16]
(a1-3-25)
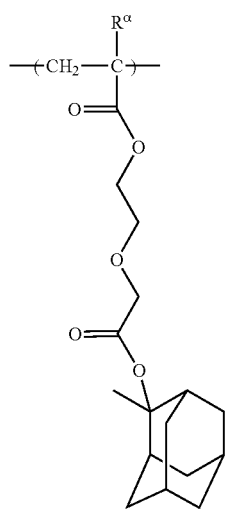
(a1-3-26)
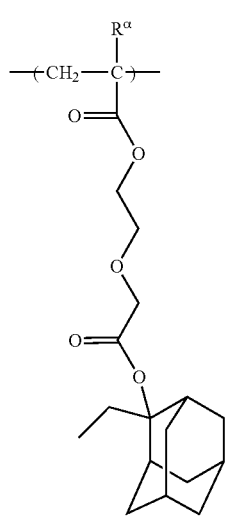
(a1-3-27)
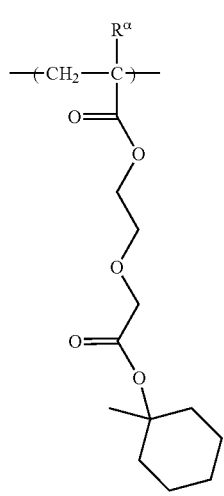
(a1-3-28)
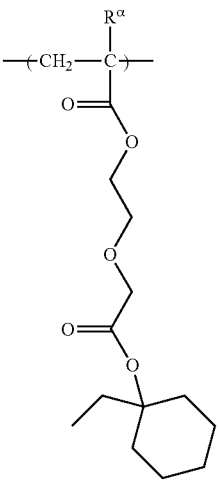
(a1-3-29)
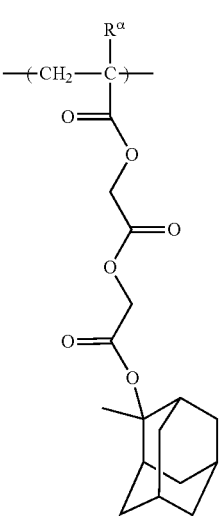
(a1-3-30)
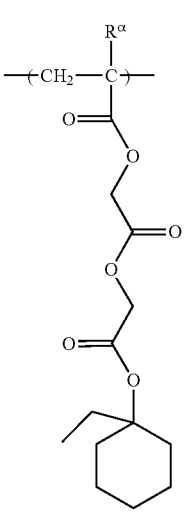

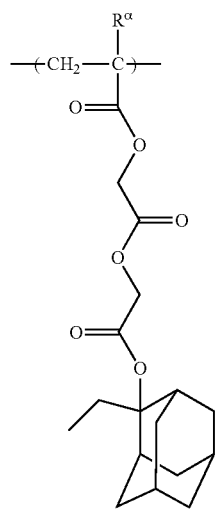
(a1-3-31)
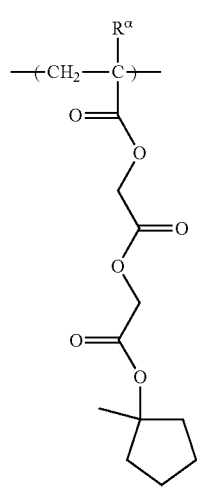
(a1-3-32)
[Chemical Formula 17]
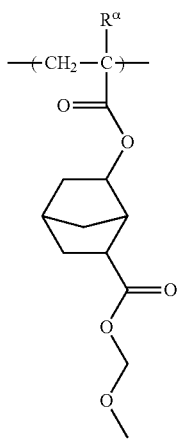
(a1-4-1)
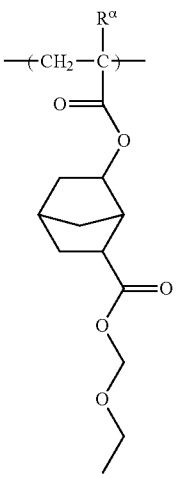
(a1-4-2)
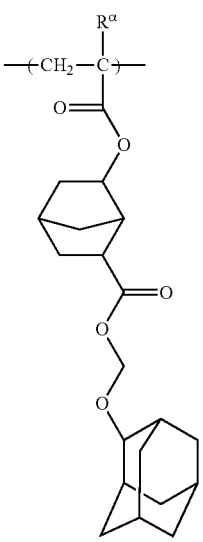
(a1-4-3)
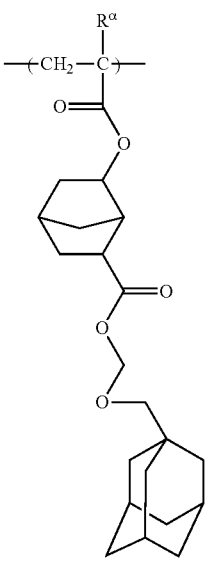
(a1-4-4)

(a1-4-5)
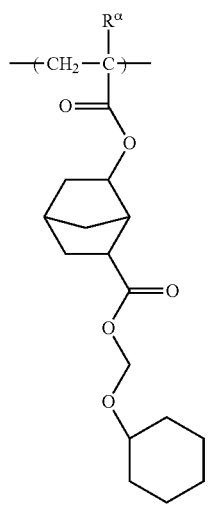
(a1-4-6)
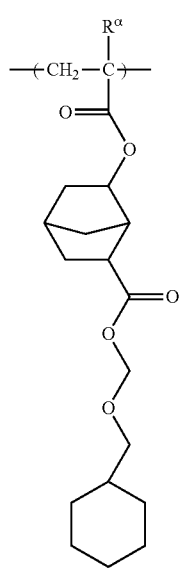
(a1-4-7)
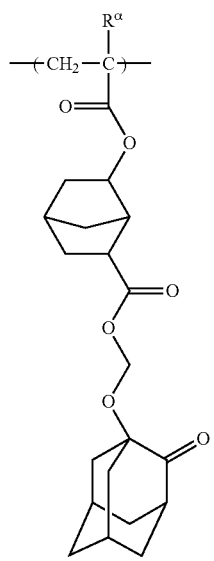
(a1-4-8)
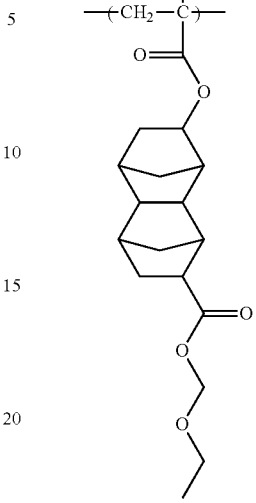
(a1-4-9)
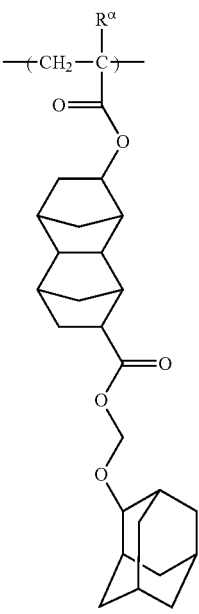

(a1-4-10)
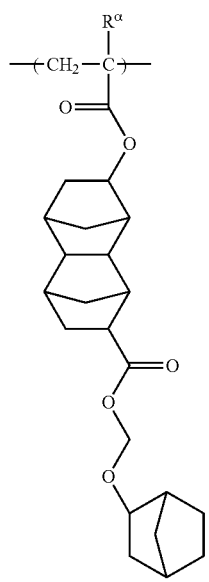
(a1-4-11)
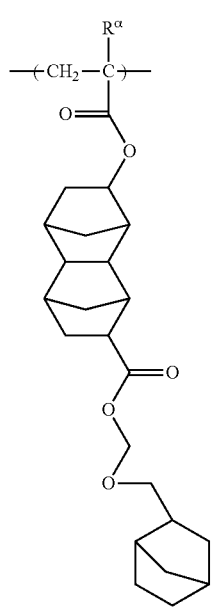
(a1-4-12)
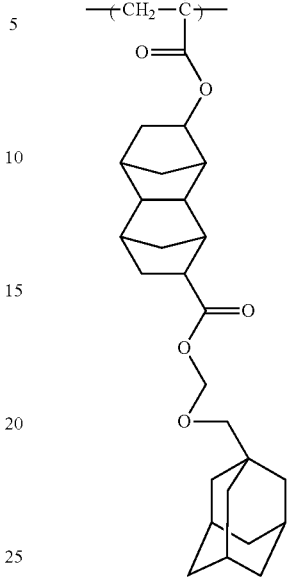
(a1-4-13)
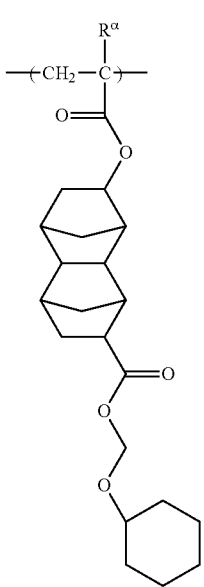

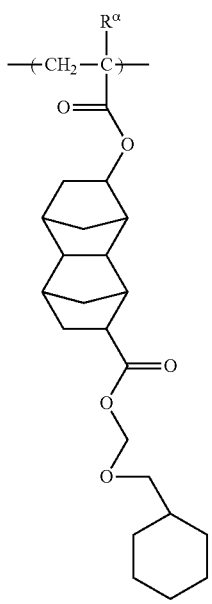

(a1-4-14)

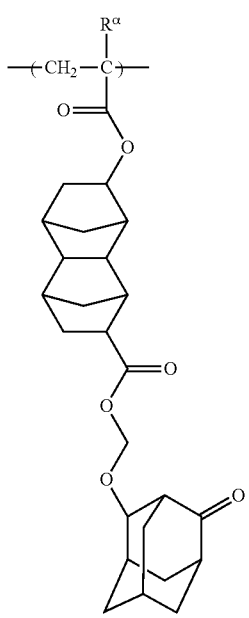

(a1-4-15)

[Chemical Formula 18]

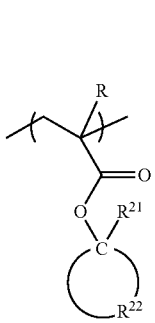

(a1-0-11)

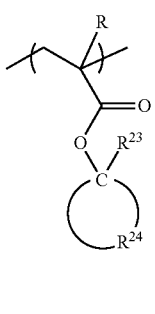

(a1-0-12)

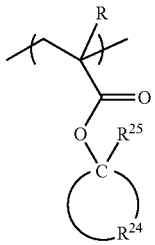

(a1-0-13)

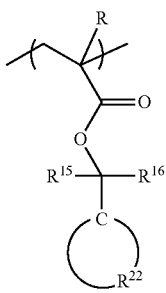

(a1-0-14)

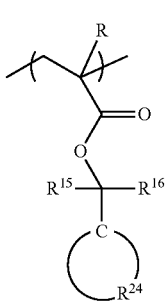

(a1-0-15)

In the present invention, as the structural unit (a1), it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below, a structural unit represented by general formula (a1-0-14) shown below, a structural unit represented by general formula (a1-0-15) shown below and a structural unit represented by general formula (a1-0-2) shown below.

Among these, it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below, a structural unit represented by general formula (a1-0-14) shown below and a structural unit represented by general formula (a1-0-15) shown below.

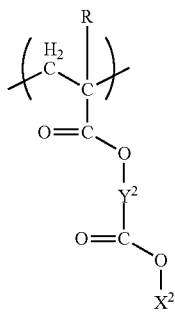

(a1-0-2)

[Chemical Formula 19]

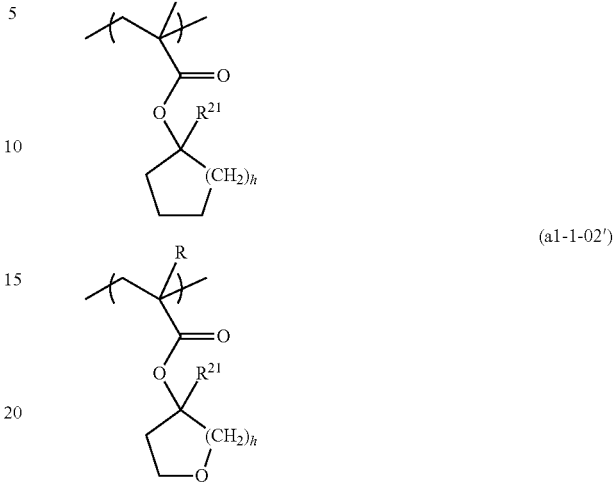

In the formulas, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom to which $R^{22}$ is bonded; $R^{23}$ represents a branched alkyl group; $R^{24}$ represents a group which forms an aliphatic polycyclic group with the carbon atom to which $R^{24}$ is bonded; $R^{25}$ represents a linear alkyl group of 1 to 5 carbon atoms; each of $R^{15}$ and $R^{16}$ independently represents an alkyl group; $Y^2$ represents a divalent linking group; and $X^2$ represents an acid dissociable group.

In the formulas, R, $Y^2$ and $X^2$ are the same as defined above.

In general formula (a1-0-11), as the alkyl group for $R^{21}$, the same alkyl groups as those described above for $R^{14}$ in formulas (1-1) to (1-9) can be used, and a methyl group, an ethyl group or an isopropyl group can be preferably used.

As the aliphatic monocyclic group formed by $R^{22}$ and the carbon atoms to which $R^{22}$ is bonded, the same aliphatic cyclic groups as those described above for the aforementioned tertiary alkyl ester-type acid dissociable group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and particularly preferably a 5- or 6-membered ring.

The monocycloalkane may or may not have part of the carbon atoms constituting the ring replaced with an ether bond (—O—).

Further, the monocycloalkane may have a substituent such as an alkyl group of 1 to 5 carbon atoms, a fluorine atom or a fluorinated alkyl group of 1 to 5 carbon atoms.

As an examples of $R^{22}$ constituting such an aliphatic monocyclic group, a linear alkylene group which may have an ether bond (—O—) interposed between the carbon atoms can be given.

Specific examples of structural units represented by general formula (a1-0-11) include structural units represented by the aforementioned formulas (a1-1-16) to (a1-1-23), (a1-1-27) and (a1-1-31). Among these, a structural unit represented by general formula (a1-1-02) shown below which includes the structural units represented by the aforementioned formulas (a1-1-16), (a1-1-17), (a1-1-20) to (a1-1-23), (a1-1-27), (a1-1-31), (a1-1-32) and (a1-1-33) is preferable. Further, a structural unit represented by general formula (a1-1-02') shown below is also preferable.

In the formulas, h represents an integer of 1 to 4, and is preferably 1 or 2.

In the formulas, R and $R^{21}$ are the same as defined above; and h represents an integer of 1 to 4.

In general formula (a1-0-12), as the branched alkyl group for $R^{23}$, the same alkyl groups as those described above for $R^{14}$ which are branched in the formulas (1-1) to (1-9) can be used, and an isopropyl group is particularly desirable.

As the aliphatic polycyclic group formed by $R^{24}$ and the carbon atoms to which $R^{24}$ is bonded, the same aliphatic cyclic groups as those described above for the aforementioned tertiary alkyl ester-type acid dissociable group and which are polycyclic can be used.

Specific examples of structural units represented by general formula (a1-0-12) include structural units represented by the aforementioned formulas (a1-1-26) and (a1-1-28) to (a1-1-30).

As the structural unit (a1-0-12), a structural unit in which the aliphatic polycyclic group formed from $R^{24}$ with the carbon atom bonded to $R^{24}$ is a 2-adamantyl group is preferable, and a structural unit represented by the aforementioned formula (a1-1-26) is particularly desirable.

In general formula (a1-0-13), R and $R^{24}$ are the same as defined above. As the linear alkyl group for $R^{25}$, the same linear alkyl groups as those described above for $R^{14}$ in the aforementioned formulas (1-1) to (1-9) can be mentioned, and a methyl group or an ethyl group is particularly desirable.

Specific examples of structural units represented by general formula (a1-0-13) include structural units represented by the aforementioned formulas (a1-1-1), (a1-1-2) and (a1-1-7) to (a1-1-15) which are described above as specific examples of the structural unit represented by general formula (a1-1).

As the structural unit (a1-0-13), a structural unit in which the aliphatic polycyclic group formed by $R^{24}$ and the carbon atom to which $R^{24}$ is bonded is a 2-adamantyl group is preferable, and a structural unit represented by the aforementioned formula (a1-1-1) or (a1-1-2) is particularly desirable.

In general formula (a1-0-14), R and $R^{22}$ are the same as defined above. $R^{15}$ and $R^{16}$ are the same as defined for $R^{15}$ and $R^{16}$ in the general formulas (2-1) to (2-6).

Specific examples of structural units represented by general formula (a1-0-14) include structural units represented by the aforementioned formulas (a1-1-35) and (a1-1-36) which are described above as specific examples of the structural unit represented by general formula (a1-1).

In general formula (a1-0-15), R and $R^{24}$ are the same as defined above. $R^{15}$ and $R^{16}$ are the same as defined for $R^{15}$ and $R^{16}$ in the general formulas (2-1) to (2-6).

Specific examples of structural units represented by general formula (a1-0-15) include structural units represented by the aforementioned formulas (a1-1-4) to (a1-1-6) and (a1-1-34) which are described above as specific examples of the structural unit represented by general formula (a1-1).

Examples of structural units represented by general formula (a1-0-2) include structural units represented by the aforementioned formulas (a1-3) and (a1-4), and a structural unit represented by the formula (a1-3) is preferable.

As a structural unit represented by general formula (a1-0-2), those in which $Y^2$ is a group represented by the aforementioned formula $-Y^{21}-O-Y^{22}-$ or $-Y^{21}-C(=O)-Y^{22}-$ is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 20]

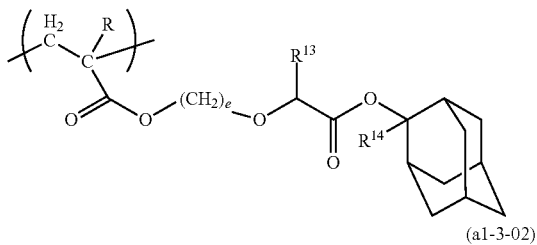

(a1-3-01)

(a1-3-02)

In the formulas, R is the same as defined above; $R^{13}$ represents a hydrogen atom or a methyl group; $R^{14}$ represents an alkyl group; e represents an integer of 1 to 10; and n' represents an integer of 0 to 3.

[Chemical Formula 21]

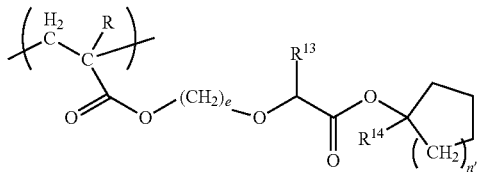

(a1-3-03)

In the formula, R is as defined above; each of $Y^{2'}$ and $Y^{2''}$ independently represents a divalent linking group; X' represents an acid dissociable group; and w represents an integer of 0 to 3.

In general formulas (a1-3-01) and (a1-3-02), $R^{13}$ is preferably a hydrogen atom.

$R^{14}$ is the same as defined for $R^{14}$ in the aforementioned formulas (1-1) to (1-9).

e is preferably an integer of 1 to 8, more preferably 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable group for X', the same groups as those described above can be used. X' is preferably a tertiary alkyl ester-type acid dissociable group, more preferably the aforementioned group (i) in which a substituent is bonded to the carbon atom to which an atom adjacent to the acid dissociable group is bonded on the ring skeleton to form a tertiary carbon atom. Among these, a group represented by the aforementioned general formula (1-1) is particularly desirable.

w represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable, and a structural unit represented by general formula (a1-3-03-1) is particularly desirable.

[Chemical Formula 22]

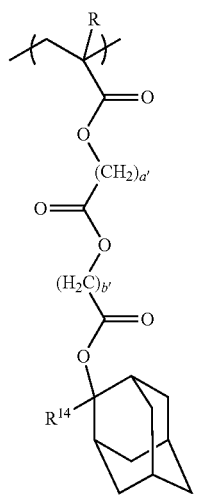

(a1-3-03-1)

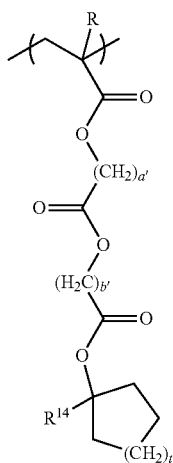

(a1-3-03-2)

In the formulas, R and $R^{14}$ are the same as defined above; a' represents an integer of 1 to 10; b' represents an integer of 1 to 10; and t represents an integer of 0 to 3.

In general formulas (a1-3-03-1) and (a1-3-03-2), a' is the same as defined above, and is preferably an integer of 1 to 8, more preferably 1 to 5, and particularly preferably 1 or 2.

b' is the same as defined above, and is preferably an integer of 1 to 8, particularly preferably 1 to 5, and most preferably 1 or 2.

t is preferably an integer of 1 to 3, and particularly preferably 1 or 2.

Specific examples of structural units represented by general formula (a1-3-03-1) or (a1-3-03-2) include structural units represented by the aforementioned formulas (a1-3-29) to (a1-3-32).

As the structural unit (a1) contained in the component (A1), 1 type of structural unit may be used, or 2 or more types may be used.

In the component (A1), the amount of the structural unit (a1) based on the combined total of all structural units constituting the component (A1) is preferably 15 to 70 mol %, more preferably 15 to 60 mol %, and still more preferably 20 to 55 mol %.

When the amount of the structural unit (a1) is at least as large as the lower limit of the above-mentioned range, a pattern can be easily formed using a resist composition containing the component (A1), and various lithography properties such as sensitivity, resolution, LWR and the like are improved. On the other hand, when the amount of the structural unit (a1) is no more than the upper limit of the above-mentioned range, a good balance can be achieved with the other structural units.

[Structural Unit (a0)]

The structural unit (a0) is a structural unit containing —$SO_2$—containing cyclic group.

By virtue of the structural unit (a0) containing a —$SO_2$— containing cyclic group, a resist composition containing the component (A1) including the structural unit (a0) is capable of improving the adhesion of a resist film to a substrate. Further, the structural unit (a0) contributes to improvement in various lithography properties such as sensitivity, resolution, exposure latitude (EL margin), line width roughness (LWR), line edge roughness (LER) and mask reproducibility.

Here, an "—$SO_2$— containing cyclic group" refers to a cyclic group having a ring containing —$SO_2$— within the ring skeleton thereof, i.e., a cyclic group in which the sulfur atom (S) within —$SO_2$— forms part of the ring skeleton of the cyclic group.

In the —$SO_2$— containing cyclic group, the ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings.

The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable. The —$SO_2$— containing cyclic group preferably has 3 to 30 carbon atoms, more preferably 4 to 20, still more preferably 4 to 15, and particularly preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group (wherein R" represents a hydrogen atom or an alkyl group).

The alkyl group for the substituent is preferably an alkyl group of 1 to 6 carbon atoms. Further, the alkyl group is preferably a linear alkyl group or a branched alkyl group. Specific examples include a methyl group, ethyl group, propyl group, isopropyl group, n-butyl group, isobutyl group, tert-butyl group, pentyl group, isopentyl group, neopentyl group and hexyl group. Among these examples, a methyl group or an ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkoxy group. Specific examples of the alkoxy groups include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group, it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —SO₂— containing cyclic group include groups represented by general formulas (3-1) to (3-4) shown below.

[Chemical Formula 23]

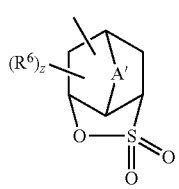

(3-1)

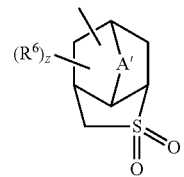

(3-2)

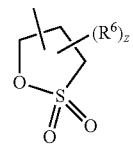

(3-3)

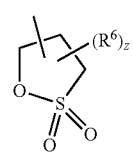

(3-4)

In the formulas, A' represents an oxygen atom, a sulfur atom or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms for A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkylene group. Specific examples of such alkylene groups include —O—CH₂—, —CH₂—O—CH₂—, —S—CH₂— and —CH₂—S—CH₂—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

If there are two or more of the $R^6$ group, as indicated by the value z, then the two or more of the $R^6$ group may be the same or different from each other.

As the alkyl group, alkoxy group, halogenated alkyl group, —COOR", —OC(=O)R" and hydroxyalkyl group for $R^6$, the same alkyl groups, alkoxy groups, halogenated alkyl groups, —COOR", —OC(=O)R" and hydroxyalkyl groups as those described above as the substituent for the —SO₂— containing cyclic group can be mentioned.

Specific examples of the cyclic groups represented by general formulas (3-1) to (3-4) are shown below. In the formulas shown below, "Ac" represents an acetyl group.

[Chemical Formula 24]
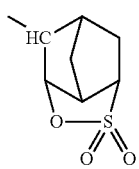 (3-1-1)
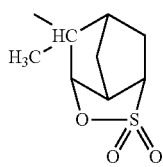 (3-1-2)
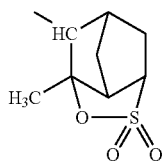 (3-1-3)
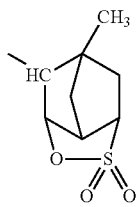 (3-1-4)
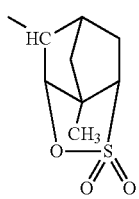 (3-1-5)
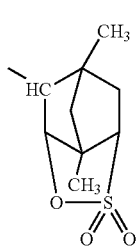 (3-1-6)
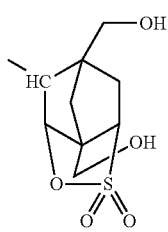 (3-1-7)
-continued
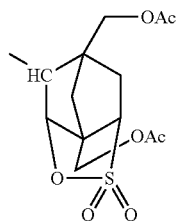 (3-1-8)
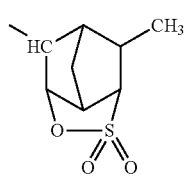 (3-1-9)
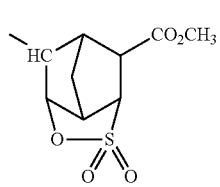 (3-1-10)
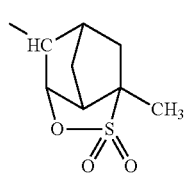 (3-1-11)
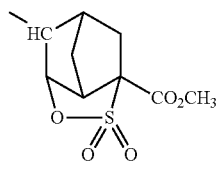 (3-1-12)
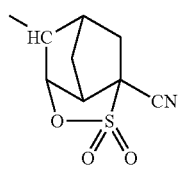 (3-1-13)
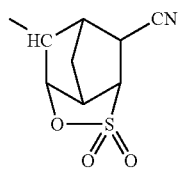 (3-1-14)
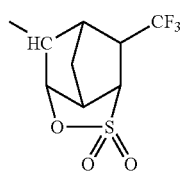 (3-1-15)
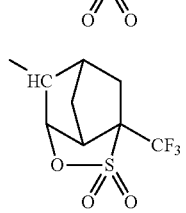 (3-1-16)

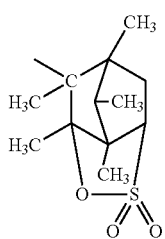
(3-1-17)
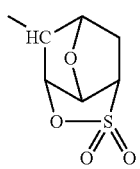
(3-1-18)
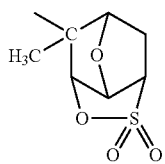
(3-1-19)
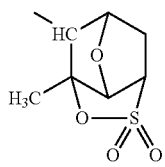
(3-1-20)
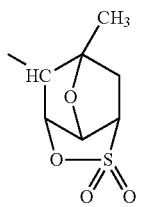
(3-1-21)
[Chemical Formula 25]
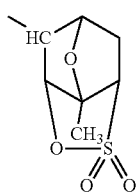
(3-1-22)
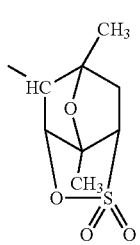
(3-1-23)
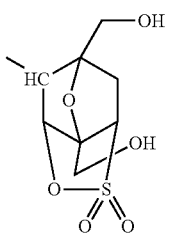
(3-1-24)
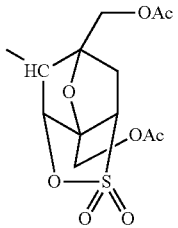
(3-1-25)
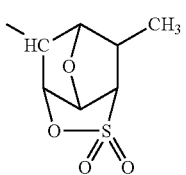
(3-1-26)
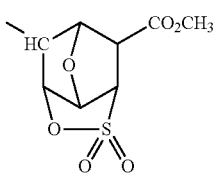
(3-1-27)
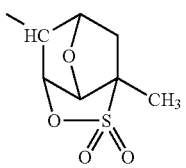
(3-1-28)
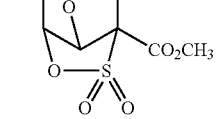
(3-1-29)
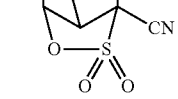
(3-1-30)
(3-1-31)

(3-1-32)

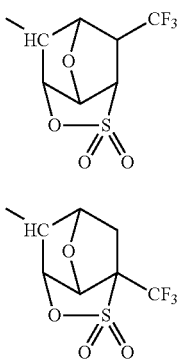

(3-1-33)

[Chemical Formula 26]

(3-2-1)

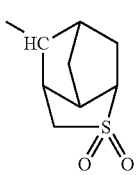

(3-2-2)

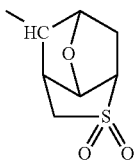

(3-3-1)

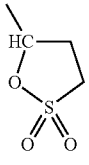

(3-4-1)

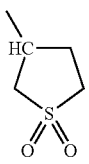

As the —SO$_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

As the structural unit (a0), there is no particular limitation as long as it has a —SO$_2$-containing cyclic group, and an arbitrary structural unit may be used.

The structural unit (a0) is preferably a structural unit derived from an acrylate ester which may have the hydrogen atom bonded to the carbon atom on the α-position substituted with a substituent and contains an —SO$_2$— containing cyclic group.

More specifically, examples of the structural unit (a0) include structural units represented by general formula (a0-0) shown below.

[Chemical Formula 27]

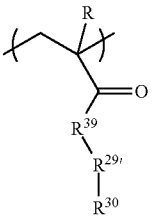

(a0-0)

In the formula, R represents a hydrogen atom, an alkyl group of 1 to 5 carbon atoms or a halogenated alkyl group of 1 to 5 carbon atoms; $R^{39}$ represents —O— or —NH—; $R^{30}$ represents a —SO$_2$— containing cyclic group; and $R^{29'}$ represents a single bond or a divalent linking group.

In general formula (a0-0), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for R is a group in which part or all of the hydrogen atoms of the aforementioned alkyl group of 1 to 5 carbon atoms has been substituted with halogen atoms. Examples of the halogen atom include a fluorine atom, a chlorine atom, a bromine atom and an iodine atom, and a fluorine atom is particularly preferred.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a0-0), $R^{39}$ represents —O— or —NH—.

In formula (a0-0), $R^{30}$ is the same those as defined for the aforementioned —SO$_2$-containing group.

In the formula (a0-0), $R^{29'}$ may be a single bond or a divalent linking group. In terms of the effects of the present invention and excellent lithography properties, a divalent linking group is preferable.

Examples of the divalent linking group for $R^{29'}$ include the same divalent linking groups as those described for $Y^2$ in general formula (a1-0-2) explained above in relation to the structural unit (a1) can be mentioned.

As the divalent linkage group for $R^{29'}$, an alkylene group, a divalent aliphatic hydrocarbon group or a divalent linkage group containing a hetero atom is preferable. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group for $Y^2$.

As the divalent linking group containing an ester bond, a group represented by general formula: —$R^{20}$—C(=O)—O— (in the formula, $R^{20}$ represents a divalent linking group) is particularly desirable. Namely, the structural unit (a0) is preferably a structural unit represented by general formula (a0-0-1) shown below.

[Chemical Formula 28]

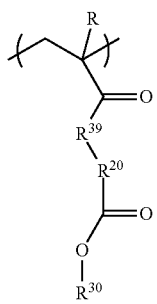

(a0-0-1)

In the formula, R represents a hydrogen atom, an alkyl group of 1 to 5 carbon atoms or a halogenated alkyl group of 1 to 5 carbon atoms; $R^{39}$ represents —O— or —NH—; $R^{20}$ represents a divalent linking group; and $R^{30}$ represents an —$SO_2$— containing cyclic group.

$R^{20}$ is not particularly limited. For example, the same divalent linking groups as those described for $R^{29'}$ in general formula (a0-0) can be mentioned.

As the divalent linking group for $R^{20}$, a linear or branched alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $R^{29'}$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —$CH(CH_3)$—, —$C(CH_3)_2$— or —$C(CH_3)_2CH_2$— is particularly desirable.

As the divalent linking group containing an oxygen atom, a divalent linking group containing an ether bond or an ester bond is preferable, and a group represented by the aforementioned formulas —$Y^{21}$—O—$Y^{22}$—, [$Y^{21}$—C(=O)—O]$_{m'}$—$Y^{22}$— or a group represented by the aforementioned formulas —$Y^{21}$—O—C(=O)—$Y^{22}$— is more preferable. $Y^{21}$, $Y^{22}$ and m' are the same as defined above.

Among these, a group represented by the formula —$Y^{21}$—O—C(=O)—$Y^{22}$— is preferable, a group represented by the formula —$(CH_2)_c$—O—C(=O)—$(CH_2)_d$— is particularly desirable. c represents an integer of 1 to 5, and is preferably an integer of 1 to 3, and more preferably an integer of 1 or 2. d represents an integer of 1 to 5, and is preferably an integer of 1 to 3, and more preferably an integer of 1 or 2.

In particular, as the structural unit (a0), a structural unit represented by general formula (a0-0-11) or (a0-0-12) shown below is preferable, and a structural unit represented by general formula (a0-0-12) is more preferable.

[Chemical Formula 29]

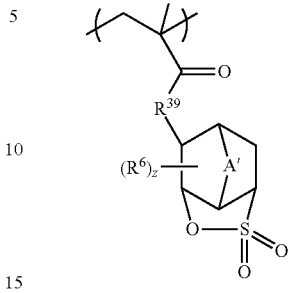

(a0-0-11)

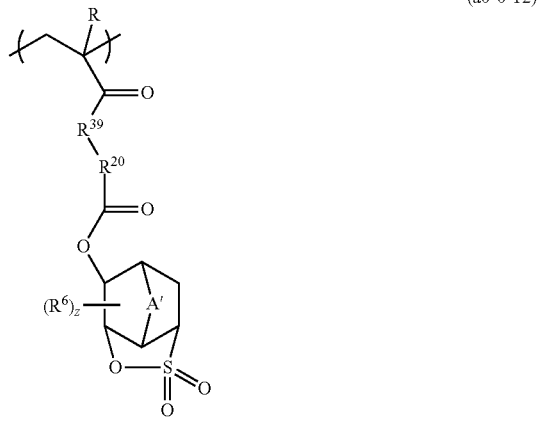

(a0-0-12)

In the formulas, R, A', $R^6$, z, $R^{39}$ and $R^{20}$ are the same as defined above.

In general formula (a0-0-11), A' is preferably a methylene group, an ethylene group, an oxygen atom (—O—) or a sulfur atom (—S—).

In the formula (a0-0-12), as $R^{20}$, a linear or branched alkylene group or a divalent linking group containing an oxygen atom is preferable. As the linear or branched alkylene group and the divalent linking group containing an oxygen atom for $R^{20}$, the same linear or branched alkylene groups and the divalent linking groups containing an oxygen atom as those described above can be mentioned.

As the structural unit represented by general formula (a0-0-12), a structural unit represented by general formula (a0-0-12a) or (a0-0-12b) shown below is particularly desirable.

[Chemical Formula 30]

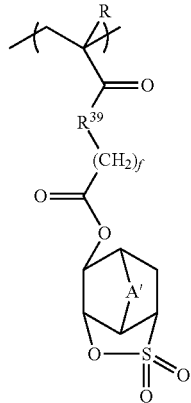

(a0-0-12a)

-continued (a0-0-12b)

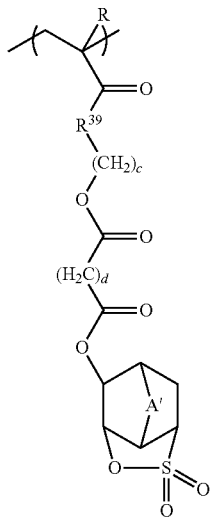

In the formulas, R, $R^{39}$ and A' are the same as defined above; each of c and d is the same those as defined above; and f represents an integer of 1 to 5 (preferably an integer of 1 to 3).

As the structural unit (a0) contained in the component (A1), 1 type of structural unit may be used, or 2 or more types may be used.

In terms of achieving an excellent shape for a resist pattern formed using a positive resist composition containing the component (A1) and excellent lithography properties such as EL margin, LWR and mask reproducibility, the amount of the structural unit (a0) within the component (A1), based on the combined total of all structural units constituting the component (A1) is preferably 1 to 60 mol %, more preferably 5 to 55 mol %, still more preferably 10 to 50 mol %, and most preferably 15 to 45 mol %.

[Structural Unit (a2)]

The structural unit (a2) is a structural unit containing a lactone-containing cyclic group.

The term "lactone-containing cyclic group" refers to a cyclic group including one ring containing a —O—C(=O)— structure (lactone ring). The term "lactone ring" refers to a single ring containing a —O—C(=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water (in particular, in the case of an alkali developing process).

As the lactone-containing cyclic group, there is no particular limitation, and an arbitrary group may be used.

Specific examples of lactone-containing monocyclic groups include a group in which one hydrogen atom has been removed from a 4- to 6-membered lactone ring, such as a group in which one hydrogen atom has been removed from β-propionolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

As the structural unit (a2), there is no particular limitation as long as it has a lactone-containing cyclic group, and an arbitrary structural unit may be used.

The structural unit (a2) is preferably a structural unit (a2') derived from an acrylate ester which may have the hydrogen atom bonded to the carbon atom on the α-position substituted with a substituent and contains a lactone-containing cyclic group. More specifically, examples of the structural unit (a2') include structural units represented by general formulas (a2-1) to (a2-5) shown below.

[Chemical Formula 31]

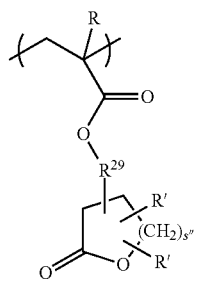

(a2-1)

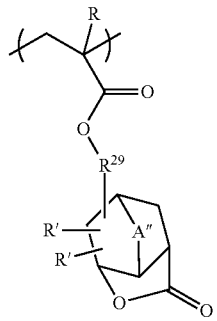

(a2-2)

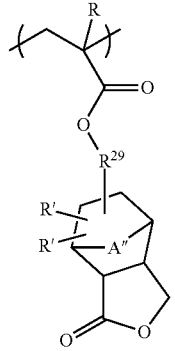

(a2-3)

-continued (a2-4)

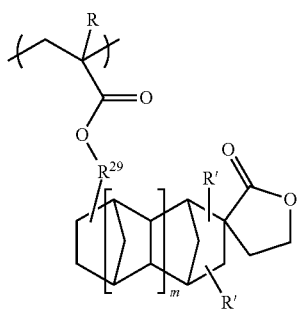

(a2-5)

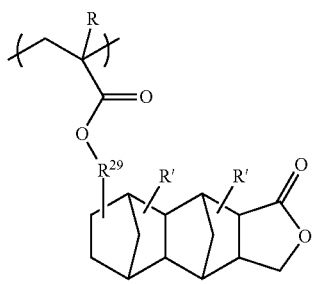

In the formulas, R represents a hydrogen atom, an alkyl group of 1 to 5 carbon atoms or a halogenated alkyl group of 1 to 5 carbon atoms; each R' independently represents a hydrogen atom, an alkyl group, an alkoxy group, a halogen atom, a halogenated alkyl group, a hydroxy group, an oxygen atom (=O), —COOR", —OC(=O)R", a hydroxyalkyl group, or a cyano group, wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as R in the structural unit (a1).

As the alkyl group, alkoxy group, halogen atom, halogenated alkyl group, —COOR", —OC(=O)R" and hydroxyalkyl group for R', the same alkyl groups, alkoxy groups, halogen atoms, halogenated alkyl groups, —COOR", —OC(=O)R" and hydroxyalkyl groups as those described above as the substituent for the —SO$_2$-containing cyclic group can be mentioned.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group for $Y^2$.

s" is preferably 1 or 2.

Specific examples of structural units represented by general formulas (a2-1) to (a2-5) are shown below.

In the formulas shown below, $R^\alpha$ represents a hydrogen atom, a methyl group or a trifluoromethyl group.

[Chemical Formula 32]

(a2-1-1)

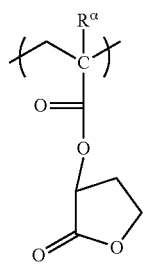

(a2-1-2)

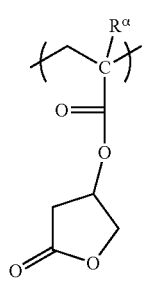

(a2-1-3)

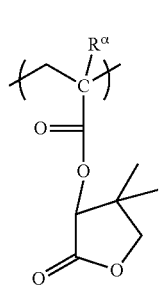

(a2-1-4)

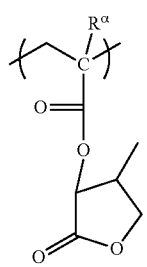

(a2-1-5)

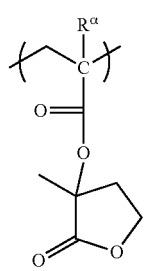

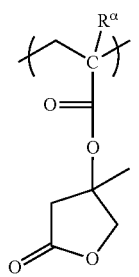
(a2-1-6)
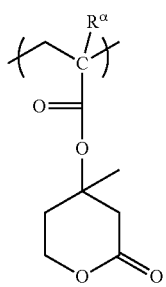
(a2-1-7)
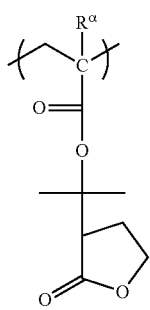
(a2-1-8)
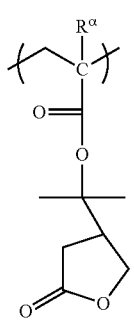
(a2-1-9)
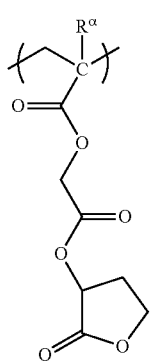
(a2-1-10)
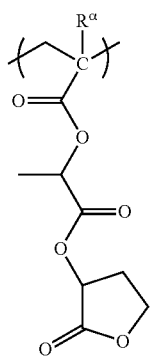
(a2-1-11)
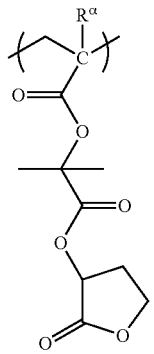
(a2-1-12)
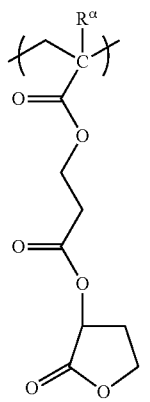
(a2-1-13)
[Chemical Formula 33]
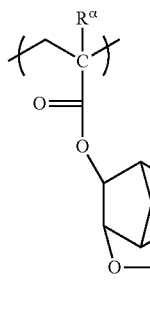
(a2-2-1)

-continued (a2-2-2) (a2-2-3) (a2-2-4) (a2-2-5) (a2-2-6) (a2-2-7) (a2-2-8) (a2-2-9) (a2-2-10) (a2-2-11)

(a2-2-12)
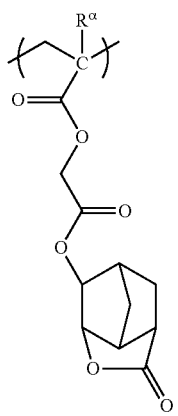
(a2-2-13)
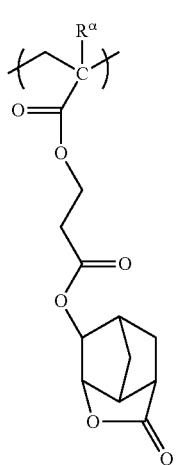
(a2-2-14)
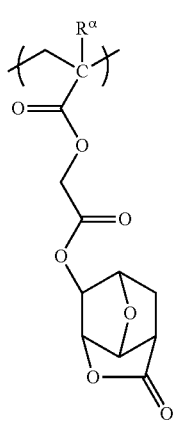
(a2-2-15)
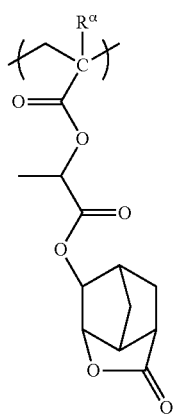
(a2-2-16)
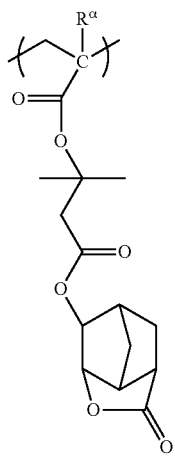
(a2-2-17)
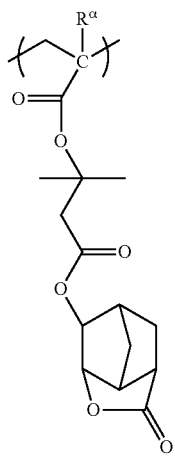
[Chemical Formula 34]
(a2-3-1)
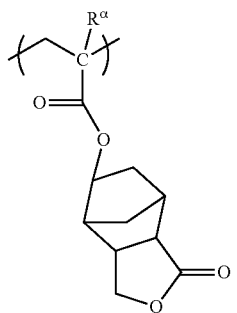

(a2-3-2)
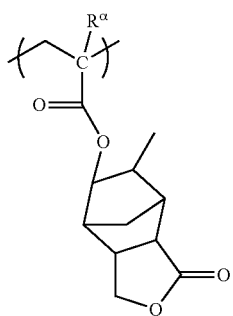
(a2-3-3)
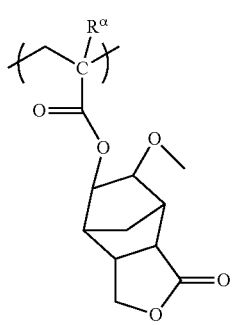
(a2-3-4)
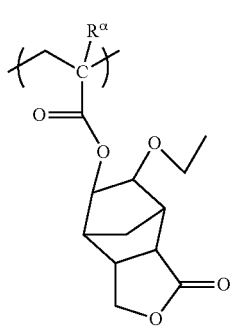
(a2-3-5)
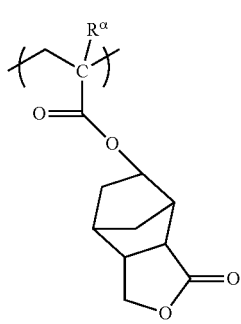
[Chemical Formula 35]
(a2-4-1)
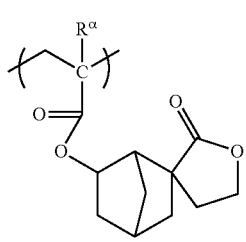
(a2-4-2)
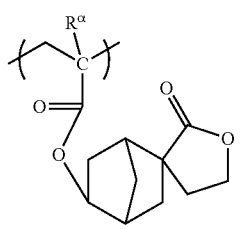
(a2-4-3)
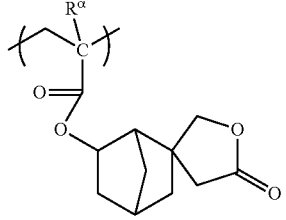
(a2-4-4)
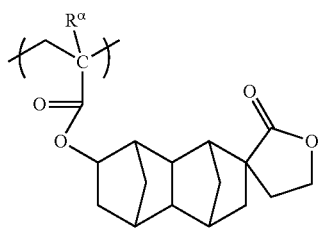
(a2-4-5)
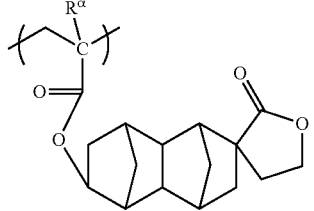
(a2-4-6)
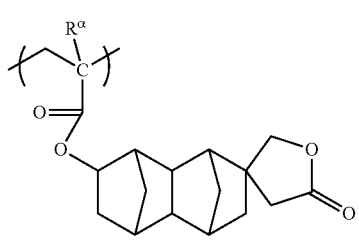
(a2-4-7)
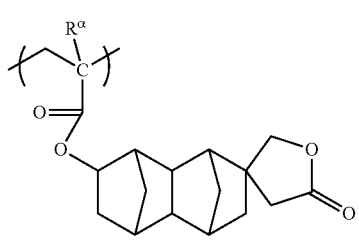
(a2-4-8)
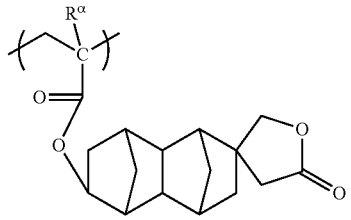

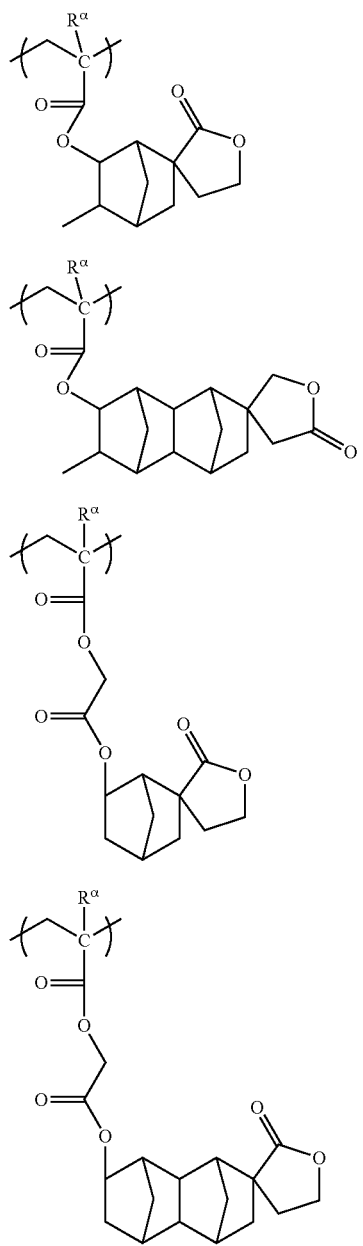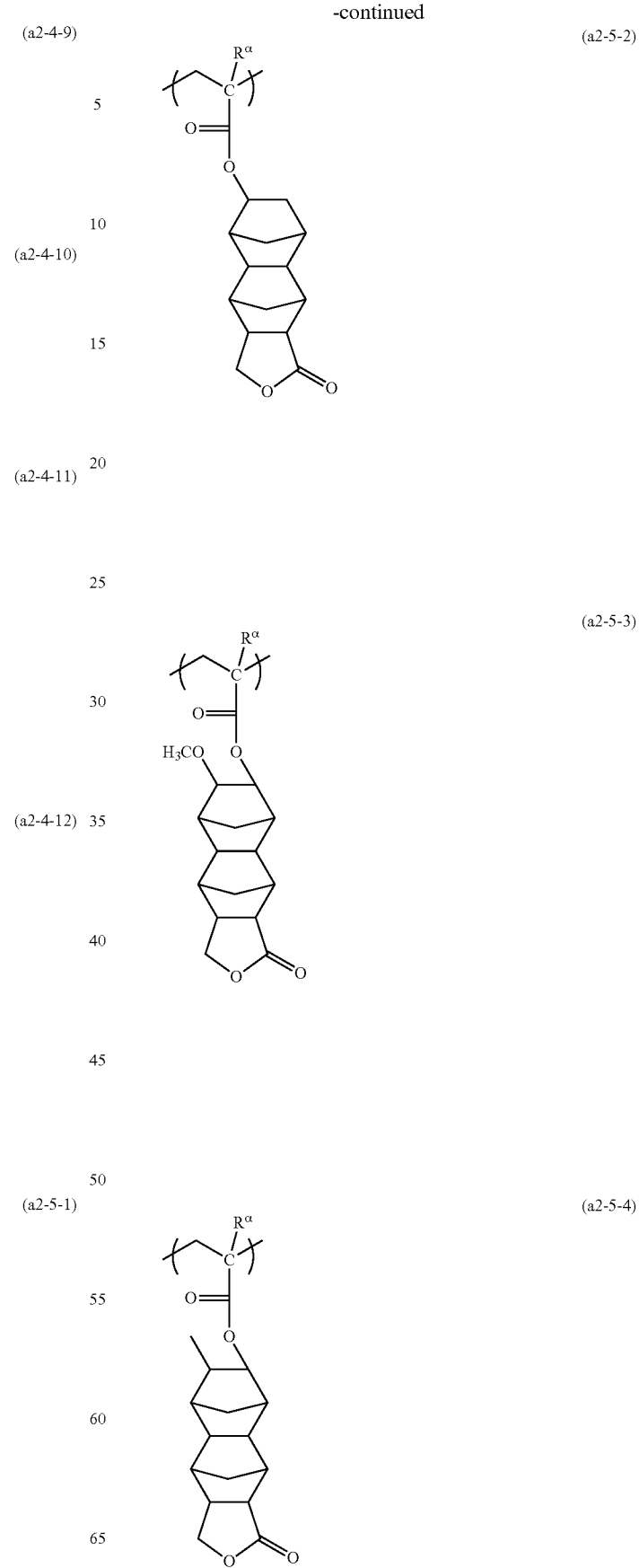

-continued

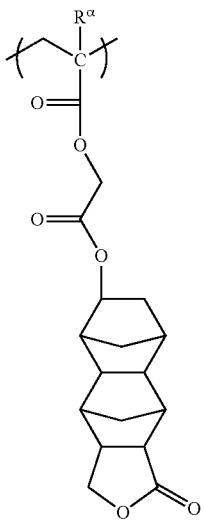
(a2-5-5)

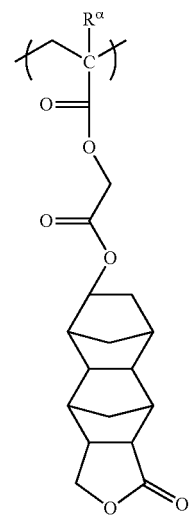
(a2-5-6)

As the structural unit (a2) contained in the component (A1), 1 type of structural unit may be used, or 2 or more types may be used.

As the structural unit (a2), at least one structural unit selected from the group consisting of structural units represented by formulas (a2-1) to (a2-5) is preferable, and at least one structural unit selected from the group consisting of structural units represented by formulas (a2-1) to (a2-3) is more preferable. Of these, it is preferable to use at least one structural unit selected from the group consisting of structural units represented by formulas (a2-1-1), (a2-1-2), (a2-2-1), (a2-2-7), (a2-3-1) and (a2-3-5).

In the component (A1), the amount of the structural unit (a2) based on the combined total of all structural units constituting the component (A1) is preferably 5 to 60 mol %, more preferably 10 to 50 mol %, and still more preferably 10 to 45 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

[Structural Unit (a3)]

The structural unit (a3) is a structural unit containing a polar group-containing aliphatic hydrocarbon group (provided that, the aforementioned structural units (a1), (a0) and (a2) are excluded from the structural unit (a3)).

When the component (A1) includes the structural unit (a3), the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferable in terms of industrial.

As the structural unit (a3), there is no particular limitation as long as it has a polar group-containing aliphatic hydrocarbon group, and an arbitrary structural unit may be used.

The structural unit (a3) is preferably a structural unit (a3') derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 37]

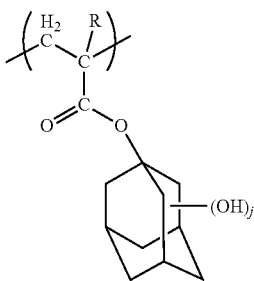

(a3-1)

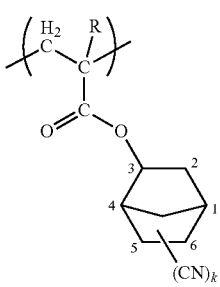

(a3-2)

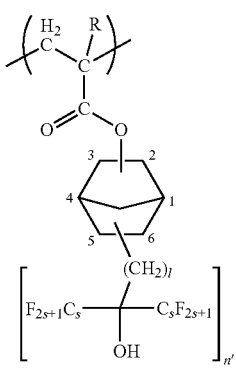

(a3-3)

In the formulas, R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

[Other Structural Unit]

The component (A1) may also have a structural unit other than the above-mentioned structural units (a1), (a0), (a2) and (a3), as long as the effects of the present invention are not impaired.

As such a structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used.

Examples of the other structural unit include a structural unit (a4) derived from an acrylate ester which may have the hydrogen atom bonded to the carbon atom on the α-position substituted with a substituent and contains a non-acid-dissociable aliphatic polycyclic group, a structural unit (a5) derived from a hydroxystyrene which may have the hydrogen atom bonded to the carbon atom on the α-position substituted with a substituent, and a structural unit (a6) derived from a styrene which may have the hydrogen atom bonded to the carbon atom on the α-position substituted with a substituent, (Structural Unit (a4))

The structural unit (a4) is a structural unit derived from an acylate ester which may have the hydrogen atom bonded to the carbon atom on the α-position substituted with a substituent and contains an acid non-dissociable aliphatic polycyclic group.

In the structural unit (a4), examples of this polycyclic group include the same polycyclic groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 38]

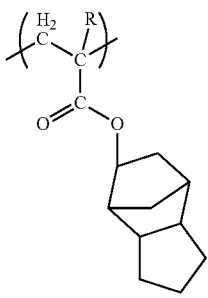
(a4-1)

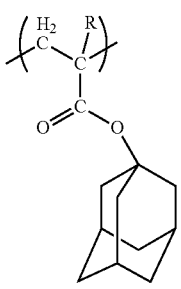
(a4-2)

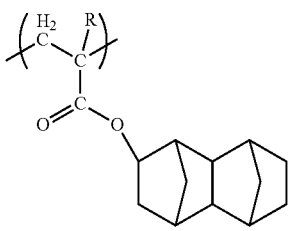
(a4-3)

(a4-4)

(a4-5)

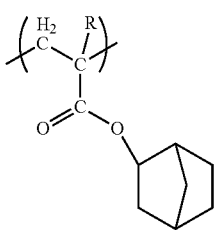

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a5))

The structural unit (a5) is a structural unit derived from a hydroxystyrene which may have the hydrogen atom bonded to the carbon atom on the α-position substituted with a substituent.

A "structural unit derived from a hydroxystyrene" refers to a structural unit that is formed by the cleavage of the ethylenic double bond of a hydroxystyrene.

As the substituent with which a hydrogen atom on the α-position of a hydroxystylene may be substituted, the same substituents as those to be bonded to the carbon atom on the α-position of the hydroxystyrene in the explanation of "the structural unit derived from a hydroxystyrene or hydroxystyrene derivatives" in relation to the structural unit (a1) can be mentioned. Specific examples include an alkyl group of 1 to 5 carbon atoms, a halogenated alkyl group of 1 to 5 carbon atoms, and a hydroxyalkyl group, and among these, a hydrogen atom or an alkyl group of 1 to 5 carbon atoms is preferred.

The benzene ring in the hydroxystyrene may have a substituent other than a hydroxy group. Examples of the substituent include a halogen atom, an alkyl group of 1 to 5 carbon atoms and a halogenated alkyl group of 1 to 5 carbon atoms. Examples of the halogen atom include a fluorine atom, a chlorine atom, a bromine atom and an iodine atom, and a fluorine atom is particularly preferred. Among these, the substituent is preferably an alkyl group of 1 to 5 carbon atoms.

As the structural unit (a5), a structural unit represented by general formula (a5-1) shown below is preferable because the solubility in an organic solvent becomes excellent, the resin containing the structural unit (a5) exhibits solubility in an alkali developing solution and the etching resistance can be improved.

[Chemical Formula 39]

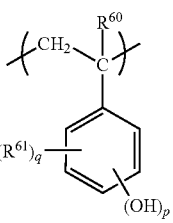
(a5-1)

In the formula, $R^{60}$ represents a hydrogen atom or an alkyl group of 1 to 5 carbon atoms; $R^{61}$ represents an alkyl group of 1 to 5 carbon atoms; p represents an integer of 1 to 3; and q represents an integer of 0 to 2.

In the formula (a5-1), specific examples of the alkyl group of 1 to 5 carbon atoms for $R^{60}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group. As $R^{60}$, a hydrogen atom or a methyl group is preferable.

p represents an integer of 1 to 3, and is preferably 1.

The bonding position of the hydroxy group may be any of o-position, m-position and p-position of the phenyl group. When p is 1, the p-position is preferable in terms of availability and low cost. When p is 2 or 3, a desired combination of the bonding positions can be used.

q represents an integer of 0 to 2. q is preferably 0 or 1, and most preferably 0 from industrial viewpoint.

As the alkyl group for $R^{61}$, the same alkyl groups as those described above for $R^{60}$ can be used.

When q is 1, the bonding position of $R^{61}$ may be any of o-position, m-position and p-position.

When q is 2, a desired combination of the bonding positions can be used. Here, the plurality of the $R^{61}$ group may be the same or different from each other.

When the structural unit (a5) is included in the component (A1), the amount of the structural unit (a5) based on the combined total of all the structural units that constitute the component (A1) is preferably within the range from 50 to 90 mol %, more preferably from 55 to 85 mol %, and still more preferably 60 to 80 mol %.

(Structural Unit (a6))

The structural unit (a6) is a structural unit derived from a styrene which may have the hydrogen atom bonded to the carbon atom on the α-position substituted with a substituent.

A "structural unit derived from styrene" refers to a structural unit that is formed by the cleavage of the ethylenic double bond of styrene.

As the substituent with which a hydrogen atom on the α-position of a stylene may be substituted, the same substituents as those described above in the explanation of the structural unit (a5) for the substituent to be bonded to the carbon atom on the α-position of the hydroxystyrene can be mentioned. Among these, the substituent is preferably a hydrogen atom or an alkyl group of 1 to 5 carbon atoms.

The benzene ring in the styrene may have a substituent. As the substituent, the same substituents as those described above in the explanation of the structural unit (a5) for the substituent which may be bonded to the benzene ring of the hydroxystyrene can be mentioned. Among these, the substituent is preferably an alkyl group of 1 to 5 carbon atoms.

As the structural unit (a6), a structural unit represented by general formula (a6-1) shown below is preferable because the solubility in an alkali developing solvent can be controlled, and heat resistance and dry etching resistance can be improved.

[Chemical Formula 40]

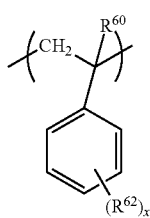

(a6-1)

In the formula, $R^{60}$ represents a hydrogen atom or an alkyl group of 1 to 5 carbon atoms; $R^{62}$ represents an alkyl group of 1 to 5 carbon atoms; and x represents an integer of 0 to 3.

In general formula (a6-1), $R^{60}$ is the same as defined above for $R^{60}$ in the structural unit (a5-1).

In the formula (a6-1), as the alkyl group for $R^{62}$, the same alkyl groups as those described above for $R^{61}$ in the formula (a5-1) can be used.

x represents an integer of 0 to 3, preferably 0 or 1, and most preferably 0 in terms of industrials.

When x represents 1, the substitution position of $R^{62}$ may be any of o-position, m-position or p-position. When x is 2 or 3, a desired combination of the bonding positions can be used. Here, the plurality of the $R^{62}$ group may be the same or different from each other.

When the structural unit (a6) is included in the component (A1), the amount of the structural unit (a6) based on the combined total of all the structural units that constitute the component (A1) is preferably within the range from 10 to 50 mol %, more preferably from 15 to 45 mol %, and still more preferably 20 to 40 mol %.

The component (A1) is preferably a polymer containing the structural units (a1), and more preferably a copolymer containing at least one structural unit selected from the structural units (a1), (a0) and (a2).

Examples of such component (A1) include a copolymer consisting of a repeating structure of the structural unit (a1) and structural unit (a2); a copolymer consisting of a repeating structure of structural unit (a1) and structural unit (a0); a copolymer consisting of a repeating structure of structural unit (a1), structural unit (a2) and structural unit (a3); a copolymer consisting of a repeating structure of structural unit (a1), structural unit (a0) and structural unit (a3); and a copolymer consisting of a repeating structure of structural unit (a1), structural unit (a0), structural unit (a2) and structural unit (a3).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight of the component (A1) is no more than the upper limit of the above-mentioned range, the resist composition exhibits a satisfactory solubility in a resist solvent. On the other hand, when the weight average molecular weight is at least as large as the lower limit of the above-mentioned range, the dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.2 to 2.5. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, MEF, circularity and various lithography properties such as reducing roughness are improved.

The component (A) may contain a base component which exhibits increased solubility in an alkali developing solution under action of an acid other than the component (A1) (hereafter, referred to as "component (A2)"), as long as the effects of the present invention are not impaired.

Examples of the component (A2) include low molecular weight compounds that have a molecular weight of at least 500 and less than 4,000, contains a hydrophilic group, and also contains an acid dissociable group described above in connection with the component (A1). Specific examples include compounds containing a plurality of phenol skeletons in which a part of the hydrogen atoms within hydroxyl groups have been substituted with the aforementioned acid dissociable groups.

Preferable examples of the low-molecular weight compound include low molecular weight phenolic compounds in which a part of the hydrogen atom within hydroxy group have been substituted with an aforementioned acid dissociable group, and these types of compounds are known, for example, as sensitizers or heat resistance improvers for use in non-chemically amplified g-line or i-line resists, and these compounds may be arbitrarily selected for use.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane skeletons is preferable in terms of resolution and line width roughness (LWR). Also, there are no particular limitations on the acid dissociable group, and suitable examples include the groups described above.

In the resist composition used for the present invention, the amount of the component (A) can be appropriately adjusted depending on the thickness of the resist film to be formed, and the like.

<Photo-Base Generator Component; Component (C)>

In the method of forming a resist pattern according to the present invention, since the component (C) is decomposed by the exposure energy in the step (2), thereby generating a base, and an excellent dissolution contrast can be obtained.

The component (C) may be any compound capable of being decomposed by irradiation of radiation to generate a base, and examples thereof include a compound containing a carbamate group (a urethane bond), a compound containing an acyloxyimino group, an ionic compound (an anion-cation complex), and a compound containing a carbamoyloxyimino group. Among these, a compound containing a carbamate group (a urethane bond), a compound containing an acyloxyimino group, and an ionic compound (an anion-cation complex) are preferable.

In addition, the component (C) preferably has a ring structure in the molecule thereof. Examples of the ring structure include benzene, naphthalene, anthracene, xanthone, thioxanthone, anthraquinone, fluorene, and the like.

In particular, as the component (C), a compound represented by general formula (C1) shown below (hereafter, referred to as "component (C1)") is particularly preferred in terms of photo-decomposability. When irradiating these components, at least a bond between the nitrogen atom within the formula (C1) and a carbon atom within carbonyl group adjacent to the nitrogen atom is cleaved, thereby generating a carbon dioxide and an amine or ammonia. After decomposition, the resulting product having a partial structure represented by —N(R$^1$)(R$^2$) preferably has a high boiling point. In addition, in terms of diffusion control during PEB, it is preferable that the resulting product having a partial structure represented by —N(R$^1$)(R$^2$) has a large molecular weight and a bulky structure.

[Chemical Formula 41]

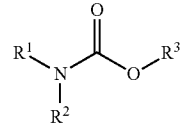

(C1)

In the formula, each of R$^1$ and R$^2$ independently represent a hydrogen atom or a monovalent hydrocarbon group which may have a hetero atom; R$^1$ and R$^2$ may be mutually bonded to form a ring together with the nitrogen atom adjacent to R$^1$ and R$^2$; and R$^3$ represents a monovalent photo functional group.

In the formula (C1), the hetero atom that the hydrocarbon group for R$^1$ and R$^2$ may have is an atom other than carbon and hydrogen, and examples thereof include an oxygen atom, a nitrogen atom, a sulfur atom and a halogen atom. Examples of the halogen atom include a fluorine atom, a chlorine atom, a bromine atom and an iodine atom.

The hydrocarbon group may be either an aromatic hydrocarbon group or an aliphatic hydrocarbon group, but is preferably an aliphatic hydrocarbon group.

In the formula (C1), the aromatic hydrocarbon group for R$^1$ and R$^2$ is a hydrocarbon group having an aromatic ring.

The aromatic hydrocarbon group for $^1$ and R$^2$ more preferably has 5 to 30 carbon atoms, still more preferably 5 to 20, particularly preferably 6 to 15, and most preferably 6 to 12. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and particularly preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In addition, in the case where the aromatic hydrocarbon group has an aliphatic hydrocarbon group which is bonded to the aromatic ring, part of the carbon atoms constituting the aliphatic hydrocarbon group may be substituted with a divalent linking group containing a hetero atom, or part or all of the hydrogen atoms constituting the aliphatic hydrocarbon group may be substituted with a substituent group. Examples of the aliphatic hydrocarbon group and the divalent linking group containing a hetero atom include the same groups as those described later for the aliphatic hydrocarbon group and the divalent linking group containing a hetero atom in the explanation of the aliphatic hydrocarbon group for $R^1$ and $R^2$.

Example of an aromatic hydrocarbon group in which part of the carbon atoms constituting the aromatic ring within the aromatic hydrocarbon group is substituted with a hetero atom include a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

As the substituents with which the hydrogen atom bonded to the aromatic ring in the aforementioned aromatic hydrocarbon group, for example, the same groups as those described above for the alkyl group, an alkoxy group, a halogen atom, a halogenated alkyl group, a hydroxyalkyl group, a hydroxy group, an oxygen atom (=O), —COOR", —OC(=O)R", a cyano group, a nitro group, —N(R")$_2$, —$R^{9'}$—N($R^{10'}$)—C(=O)—O—$R^{5'}$, and nitrogen-containing heterocyclic group can be mentioned.

The alkyl group for the substituent is preferably an alkyl group of 1 to 6 carbon atoms. Further, the alkyl group is preferably a linear alkyl group or a branched alkyl group. Specific examples include a methyl group, ethyl group, propyl group, isopropyl group, n-butyl group, isobutyl group, tert-butyl group, pentyl group, isopentyl group, neopentyl group and hexyl group. Among these examples, a methyl group or an ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkoxy group. Specific examples of the alkoxy groups include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

The hydroxyalkyl group for the substituent preferably has 1 to 6 carbon atoms, and specific examples thereof include the aforementioned alkyl groups for the substituent in which at least one hydrogen atom has been substituted with a hydroxy group.

In the —COOR" group, the —OC(=O)R" group and —NR"$_2$, R" represents a hydrogen atom or a linear, branched or cyclic alkyl group of 1 to 15 carbon atoms. When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group, it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

Two of R" in —NR"$_2$ may be the same or different from each other. In the group —$R^{9'}$—N($R^{10'}$)—C(=O)—O—$R^{5'}$, $R^{9'}$ represents a divalent hydrocarbon group which may contains a hetero atom, $R^{10'}$ represents a monovalent hydrocarbon group which may have a hydrogen atom or a hetero atom, and $R^{5'}$ represents a monovalent organic group containing an aliphatic ring or an aromatic ring.

As an example of the hydrocarbon group for $R^{9'}$, a group in which one hydrogen atom has been removed from a hydrocarbon group for $R^1$ in the formula (C1) can be given.

As examples of $R^{10'}$ and $R^{5'}$, the same groups as those described above for $R^2$ and $R^3$ in the formula (C1) can be given, respectively.

In particular, as $R^{5'}$, groups having a ring structure as described for the cyclic alkyl group for $R^1$ and $R^2$; and groups having a ring skeleton of aromatic ring such as benzene, biphenyl, indene, naphthalene, fluorene, anthracene, phenanthrene, xanthone, thioxanthone and anthraquinone can be given. In addition, the ring structure or ring skeleton may have a substituent. As the substituent, in terms of base generation efficiency, a nitro group is particularly preferred.

In the group —$R^{9'}$—N($R^{10'}$)—C(=O)—O—$R^{5'}$, $R^{10'}$, may be bonded to $R^{9'}$ to form a ring.

With respect to $R^1$ and $R^2$ in the formula (C1), for example, in the case where $R^1$ has a group —$R^{9'}$—N($R^{10'}$)—C(=O)—O—$R^{5'}$ as a substituent, $R^{10'}$ in the formula (C1) may be bonded to $R^2$ in the formula (C1) to form a ring.

With respect to $R^1$ and $R^2$ in the formula (C1), in the case where $R^1$ has a group —$R^{9'}$—N($R^{10'}$)—C(=O)—O—$R^{5'}$, as a substituent, as a compound represented by the formula (C1), a compound represented by following formula: $R^{5'}$—O—C(=O)—N($R^{10'}$)—$R^4$—N($R^2$)—C(=O)—O—$R^3$ [wherein, each of $R^2$, $R^3$, $R^{10'}$ and $R^{5'}$ is the same as those described above; and $R^4$ represents a divalent aliphatic hydrocarbon group] is preferable.

Examples of the divalent aliphatic hydrocarbon group for $R^4$ include groups in which one hydrogen atom has been removed from the aliphatic hydrocarbon group for $R^1$ and $R^2$ as described later.

The "nitrogen-containing heterocyclic group" as a substituent refers to a group in which one hydrogen atom has been removed from a nitrogen-containing heterocyclic compound containing a nitrogen atom in the ring skeleton thereof. The nitrogen-containing heterocyclic compound may have a hetero atom other than carbon atom and nitrogen atom (for example, oxygen atom and sulfur atom) in the ring skeleton thereof.

The nitrogen-containing heterocyclic compound may be either an aromatic compound or an aliphatic compound. In addition, in the case of aliphatic compound, the heterocyclic ring may be saturated or unsaturated. Further, the nitrogen-containing heterocyclic compound may be monocyclic or polycyclic.

The nitrogen-containing heterocyclic compound preferably has 3 to 30 carbon atoms, more preferably 5 to 30, and still more preferably 5 to 20.

Specific examples of monocyclic nitrogen-containing heterocyclic compound include pyrrole, pyridine, imidazole, pyrazole, 1,2,3-triazole, 1,2,4-triazole, pyrimidine, pyrazine, 1,3,5-triazine, tetrazole, piperidine, piperazine, pyrrolidine, morpholine, and the like.

Examples of the nitrogen-containing heterocyclic group include quinoline, isoquinoline, indole, pyrrolo[2,3-b]pyridine, indazole, benzoimidazol (benzimidazole), benzotriazole, carbazole, acridine, 1,5-diazabicyclo[4.3.0]-5-nonene, 1,8-diazabicyclo[5.4.0]-7-undecene, hexamethylenetetramine, 1,4-diazabicyclo[2.2.2]octane.

The nitrogen-containing heterocyclic compound may have a substituent. Examples of the substituent include the same substituents as those described above for substituting a hydrogen atom bonded to the aromatic ring in the aromatic hydrocarbon group. For example, the same groups as those described above for the alkyl group, an alkoxy group, a halogen atom, a halogenated alkyl group, a hydroxyalkyl group, a hydroxy group, an oxygen atom (=O), —COOR", —OC(=O)R", a cyano group, a nitro group, —N(R")$_2$ and —R$^{9'}$—N(R$^{10'}$)—C(=O)—O—R$^{5'}$ can be mentioned.

In the formula (C1), an aliphatic hydrocarbon group for $R^1$ and $R^2$ refers to a hydrocarbon group that has no aromaticity.

The aliphatic hydrocarbon group for $R^1$ and $R^2$ may be either a saturated aliphatic hydrocarbon group (that is, alkyl group), or an unsaturated aliphatic hydrocarbon group. Generally, a saturated aliphatic hydrocarbon group is preferred. Further, the aliphatic hydrocarbon group may be linear, branched or cyclic, or a combination thereof. As examples of the combination, a group in which the cyclic aliphatic hydrocarbon group is bonded to the terminal of the linear or branched aliphatic hydrocarbon group or interposed within the aforementioned linear or branched aliphatic hydrocarbon group, can be given.

The linear or branched alkyl group preferably has 1 to 20 carbon atoms, more preferably 1 to 15, and still more preferably 1 to 10.

Specific examples of linear alkyl group include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

Specific examples of branched alkyl group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The cyclic alkyl group may be either a monocyclic group or a polycyclic group. The aliphatic cyclic group preferably has 3 to 30 carbon atoms, more preferably 5 to 30, still more preferably 5 to 20, particularly preferably 6 to 15, and most preferably 6 to 12. As the aliphatic cyclic group, a group in which one hydrogen atom has been removed from a monocycloalkane or a polycycloalkane such as a bicycloalkane, tricycloalkane or tetracycloalkane can be used. Specific examples of groups in which one hydrogen atom have been removed from a monocycloalkane include a cyclopentyl group and a cyclohexyl group. In addition, examples of the group in which one hydrogen atom has been removed from a polycycloalkane include an adamantyl group, a norbornyl group, an isobornyl group, a tricyclodecyl group, a tetracyclododecyl group and the like.

The aliphatic hydrocarbon group may have a substituent. For example, in the aliphatic hydrocarbon group, part of the carbon atoms constituting the aliphatic hydrocarbon group may be substituted with a divalent linking group containing a hetero atom, or part or all of the hydrogen atoms constituting the aliphatic hydrocarbon group may be substituted with a substituent group containing a hetero atom.

With respect to the divalent linking group containing a hetero atom, as the hetero atom, the same hetero atoms as those described above for substituting part of the carbon atom constituting the aromatic ring in the aromatic hydrocarbon group can be given. Specific examples of the divalent linking group containing a hetero atom include non-hydrocarbon groups such as —O—, —C(=O)—, —C(=O)—O—, a carbonate bond (—O—C(=O)—O—), —S—, —S(=O)$_2$—, —S(=O)$_2$—O—, —NH—, —NR$^{04}$—(R$^{04}$ represents a substituent such as an alkyl group or an acyl group), —NH—C(=O)— and =N—. Further, a combination of any one of these "divalent linking groups containing a non-hydrocarbon group" with a divalent aliphatic hydrocarbon group can also be used. As examples of the divalent aliphatic hydrocarbon group, the same groups in which one hydrogen atom has been removed from the aforementioned aliphatic hydrocarbon group can be given, and a linear or branched aliphatic hydrocarbon group is preferable.

As the latter examples of the substituent for substituting the aliphatic hydrocarbon group, the same substituents as those described above for substituting a hydrogen atom bonded to the aromatic ring in the aromatic hydrocarbon group can be mentioned.

In the general formula (C1), $R^1$ and $R^2$ may be mutually bonded to form a cyclic group together with the nitrogen atom adjacent to these groups.

The cyclic group may be either an aromatic cyclic group or an aliphatic cyclic group. In the case of aliphatic cyclic group, the cyclic group may be saturated or unsaturated. Generally, a saturated cyclic group is preferred.

The cyclic group may have a nitrogen atom other than the nitrogen atom bonded to $R^1$ and $R^2$ in the ring skeleton. In addition, the cyclic group may have a hetero atom other than carbon atom and nitrogen atom (for example, oxygen atom and sulfur atom).

The cyclic group may be either a monocyclic group or a polycyclic group.

In the case of monocyclic group, the number of atoms constituting the skeleton of the cyclic group is preferably 4 to 7, and more preferably 5 to 6. That is, the cyclic group is preferably a 4 to 7-membered ring, and more preferably a 5 to 6-membered ring. Specific examples of the monocyclic cyclic group include a group in which a hydrogen atom has been removed from —NH— group in the monocyclic heterocyclic compound containing —NH— group, such as piperidine, pyrrolidine, morpholine, pyrrole, imidazole, pyrazole, 1,2,3-triazole, 1,2,4-triazole, tetrazole, piperazine, and the like.

In the case of polycyclic group, the cyclic group is preferably a bicyclic-, tricyclic- or tetracyclic group, and the number of atoms constituting the ring skeleton is preferably 7 to 12, and more preferably 7 to 10. Specific examples of the polycyclic nitrogen-containing hetero cyclic group include a group in which a hydrogen atom has been removed from —NH— group in the polycyclic heterocyclic compound containing —NH— group, such as indole, isoindole, carbazole, benzimidazole, indazole, benzotriazole, and the like.

The cyclic group may have a substituent. Examples of the substituent include the same substituents as those described above for substituting a hydrogen atom bonded to the aromatic ring in the aromatic hydrocarbon group.

The cyclic group formed by mutually bonding $R^1$ and $R^2$ together with the adjacent nitrogen atom, a group represented by general formula (II) shown below is particularly preferred.

[Chemical Formula 42]

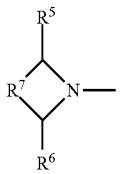

(II)

In the formula, each of $R^5$ and $R^6$ independently represents a hydrogen atom or an alkyl group; $R^7$ represents a linear alkylene group of 1 to 3 carbon atoms in which a carbon atom may be replaced by an oxygen atom or a nitrogen atom and a hydrogen atom may be replaced by a substituent.

In the formula (II), as the alkyl group for $R^5$ and $R^6$, the same groups as those described above in the explanation of aliphatic hydrocarbon groups for $R^1$ and $R^2$, and a linear or branched alkyl group is preferable, and a methyl group is particularly preferred.

With respect to $R^7$, examples of the alkylene group in which a carbon atom may be replaced by an oxygen atom or a nitrogen atom include —$CH_2$—, —$CH_2$—O—, —$CH_2$—$CH_2$—, —$CH_2$—NH—$CH_2$—, —$CH_2$—$CH_2$—$CH_2$—, —$CH_2$—$CH_2$—O—$CH_2$— and —$CH_2$—$CH_2$—NH—$CH_2$—.

Examples of the substituent for substituting a hydrogen atom in the alkylene group include the same substituents as those described above for substituting a hydrogen atom bonded to the aromatic ring in the aromatic hydrocarbon group. The hydrogen atom to be substituted with a substituent may be either a hydrogen atom bonded to a carbon atom or a hydrogen atom bonded to a nitrogen atom.

Among these, it is preferable that at least one of $R^1$ and $R^2$ represents an alkyl group which may have a substituent, or a cyclic group which is formed from $R^1$ and $R^2$ bonded together with a nitrogen atom in the formula.

Specific examples of the combination of $R^1$ and $R^2$ include the case where both of $R^1$ and $R^2$ represent monocyclic groups; the case where both of $R^1$ and $R^2$ represent linear or branched alkyl groups in which part of carbon atom has been replaced by —O—; the case where at least one of $R^1$ and $R^2$ represents a hydrogen atom and the other represents a monocyclic group; the case where at least one of $R^1$ and $R^2$ represents a hydrogen atom and the other represents a polycyclic group; the case where $R^1$ and $R^2$ are bonded together with a nitrogen atom in the formula to form a six-membered ring cyclic group (wherein, the cyclic group may have a substituent); and the case where at least one of $R^1$ and $R^2$ represents a hydrogen atom and the other represents a phenyl group.

In the formula (C1), $R^3$ represents a monovalent photo functional group.

Here, the term "photo functional group" refers to a group which can absorb the exposure energy generated by exposure treatment in the step (2).

The photo functional group is preferably a ring-containing group, and may be a hydrocarbon ring or a heterocyclic ring. Preferable examples of the photo functional group include a group having a cyclic structure as those described above for $R^1$ and $R^2$ and a group having an aromatic ring. Specific examples of the ring skeleton in the ring-containing group include benzene, biphenyl, indene, naphthalene, fluorene, anthracene, phenanthrene, xanthone, thioxanthone, anthraquinone and the like.

In addition, the ring skeleton may have a substituent. As the substituent, in terms of base generation efficiency, a nitro group is particularly preferred.

As the component (C1), a compound represented by any one of general formula (C1-11) shown below and general formula (C1-12) shown below is particularly desirable.

[Chemical Formula 43]

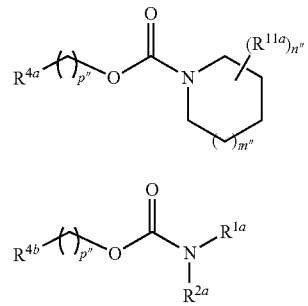

(C1-11)

(C1-12)

In the formula, each of $R^{4a}$ to $R^{4b}$) independently represents a ring skeleton selected from benzene, biphenyl, indene, naphthalene, fluorene, anthracene, phenanthrene, xanthone, thioxanthone and anthraquinone; each of $R^{1a}$ and $R^{2a}$ independently represents an alkyl group of 1 to 15 carbon atoms or a cycloalkyl group of 1 to 15 carbon atoms; $R^{11a}$ represents an alkyl group of 1 to 5 carbon atoms; m" represents 0 or 1; n" represents 0 to 3; and each of p" represents 0 to 3.

In the formulas (C1-11) and (C1-12), $R^{4a}$ and $R^{4b}$ preferably have a nitro group, in terms of base generation efficiency, and the nitro group particularly preferably be substituted at ortho position thereof.

As $R^{1a}$ and $R^{2a}$, in terms of base generation efficiency, a cycloalkyl group of 5 to 10 carbon atoms is preferred.

m" is preferably 1. n" is preferably 0 to 2. p" is preferably 0 or 1.

When irradiating the compound represented by the formula (C1-11) or (C1-12), at least a bond between the nitrogen atom within these formulas and a carbon atom within carbonyl group adjacent to the nitrogen atom is cleaved, thereby generating an amine and a carbon dioxide. After decomposition, the amine generated by decomposition preferably has a high boiling point. In addition, in terms of diffusion control during PEB, it is preferable that the amine has a large molecular weight and a bulky structure.

Among the compounds represented by formula (C1-11) or (C1-12), a compound represented by formula (C1-1-1) shown below is more preferable.

[Chemical Formula 44]

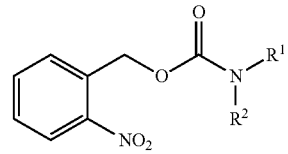

(C1-1-1)

In the formula, each of $R^1$ and $R^2$ independently represents a hydrogen atom, an alkyl group which may have a substituent, or a phenyl group which may have a substituent, provided that at least one of $R^1$ and $R^2$ represents an alkyl group or a phenyl group, and $R^1$ and $R^2$ may be mutually bonded to form a ring with the nitrogen atom in the formula.

[Component (C1-1-1)]

When irradiating (exposing) the component (C1-1-1), at least a bond between the nitrogen atom within the formula (C1-1-1) and the carbon atom within carbonyl group adjacent to the nitrogen atom is cleaved, thereby generating an amine and a carbon dioxide.

In the formula (C1-1-1), each of $R^1$ and $R^2$ independently represents a hydrogen atom, an alkyl group which may have a substituent, or a phenyl group which may have a substituent.

Provided that, at least one of $R^1$ and $R^2$ represents an alkyl group which may have a substituent or a phenyl group which may have a substituent.

As the alkyl group for $R^1$ and $R^2$, the same alkyl group as those described above for $R^1$ and $R^2$ in the formula (C1) can be used.

In the formula (C1-1-1), the phenyl group for $R^1$ and $R^2$ may have a substituent. For example, part of the carbon atoms constituting the phenyl group may be substituted with a hetero atom, or a hydrogen atom within the phenyl group may be substituted with a substituent.

Examples of the group in which part of the carbon atoms constituting the phenyl group may be substituted with a hetero atom include a group in which part of the carbon atoms constituting the phenyl group has been substituted with a hetero atom such as an oxygen atom, a sulfur atom or a nitrogen atom.

Examples of the group in which a hydrogen atom within the phenyl group may be substituted with a substituent includes groups as those described above for "substituent with which part or all hydrogen atoms constituting the alkyl group has been substituted", for example, an alkyl group, an alkoxy group, a halogen atom, a halogenated alkyl group, a hydroxyalkyl group, a hydroxy group, an oxygen atom (=O), —COOR", —OC(=O)R", a cyano group, a nitro group, —N(R")$_2$, —R$^{9\prime}$—N(R$^{10\prime}$)—C(=O)—O—R$^{5\prime}$, a nitrogen-containing heterocyclic group, and the like.

In the formula (C1-1-1), $R^1$ and $R^2$ may be mutually bonded to form a ring with the nitrogen atom in the formula. Examples of the cyclic group formed together with the nitrogen atom include the same cyclic group as those described above for a cyclic group which is formed from $R^1$ and $R^2$ bonded together with the nitrogen atom in the formula.

Specific examples of the component (C1) are shown below.

[Chemical Formula 45]

(C1-11-1)

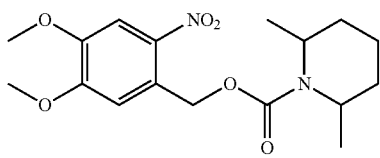

(C1-11-2)

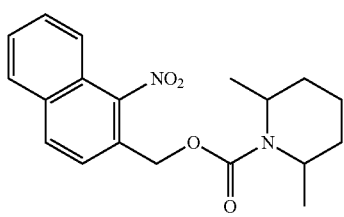

(C1-11-3)

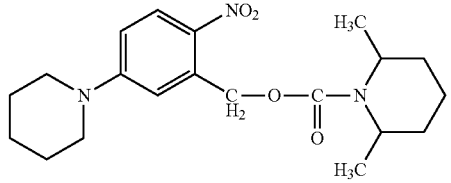

(C1-11-4)

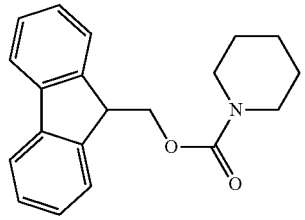

(C1-11-5)

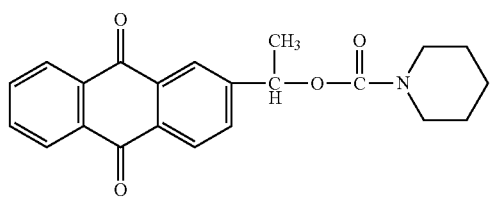

[Chemical Formula 46]

(C1-12-1)

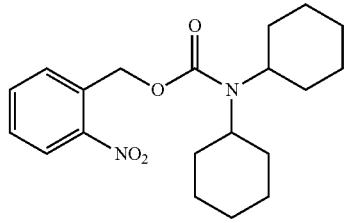

(C1-12-2)

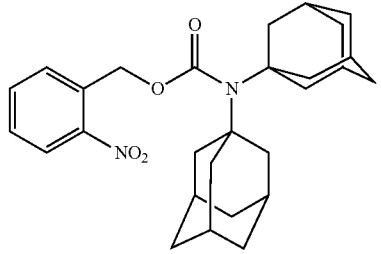

(C1-12-3)

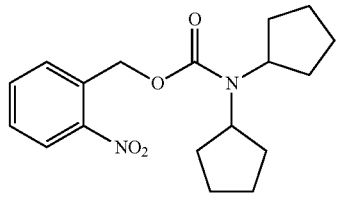

(C1-12-4)

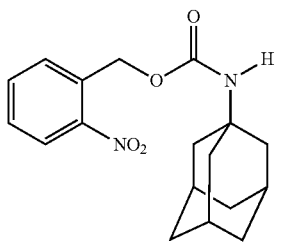

[Chemical Formula 47]

(C1-5)

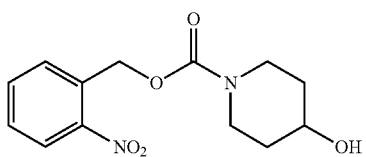

(C1-6)

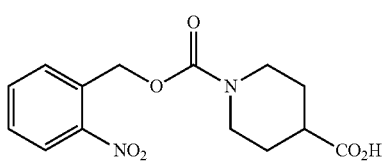

(C1-7)

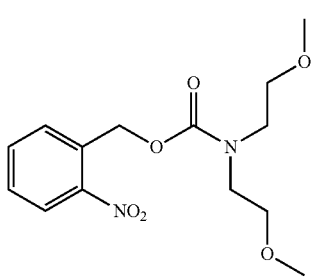

(C1-8)

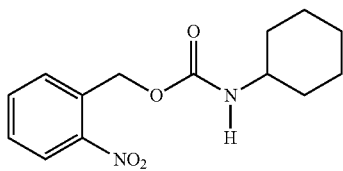

(C1-9)

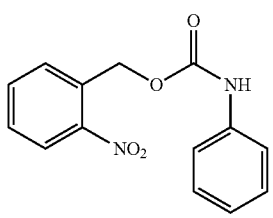

As the component (C1), one type of compound may be used, or two or more types of compounds may be used in combination.

In the resist composition according to the present invention, the amount of the component (C1) within the component (C) is preferably 50% by weight or more, still more preferably 75% by weight or more, and may be even 100% by weight. When the amount of the component (C1) is at least as large as the lower limit of the above-mentioned range, the resolution of resist pattern to be formed and the shape of the resist pattern become excellent.

In the resist composition according to the present invention, the amount of the component (C1) relative to 100 parts by weight of the component (A) is preferably 0.05 to 50 parts by weight, more preferably 1 to 30 parts by weight, and most preferably 5 to 20 parts by weight.

When the amount of the component (C1) is at least as large as the lower limit of the above-mentioned range, the film retention properties at the exposed portions of resist film become excellent and the resolution of resist pattern to be formed and the shape of the resist pattern become excellent. When the amount of the component (C1) is no more than the upper limit of the above-mentioned range, the transparency of resist film can be maintained.

[Component (C2)]

The resist composition according to the present invention may further contain a photo-base generator component which generates a base upon exposure other than the component (C1) (hereafter, referred to as "component (C2)"), as long as the effects of the present invention are not impaired.

The component (C2) may be any components which are decomposed by irradiation (exposure) and generate a base. Examples thereof include a component having a carbamate group (urethane bond), a component having an acyloxyimino group, an ionic component (an anion-cation complex) and a component having a carbamoyloxyimino group, and in particular, a component having a carbamate group (urethane bond), a component having an acyloxyimino group and an ionic component (an anion-cation complex) can be mentioned.

In addition, the component (C) preferably has a ring structure in the molecule thereof. Examples of the ring structure include benzene, naphthalene, anthracene, xanthone, thioxanthone, anthraquinone, fluorene, and the like.

As a preferable example of the component (C), a compound represented by general formula (C2) shown below (hereafter, referred to as "component (C2)") can also be given.

After the component (C2) absorbs an exposure energy generated by exposure in the step (2), a trans double bond within a group represented by —CH═CH—C(═O)— is isomerized to a cis double bond, and cyclization reaction in the molecule is occurred by heating, thereby generating a base represented by $NHR^1R^2$.

The component (C2) is preferable since the component (C2) generates a base, and easily achieves an insoluble effect in the alkali developing solution in the step (4).

[Chemical Formula 48]

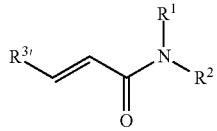

(C2)

In the formula (C2), $R^1$ and $R^2$ are the same as defined for $R^1$ and $R^2$ in the formula (C1); and $R^{3\prime}$ represents an aromatic cyclic group having a hydroxy group at ortho position.

In the formula (C2), $R^1$ and $R^2$ may be mutually bonded to form a cyclic group represented by the formula (II) together with the nitrogen atom adjacent to these groups. Preferable examples of $R^1$ and $^2$ include the same groups as those described for $R^{1a}$ and $R^{2a}$ in the formula (C1-12).

As the aromatic cyclic group for $R^{3\prime}$, the same groups containing the aromatic ring as those described above for $R^3$ in the formula (C1) can be mentioned, and as the ring skeleton, a benzene ring, a biphenyl ring, an indene ring, a naphthalene ring, a fluorene ring, an anthracene ring and a phenanthrene ring are preferable, and a benzene ring is more preferable.

The aromatic cyclic group for $R^{3'}$ may have a substituent other than a hydroxy group on ortho position. Examples of the substrate include a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonato group, an amino group, an ammonio group and a monovalent organic group such as an alkyl group.

Specific examples of the component (C2) are shown below.

[Chemical Formula 49]

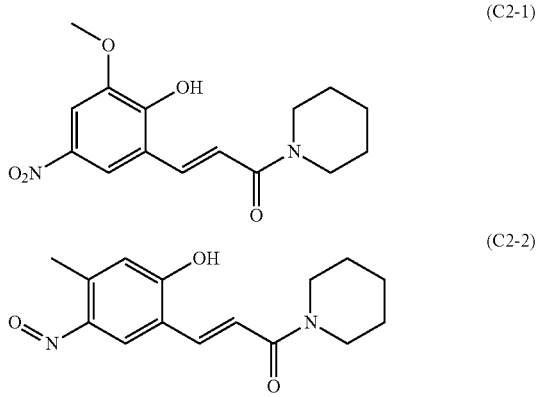

(C2-1)

(C2-2)

As a preferable example of the component (C), a compound represented by general formula (C3) shown below (hereafter, referred to as "component (C3)") can also be given.

After the component (C3) absorbs an exposure energy generated by exposure in the step (2), decarboxylation reaction of the component (C3) is occurred, and then an amine (base) is generated by reacting with water.

[Chemical Formula 50]

(C3)

In the formula, $R^a$ and $R^d$ represents a hydrogen atom or a hydrocarbon group of 1 to 30 carbon atoms which may have a substituent, provided that, in the case where both $R^a$ and $R^d$ represent a hydrocarbon group of 1 to 30 carbon atoms which may have a substituent, these groups are mutually bonded to form a ring; and $R^b$ represents an aryl group which may have a substituent or an aliphatic cyclic group which may have a substituent.

In the formula (C3), $R^a$ represents a hydrogen atom, or a hydrocarbon group of 1 to 30 carbon atoms which may have a substituent.

The hydrocarbon group of 1 to 30 carbon atoms which may have a substituent for $R^a$ may be an aromatic hydrocarbon group or an aliphatic hydrocarbon group.

The aromatic hydrocarbon group is a hydrocarbon group having an aromatic ring. The aromatic hydrocarbon group preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 3, and particularly preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is most desirable.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the aforementioned halogenated alkyl group as the substituent for the aromatic hydrocarbon group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic hydrocarbon group for $R^a$ in the formula (C3) may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $R^a$ in the formula (C3), part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $R^a$ in the formula (C3), there is no particular limitation as long as it is an atom other than carbon and hydrogen. Examples of the halogen atom include a fluorine atom, a chlorine atom, an iodine atom and a bromine atom.

The substituent group containing a hetero atom may be a group consisting of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (wherein, H may be substituted with a substituent such as an alkyl group or an acyl group), —S—, —S(=O)$_2$— and —S(=O)$_2$—O—. When the aliphatic hydrocarbon group is cyclic group, the aliphatic hydrocarbon group may contain any of these substituent groups in the ring structure.

Specific examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and particularly preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

In the formula (C3), the cyclic aliphatic hydrocarbon group (aliphatic cyclic group) for $R^a$ represents an aliphatic cyclic group of 3 to 30 carbon atom which may have a substituent.

In the aliphatic cyclic group for $R^a$ in the formula (C3), part of the carbon atoms constituting the aliphatic cyclic group may be substituted with a substituent group containing a hetero atom, or part or all of the hydrogen atoms constituting the aliphatic cyclic group may be substituted with a substituent group containing a hetero atom.

As the "hetero atom" for $R^a$ in the formula (C3), there is no particular limitation as long as it is an atom other than carbon and hydrogen. Examples thereof include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (wherein, H may be substituted with a substituent such as an alkyl group or an acyl group), —S—, —S(=O)$_2$— and —S(=O)$_2$—O—. These substituents may be contained in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic cyclic group may be either a monocyclic group or a polycyclic group. The aliphatic cyclic group has 3 to 30 carbon atoms, preferably 5 to 30, more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 51]

(L1)
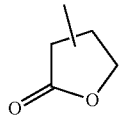

(L2)
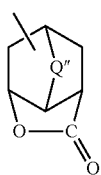

(L3)
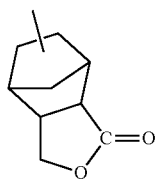

(L4)
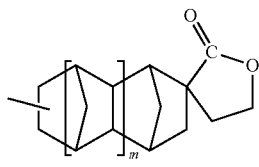

(L5)
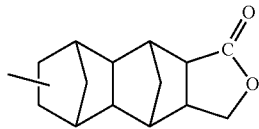

(L6)
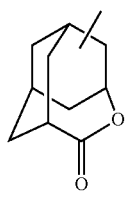

(S1)
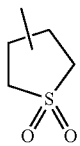

(S2)
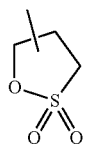

-continued (S3)
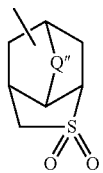

(S4)
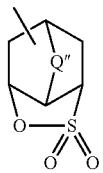

In the formulas, Q″ represents an alkylene group of 1 to 5 carbon atoms, —O—, —S—, —O—R$^{94}$— or —S—R$^{95}$—; and R$^{94}$ and R$^{95}$ each independently represent an alkylene group of 1 to 5 carbon atoms; and m represents an integer of 0 or 1.

In the formulas, the alkylene group for Q″, R$^{94}$ and R$^{95}$ is preferably a linear or branched alkylene group, and has 1 to 5 carbon atoms, and more preferably 1 to 3 carbon atoms.

Specific examples of the alkylene group include a methylene group [—CH$_2$—], alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, an ethylene group [—CH$_2$CH$_2$—], alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, a trimethylene group (n-propylene group) [—CH$_2$CH$_2$CH$_2$—], alkyltrimethylene groups such as —CH(CH$_3$)CH$_2$CH$_2$— and —CH$_2$CH(CH$_3$)CH$_2$—, a tetramethylene group [—CH$_2$CH$_2$CH$_2$CH$_2$—], alkyltetramethylene groups such as —CH(CH$_3$)CH$_2$CH$_2$CH$_2$— and —CH$_2$CH(CH$_3$)CH$_2$CH$_2$—, and a pentamethylene group [—CH$_2$CH$_2$CH$_2$CH$_2$CH$_2$—].

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

As the aliphatic cyclic group which may have a substituent for R$^a$ in the formula (C3), an aliphatic polycyclic group which may have a substituent is preferable. As the aliphatic polycyclic group, the aforementioned groups in which one or more hydrogen atoms have been removed from a polycycloalkane, and the aforementioned groups represented by formulas (L2) to (L6), (S3) and (S4) are preferable.

In the case where R$^a$ in the formula (C3) represents a hydrocarbon group of 1 to 30 carbon atoms which may have a substituent, the group may form a ring together with a carbon atom adjacent to R$^a$.

The ring structure to be formed may be either a monocyclic ring structure or a polycyclic ring structure. The number of carbon atoms including the carbon atom adjacent to R$^a$ is preferably 5 to 30, and more preferably 5 to 20.

Specifically, when the carbon atom adjacent to $R^a$ is considered as a part of the ring, the same aliphatic cyclic group of 5 to 30 carbon atoms as described above for a cyclic aliphatic hydrocarbon group (aliphatic cyclic group) for $R^a$ can be mentioned.

In the formula (C3), $R^a$ is preferably a hydrogen atom, or a cyclic group which may have a substituent. The cyclic group may be either an aromatic hydrocarbon group which may have a substituent, or an aliphatic cyclic group which may have a substituent.

As the aliphatic cyclic group which may have a substituent, an aliphatic polycyclic group which may have a substituent is preferable. As the aliphatic polycyclic group, the aforementioned groups in which one or more hydrogen atoms have been removed from a polycycloalkane, and the aforementioned groups represented by formulas (L2) to (L6), (S3) and (S4) are preferable.

As the aromatic hydrocarbon group which may have a substituent, a naphthyl group which may have a substituent, or a phenyl group which may have a substituent is more preferable.

Examples of the aryl group for $R^b$ in the formula (C3) include the same aromatic hydrocarbon group as those described above for $R^a$ in the formula (C3), except for the arylalkyl groups. As the aryl group for $R^b$, a phenyl group is more preferable.

As the aliphatic cyclic group for $R^b$ in the formula (C3), the same aliphatic cyclic group as those mentioned above for $R^a$ in the formula (C3). The aliphatic cyclic group for $R^b$ is preferably an aliphatic polycyclic group, more preferably a group in which one or more hydrogen atoms have been removed from a polycycloalkane, and most preferably a group in which one or more hydrogen atoms have been removed from adamantane.

As the substituent which the aromatic hydrocarbon group and aliphatic cyclic group for $R^b$ may have, the same groups as those described above for $R^a$ in the formula (C3) can be given.

As $R^d$ in the formula (C3), the same groups as those mentioned above for $R^a$ in the formula (C3).

In the formula (C3), $R^d$ is preferably a cyclic group which may have a substituent.

The cyclic group may be either an aromatic hydrocarbon group which may have a substituent, or an aliphatic cyclic group which may have a substituent, and an aromatic cyclic group which may have a substituent is preferable.

As the aliphatic cyclic group which may have a substituent, an aliphatic polycyclic group which may have a substituent is preferable. As the aliphatic polycyclic group, the aforementioned groups in which one or more hydrogen atoms have been removed from a polycycloalkane, and the aforementioned groups represented by formulas (L2) to (L6), (S3) and (S4) are preferable.

As $R^d$ in the formula (C3), a naphthyl group which may have a substituent, or a phenyl group which may have a substituent is more preferable, the phenyl group which may have a substituent is most preferable.

In the case where both $R^a$ and $R^d$ in the formula (C3) represent a hydrocarbon group of 1 to 30 carbon atoms which may have a substituent, these groups are mutually bonded to form a ring. The ring structure to be formed may be either a monocyclic ring structure or a polycyclic ring structure. The number of carbon atoms including the carbon atom bonded to $R^a$ and $R^d$ in the formula (C3) is preferably 5 to 30, and more preferably 5 to 20.

Specifically, when the carbon atom bonded to $R^a$ and $R^d$ in the formula (C3) is considered as a part of the ring, the same aliphatic cyclic group of 5 to 30 carbon atoms as described above for a cyclic aliphatic hydrocarbon group (aliphatic cyclic group) for $R^a$ can be mentioned.

Specific examples of the component (C3) are shown below.

[Chemical Formula 52]

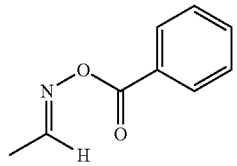

(C3-1)

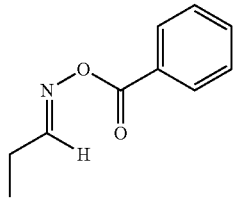

(C3-2)

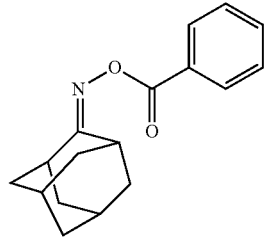

(C3-3)

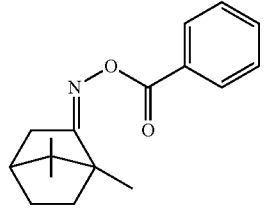

(C3-4)

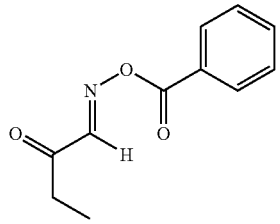

(C3-5)

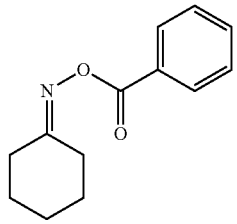

(C3-6)

(C3-7) 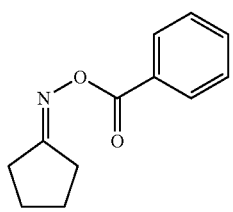
(C3-8) 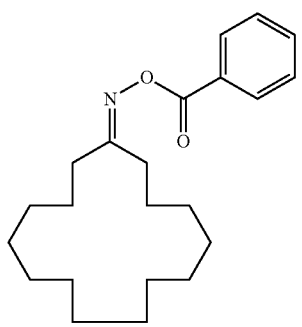
(C3-9) 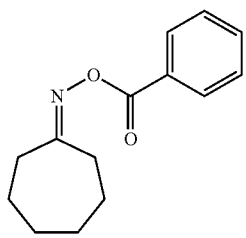
(C3-10) 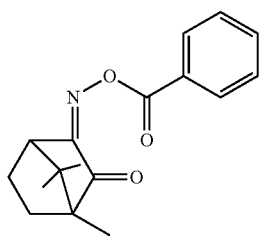
[Chemical Formula 53]
(C3-11) 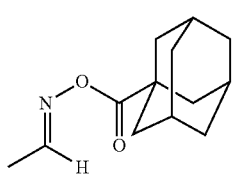
(C3-12) 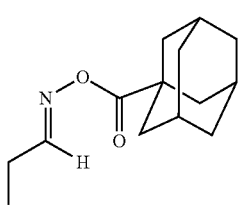
(C3-13) 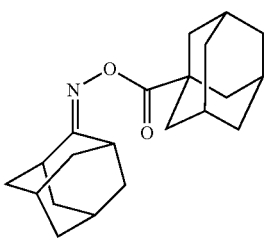
(C3-14) 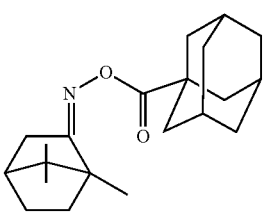
(C3-15) 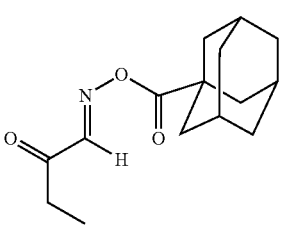
(C3-16) 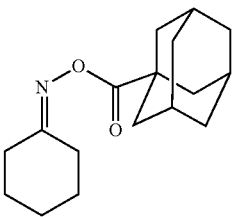
(C3-17) 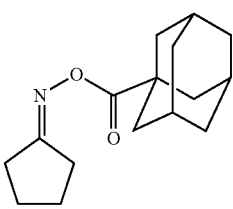
(C3-18) 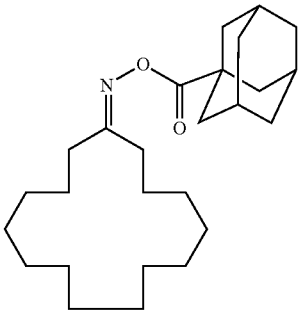

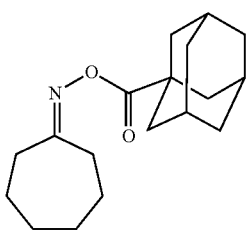

(C3-19)

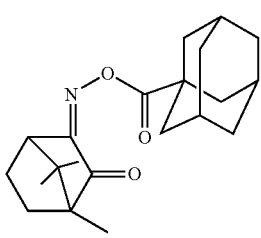

(C3-20)

As a preferable example of the component (C), a photo-base generator component containing an acyloxyimino group (hereafter, referred to as "component (C4)") can also be given. As the component (C4), a compound represented by general formula (C4-1) shown below and a compound represented by general formula (C4-2) shown below can be given.

[Chemical Formula 54]

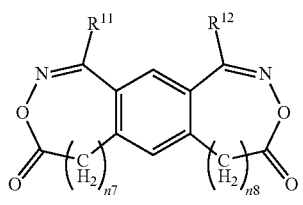

(C4-1)

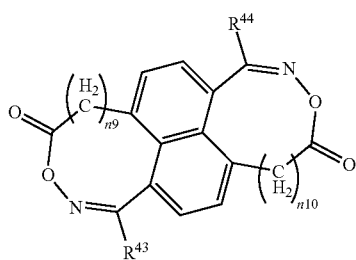

(C4-2)

In the formulas, $R^{11}$, $R^{12}$, $R^{43}$ and $R^{44}$ each independently represent a hydrogen atom and an alkyl group of 1 to 5 carbon atoms; and n7 to n10 each independently represent an integer of 0 to 3.

As the component (C) other than the aforementioned compounds, any one of the known photo-base generators used in conventional chemically amplified resist compositions can be used.

Examples of the photo-base generator include an ionic photo-base generator (an anion-cation complex), a triphenylsulfonium compound and triphenylmethanol; photoactive carbamates such as benzylcarbamate and benzoincarbamate; amides such as o-carbamoylhydroxylamine, o-carbamoyloxime, an aromaticsulfoneamide, α-lactam and N-(2-allylethynyl)amide; oximeester, α-aminoacetophenone and cobalt complex; and a photo-base generator disclosed in Japanese Unexamined Patent Application, First Publication No. 2007-279493.

As the component (C), one type of compound may be used alone, or two or more types of compounds may be used in combination.

Among these, as the component (C), the component (C1) is preferable, and one or more compounds selected from compounds represented by the general formula (C1-11) or (C1-12) are more preferable. Among these, a compound represented by the formula (C1-1-1) is particularly preferred.

In the resist composition according to the present invention, the amount of the component (C) relative to 100 parts by weight of the component (A) is preferably 0.05 to 50 parts by weight, more preferably 1 to 30 parts by weight, and most preferably 5 to 20 parts by weight. When the amount of the component (C) is at least as large as the lower limit of the above-mentioned range, the film retention properties at exposed portions of the resist film become excellent, and the effect of the present invention is further improved. On the other hand, when the amount of the component (C) is no more than the upper limit of the above-mentioned range, the transparency of the resist film can be maintained.

<Acid Supply Component; Component (Z)>

In the step (1) of the method of forming a resist pattern according to the present invention, the resist composition containing an "acid supply component" which supplies an acid which is provided to the resist film is used.

In the present invention, the "acid supply component" includes a component exhibits acidity by itself, that is, a component acts as a proton donor (hereafter, referred to as "acid supply component" or component (G)); and a component which is decomposed by heat or light and acts as an acid (hereafter, referred to as "acid generator component" or component (B)).

Acidic Compound Component; Component (G)

In the present invention, as the component (G), an acidic salt having an acid strength capable of increasing the solubility of the base component (A) in the alkali developing solution (hereafter, referred to as "component (G1)") or an acid other than the acidic salt (acid which does not form a salt and is not ionic; hereafter, referred to as "component (G)") can be used.

The "an acidic salt having an acid strength capable of increasing the solubility of the base component (A) in the alkali developing solution" includes an acid which can cleave at least a part of bonds within the acid decomposable group in the structural unit (a1) by baking (PEB) in the step (3), in the case where the polymeric compound (A1) containing the structural unit (a1) is used.

[Component (G1)]

Examples of the component (G1) include an ionic compound (salt compound) which consists of a nitrogen-containing cation moiety and a counteranion. Even if forming a salt, the component (G1) exhibits acidity by itself, and acts as a proton donor.

Each of the anion moiety and the anion moiety in the component (G1) will be described.

(Cation Moiety of Component (G1)

The cation moiety in the component (D1) is not particularly limited as long as it contains a nitrogen atom, and a cation moiety represented by general formula (G1c-1) shown below is particularly used

[Chemical Formula 55]

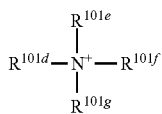
(G1c-1)

In the formula, $R^{101d}$, $R^{101e}$, $R^{101f}$ and $R^{101g}$ each independently represents a hydrogen atom, a linear, branched or cyclic alkyl group, an alkenyl group, an oxoalkyl group or an oxoalkenyl group of 1 to 12 carbon atoms, an aryl group or an arylalkyl group of 6 to 20 carbon atoms, an aralkyl group of 7 to 12 carbon atoms or an aryloxoalkyl group, and part or all of the hydrogen atoms of these groups may be substituted with a halogen atom, an alkoxy group or a sulfur atom. $R^{101d}$ and $R^{101e}$, or $R^{101d}$, $R^{101e}$ and $R^{101f}$ may be mutually bonded with the nitrogen atom to form a ring, provided that, when a ring is formed, each of $R^{101d}$ and $R^{101e}$, or each of $R^{101d}$, $R^{101e}$ and $R^{101f}$ independently represents an alkylene group of 3 to 10 carbon atoms, or forms a heterocyclic group containing the nitrogen atom in the ring thereof.

In the formula (G1c-1), $R^{101d}$, $R^{101e}$, $R^{101f}$ and $R^{101g}$ each represent a hydrogen atom, a linear, branched or cyclic alkyl group, an alkenyl group or an oxoalkyl group of 1 to 12 carbon atoms or an oxoalkenyl group, an aryl group or an arylalkyl group of 6 to 20 carbon atoms, an aralkyl group of 7 to 12 carbon atoms or an aryloxoalkyl group.

As the alkyl group for $R^{101d}$ to $R^{101g}$, the same alkyl groups as those described above for $R^1$ and $R^2$ can be mentioned, and the number of carbon atoms is preferably 1 to 10, and a methyl group, an ethyl group, a propyl group or a butyl group is particularly preferable.

The alkenyl group for $R^{101d}$ to $R^{101g}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

The oxoalkyl group for $R^{101d}$ to $R^{101g}$ preferably has 2 to 10 carbon atoms, and examples thereof include a 2-oxoethyl group, a 2-oxopropyl group, a 2-oxocyclopentyl group and a 2-oxocyclohexyl group can be mentioned.

As the oxoalkenyl group for $R^{101d}$ to $R^{101g}$, an oxo-4-cyclohexenyl group and a 2-oxo-4-propenyl group can be mentioned.

As the aryl group for $R^{101d}$ to $R^{101g}$, the same aryl groups as those described above in the aromatic hydrocarbon groups for $R^1$ and $R^2$ can be mentioned, and a phenyl group or a naphthyl group is preferable. As the arylalkyl group, a group in which one or more hydrogen atoms within the aryl group have been substituted with an alkyl group (preferably an alkyl group of 1 to 5 carbon atoms) can be mentioned.

As the aralkyl group or aryloxoalkyl group for $R^{101d}$ to $R^{101g}$, a benzyl group, a phenylethyl group, a phenethyl group, a 2-phenyl-2-oxoethyl group, 2-(1-naphthyl)-2-oxoethyl group and 2-(2-naphthyl)-2-oxoethyl group can be mentioned, respectively.

The hydrogen atom within alkyl group, alkenyl group, oxoalkyl group, oxoalkenyl group, aryl group, arylalkyl group, aralkyl group and aryloxoalkyl group for $R^{101d}$ to $R^{101g}$ or may not be substituted with a halogen atom such as a fluorine atom, an alkoxy group or a sulfur atom.

In the case where $R^{101d}$ to $R^{101g}$ is constituted from a combination of an alkyl group and a hydrogen atom, at least a part of hydrogen atom within the alkyl group is preferably substituted with a halogen atom such as a fluorine atom, an alkoxy group and a sulfur atom, in terms of storage stability and lithography properties.

In addition, $R^{101d}$ and $R^{101e}$, or $R^{101d}$ and $R^{101e}$ and $R^{101f}$ may be mutually bonded to form a ring together with a nitrogen atom in the formula. Examples of the ring to be formed include a piperidine ring, a hexamethyleneimine ring, an azole ring, a pyridine ring, a pyrimidine ring, an azepine ring, a pyrazine ring, a quinoline ring and a benzoquinoline ring.

In addition, the ring skeleton may have an oxygen atom, and specific examples include an oxazole ring and an isoxazole ring.

In particular, the cation moiety represented by the formula (G1c-1) is preferably a nitrogen-containing cation moiety having a pKa of 7 or less.

In the present invention, pKa refers to an acid dissociation constant which is generally used as a parameter which shows the acid strength of an objective substance. The pKa value of the cation moiety within the component (G1) can be determined by a conventional method. In addition, the pKa value can be estimated using a known soft ware such as "ACD/Labs" (product name, manufactured by Advanced Chemistry Development, Inc.).

The pKa value of the component (G1) is preferably 7 or less, and can be appropriately adjusted according to the type or pKa value of counteranion such that the component (G1) becomes a weak base relative to the counteranion. Specifically the pKa value is preferably from −2 to 7, more preferably from −1 to 6.5, and still more preferably from 0 to 6. When the pKa value is no more than the upper limit of the above-mentioned range, the basicity of the cation moiety becomes sufficiently weak, and the component (G1) by itself becomes an acidic compound. In addition, when the pKa values is no less than the lower limit of the above-mentioned range, the cation moiety easily forms a salt with a counteranion, the acidity of the component (G) becomes suitable, and the deterioration of the storage stability caused by excessive acidity of the component (G1) can be suppressed.

As the cation moiety which satisfies the above pKa value, a cation moiety represented by any one of general formulas (G1c-11) to (G1c-13) shown below is particularly preferable.

[Chemical Formula 56]

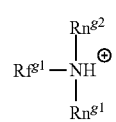
(G1c-11)

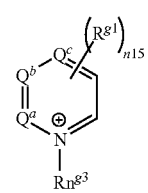
(G1c-12)

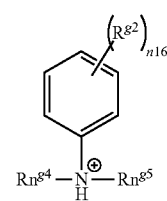
(G1c-13)

In the formula, $Rf^{g1}$ represents a fluorinated alkyl group of 1 to 12 carbon atoms; each of $Rn^{g1}$ and $R^{g2}$ independently represents a hydrogen atom or an alkyl group of 1 to 5 carbon atoms, and $Rn^{g1}$ and $R^{g2}$ may be mutually bonded to form a ring; each of $Q^a$ to $Q^c$ independently represents a carbon atom or a nitrogen atom; $Rn^{g3}$ represents a hydrogen atom or a methyl group; each of $Rn^{g4}$ and $Rn^{g5}$ independently represents an aromatic hydrocarbon group or an alkyl group of 1 to 5 carbon atoms; each of $R^{g1}$ and $R^{g2}$ independently represents a hydrocarbon group; each of n15 and n16 represents an integer of 0 to 4; when n15 and n16 represents an integer of 2 or more, a plurality of $R^{g1}$ and $R^{g2}$ with which the hydrogen atoms on the adjacent carbon atom have been substituted may be mutually bonded to form a ring.

In the formula (G1c-11), $Rf^{g1}$ represents a fluorinated alkyl group of 1 to 12 carbon atoms, and a fluorinated alkyl group in which 50% of the hydrogen atoms within the alkyl group have been fluorinated is preferable.

In the formula (G1c-11), each of $Rn^{g1}$ and $Rn^{g2}$ independently represents a hydrogen atom or an alkyl group of 1 to 5 carbon atoms. As the alkyl group, the same alkyl groups as those described in the description of the formula (G1c-1) and which has 1 to 5 carbon atoms can be mentioned. In addition, when both of $Rn^{g1}$ and $Rn^{g2}$ represent alkyl groups, alkyl groups for $Rn^{g1}$ and $Rn^{g2}$ may be mutually bonded to form a ring together with $NH^+$ in the formula.

In the formula (G1c-13), each of $Rn^{g4}$ and $Rn^{g5}$ independently represents an aromatic hydrocarbon group or an alkyl group of 1 to 5 carbon atoms. As the aromatic hydrocarbon group and alkyl group, the same aryl groups and alkyl groups of 1 to 5 carbon atoms as those described above in relation to $R^{101d}$, $R^{101e}$, $R^{101f}$ and $R^{101g}$ in the formula (G1c-1) can be mentioned, relatively.

In the formulas (G1c-12) to (G1c-13), n15 and n16 represent an integer of 0 to 4, and preferably an integer of 0 to 2, and more preferably 0.

In the formulas (G1c-12) to (G1c-13), each of $R^{g1}$ and $R^{g2}$ independently represents a hydrocarbon group, and an alkyl group of 1 to 12 carbon atoms or an alkenyl group of 1 to 12 carbon atoms is preferable. The alkyl group and alkenyl group are the same groups as those described above in the formula (G1c-1).

When n15 and n16 represent an integer of 2 or more, respectively, the plurality of $R^{g1}$ and $R^{g2}$ may be the same or different from each other. In addition, when n15 and n16 represents an integer of 2 or more, a plurality of $R^{g1}$ and $R^{g2}$ with which the hydrogen atoms on the adjacent carbon atom have been substituted may be mutually bonded to form a ring. As the ring to be formed, a benzene ring and a naphthalene ring can be mentioned. That is, the compounds represented by any one of formulas (G1c-12) and (G1c-13) may be a fused-ring compounds in which two or more rings have been fused.

Specific examples of structural units represented by general formulas (G1c-11) to (G1c-3) are shown below.

[Chemical Formula 57]

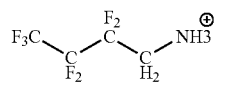 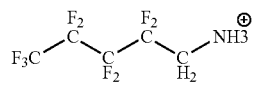

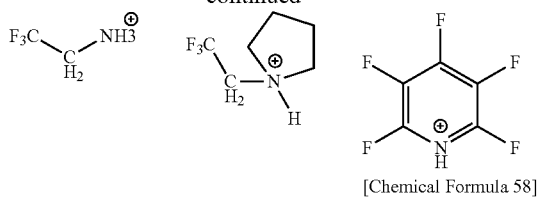

[Chemical Formula 58]

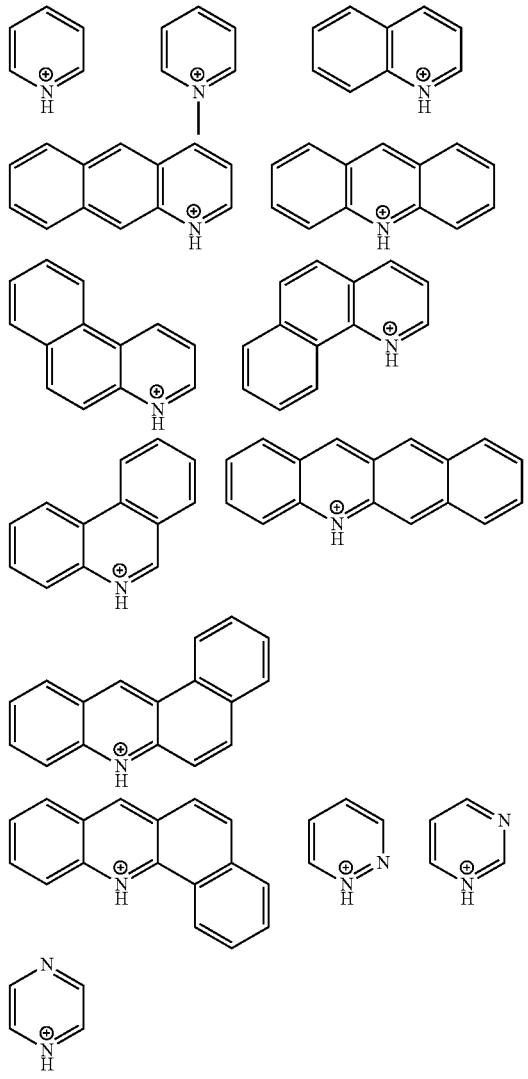

[Chemical Formula 59]

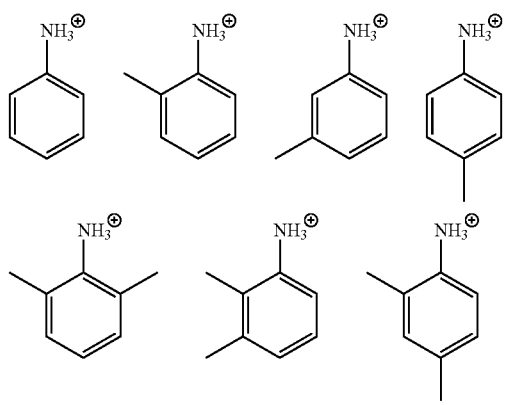

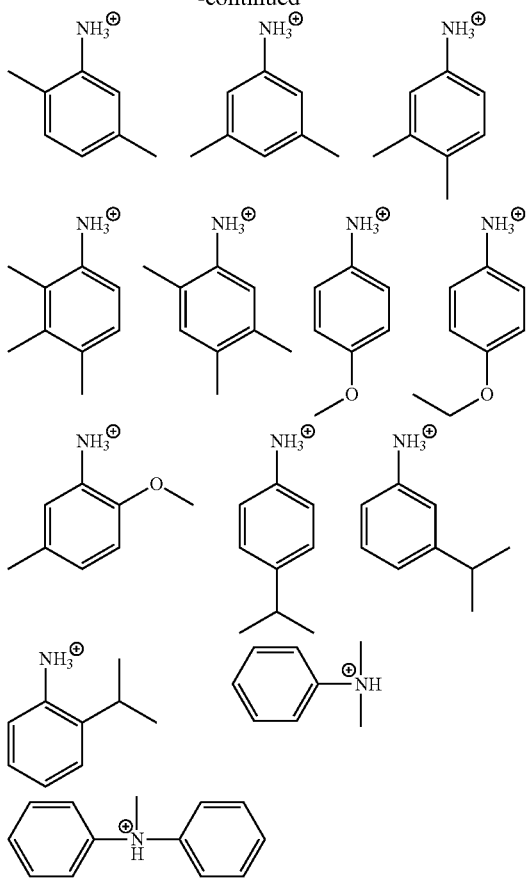

(Anion Moiety of Component (G1)

The anion moiety of the component (G1) is not particularly limited, and anion moieties in a salt generally used in a resist composition may be appropriately selected for use.

Among these, as the anion moiety of the component (G1), those which forms a salt with the aforementioned cation moiety of the component (G1) to form a component (G1) that is capable of increasing the solubility of the component (A) in an alkali developing solution is preferable.

The component (G1) "capable of increasing the solubility of the component (A) in an alkali developing solution" refers to a component, for example, when a component (A1) having a structural unit (a1) is used, by conducting baking in the aforementioned step (3), the acid salt is capable of causing cleavage of at least part of the bond within the structure of the acid decomposable group in the structural unit (a1).

That is, the anion moiety of the component (G1) preferably has a strong acidity. Specifically, the pKa of the anion moiety is more preferably 0 or less, still more preferably −15 to −1, and particularly preferably −13 to −3. When the pKa of the anion moiety is no more than 0, the acidity of the anion can be rendered satisfactorily strong relative to a cation having a pKa of 7 or less, and the component (G1) itself becomes an acidic compound. On the other hand, when the pKa of the anion moiety is −15 or more, deterioration of the storage stability caused by excessive acidity of the component (G1) can be suppressed.

As the anion moiety of the component (G1), an anion moiety having at least one anion group selected from a sulfonate anion, a carboxylate anion, a sulfonylimide anion, a bis(alkylsulfonyl)imide anion and a tris(alkylsulfonyl)methide anion is preferable.

Specific examples include anions represented by general formula: "$R^{4'''}SO_3^-$" ($R^{4'''}$ represents a linear, branched or cyclic alkyl group which may have a substituent, a halogenated alkyl group, an aryl group or an alkenyl group)".

In the general formula "$R^{4'''}SO_3^-$", $R^{4'''}$ represents a linear, branched or cyclic alkyl group, a halogenated alkyl group, an aryl group or an alkenyl group.

The linear or branched alkyl group for $R^{4'''}$ preferably has 1 to 10 carbon atoms, more preferably 1 to 8 carbon atoms, and most preferably 1 to 4 carbon atoms.

The cyclic alkyl group for $R^{4'''}$ preferably has 4 to 15 carbon atoms, more preferably 4 to 10, and most preferably 6 to 10.

When $R^{4'''}$ represents an alkyl group, examples of "$R^{4'''}SO_3^-$" includes alkylsulfonates, such as methanesulfonate, n-propanesulfonate, n-butanesulfonate, n-octanesulfonate, 1-adamantanesulfonate, 2-norbornanesulfonate, d-camphor-10-sulfonate.

The halogenated alkyl group for $R^{4'''}$ is a group in which part of all of the hydrogen atoms in the alkyl group have been substituted with a halogen atom. As the alkyl group, an alkyl group of 1 to 5 carbon atoms is preferred. Among these, a linear or branched alkyl group is preferred, and more preferably a methyl group, an ethyl group, a propyl group, an isopropyl group, an n-butyl group, a tert-butyl group, a tert-pentyl group or an isopentyl group. Examples of the halogen atom with which a hydrogen atom is substituted include a fluorine atom, a chlorine atom, an iodine atom and a bromine atom. With respect to the halogenated alkyl group, 50 to 100% of the hydrogen atoms in the alkyl group (alkyl group before halogenation) are preferably substituted with the halogen atoms, and all of the hydrogen atoms are more preferably substituted with the halogen atoms.

As the halogenated alkyl group, a fluorinated alkyl group is desirable. The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group is preferably from 10 to 100%, more preferably from 50 to 100%, and it is most preferable that all hydrogen atoms are substituted with fluorine atoms because the acid strength is increased.

Specific examples of the fluorinated alkyl group include a trifluoromethyl group, a heptafluoro-n-propyl group and a nonafluoro-n-butyl group.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X^3$-Q'— (in the formula, Q' represents a divalent linking group containing an oxygen atom; and $X^3$ represents a hydrocarbon group of 3 to 30 carbon atoms which may have a substituent).

Examples of halogen atoms and alkyl groups include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula $X^3$-Q'—, Q' represents a divalent linking group containing an oxygen atom.

Q' may contain an atom other than an oxygen atom. Examples of atoms other than oxygen atom include a carbon atom, a hydrogen atom, a sulfur atom and a nitrogen atom.

Examples of divalent linkage groups containing an oxygen atom include non-hydrocarbon, oxygen atom-containing linkage groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and a combination of any of the aforementioned non-hydrocarbon, oxygen atom-containing linkage groups with an alkylene group. To the combination, a sulfonyl group (—$SO_2$—) may further be linked.

Specific examples of the combinations of the aforementioned non-hydrocarbon, oxygen atom-containing linkage groups with alkylene groups include -$R^{91}$—O—, —$R^{92}$—O—C(=O)—, —C(=O)—O—$R^{93}$—O—C(=O)—, —$SO_2$—O—$R^{94}$—O—C(=O)— and —$R^{95}$—$SO_2$—O—$R^{94}$—O—C(=O)—(in the formulas, $R^{91}$ to $R^{95}$ each independently represent an alkylene group.)

The alkylene group for $R^{91}$ to $R^{95}$ is preferably a linear or branched alkylene group, and preferably has 1 to 12 carbon atoms, more preferably 1 to 5, and most preferably 1 to 3.

Specific examples of the alkylene group include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

Q' is preferably a divalent linking group containing an ester linkage or ether linkage, and more preferably a group of —$R^{91}$—O—, —$R^{92}$—O—C(=O)— or —C(=O)—O—$R^{93}$—β—C(=O)—.

In the group represented by the formula $X^3$-Q'—, as the hydrocarbon group for $X^3$, the same hydrocarbon groups of 1 to 30 carbon atoms as those described for $R^a$ in formula (C3).

In particular, $X^3$ is preferably a linear alkyl group which may have a substituent, or a cyclic group which may have a substituent. The cyclic group may be either an aromatic hydrocarbon group which may have a substituent, or an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L6), (S3) and (S4) are preferable.

Among the above, as $R^{4''}$, a halogenated alkyl group or a group having $X^3$-Q'— as a substituent is preferable.

When the $R^{4''}$ group has $X^3$-Q'— as a substituent, as $R^{4''}$, a group represented by the formula: $X^3$-Q'—$Y^3$— (in the formula, Q' and $X^3$ are the same as defined above, and $Y^3$ represents an alkylene group of 1 to 4 carbon atoms which may have a substituent or a fluorinated alkylene group of 1 to 4 carbon atoms which may have a substituent is preferable.

In the group represented by the formula $X^3$-Q'—$Y^3$—, as the alkylene group for $Y^3$, the same alkylene group as those described above for Q' in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^3$ include —$CF_2$—, —$CF_2CF_2$—, —$CF_2CF_2CF_2$—, —CF($CF_3$)$CF_2$—, —CF($CF_2CF_3$)—, —C($CF_3$)$_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2CF_2$—, —C($CF_2CF_3$)$CF_2$—, —CF($CF_2CF_2CF_3$)—, —C($CF_3$)($CF_2CF_3$)—, —CHF—, —$CH_2CF_2$—, —$CH_2CH_2CF_2$—, —$CH_2CF_2CF_2$—, —CH($CF_3$)$CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2$CH($CF_3$)$CH_2$—, —CH($CF_3$)CH($CF_3$)—, —C($CF_3$)$_2CH_2$—, —$CH_2$—, —$CH_2CH_2$—, —$CH_2CH_2CH_2$—, —CH($CH_3$)$CH_2$—, —CH($CH_2CH_3$)—, —C($CH_3$)$_2$—, —$CH_2CH_2CH_2CH_2$—, —CH($CH_3$)$CH_2CH_2$—, —$CH_2$CH($CH_3$)$CH_2$—, —CH($CH_3$)CH($CH_3$)—, —C($CH_3$)$_2CH_2$—, —CH($CH_2CH_3$)$CH_2$—, —CH($CH_2CH_2CH_3$)— and —C($CH_3$)($CH_2CH_3$)—.

As $Y^3$, a fluorinated alkylene group is preferable, and a fluorinated alkylene group in which the carbon atom bonded to the adjacent sulfur atom has been fluorinated is particularly desirable. Examples of such fluorinated alkylene groups include —$CF_2$—, —$CF_2CF_2$—, —$CF_2CF_2CF_2$—, —CF($CF_3$)$CF_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2CF_2$—, —CF($CF_2CF_3$)$CF_2$—, —$CH_2CF_2$—, —$CH_2CH_2CF_2$—, —$CH_2CF_2CF_2$—, —$CH_2CH_2CH_2CF_2$—, —$CH_2CH_2CF_2CF_2$— and —$CH_2CF_2CF_2CF_2$—

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups or atoms other than hydrogen atoms and fluorine atoms. Examples of substituents which the alkylene group or fluorinated alkylene group may have include an alkyl group of 1 to 4 carbon atoms, an alkoxy group of 1 to 4 carbon atoms, and a hydroxyl group.

Specific examples of groups represented by formula $R^{4''}SO_3$— in which $R^{4''}$ represents $X^3$-Q'—Y— include anions represented by the following formulae (b1) to (b9).

[Chemical Formula 60]

(b1)

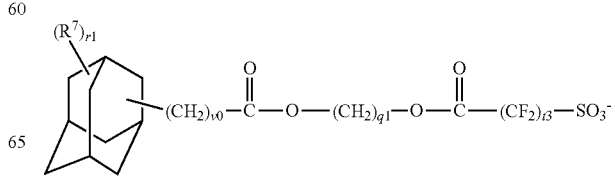

(b2)
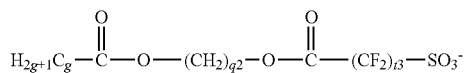

(b3)
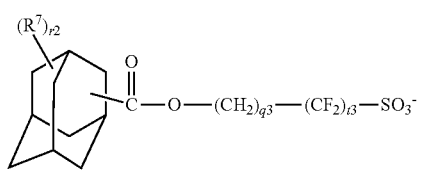

(b4)
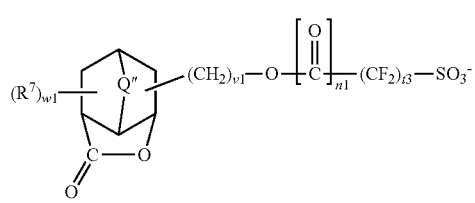

(b5)
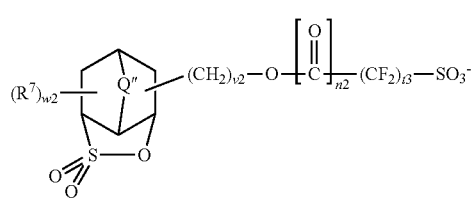

[Chemical Formula 61]

(b6)
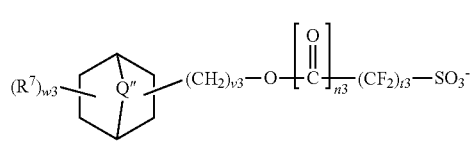

(b7)
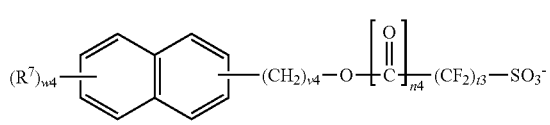

(b8)
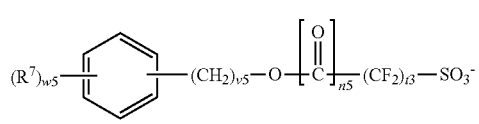

(b9)
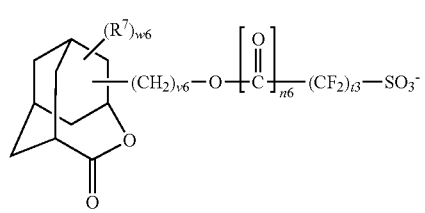

In the formulas, each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n6 independently represents 0 or 1; each of v0 to v6 independently represents an integer of 0 to 3; each of w1 to w6 independently represents an integer of 0 to 3; and Q" is the same as defined above.

As the substituent for $R^7$, the same groups as those which the aforementioned aliphatic hydrocarbon group or aromatic hydrocarbon group for $R^a$ in the aforementioned formula (C3) may have as a substituent can be used.

If there are two or more of the $R^7$ group, as indicated by the values r1, r2, and w1 to w6 then the two or more of the $R^7$ groups may be the same or different from each other.

Further, as preferable examples of the anion moiety of the component (G1), an anion represented by general formula (G1a-3) shown below and an anion moiety represented by general formula (G1a-4) shown below can also be mentioned.

[Chemical Formula 62]

(G1a-3)
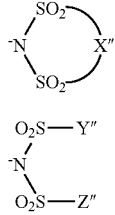

(G1a-4)

In the formulas, X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

In the formula (G1a-3), X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In the formula (G1a-4), each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller number of carbon atoms of the alkylene group for X" or those of the alkyl group for Y" and Z" is more preferable, within the above-mentioned range of the number of carbon atoms, in terms of improving the solubility in a resist solvent.

Further, in the alkylene group for X" or the alkyl group for Y" and Z", the larger number of hydrogen atoms substituted with fluorine atoms is more preferable, because the acid strength increases and the transparency to high energy radiation of 200 nm or less or electron beam is improved.

The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As the anion moiety of the component (G1), an anion represented by the aforementioned formula "$R^{4"}SO_3^-$" (in particular, any one of anions represented by the aforementioned formulae (b1) to (b9) which is a group in which $R^{4"}$ is "$X^3$-Q'—$Y^3$—") or an anion represented by the aforementioned formula (G1a-3) is most preferable.

As the component (G1), one type of acid generator may be used alone, or two or more types may be used in combination.

In the resist composition according to the present invention, the amount of the component (G1) within the component (G) is preferably 40% by weight or more, still more preferably 70% by weight or more, and may be even 100% by weight. When the amount of the component (G1) is at least as large as the lower limit of the above-mentioned range, the storage stability and the lithography properties become excellent.

In the resist composition, the amount of the component (G1), relative to 100 parts by weight of the component (A) is preferably from 0.5 to 30 parts by weight, more preferably from 1 to 20 parts by weight, and most preferably from 2 to 15 parts by weight. When the amount of the component (G1) is within the above-mentioned range, the lithography properties become excellent.

[Component (G2)]

The component (G2) does not fall under the definition of the component (G1), and exhibits acidity by itself, and acts as a proton donor. As the component (G2), an ionic acid which does not form a salt can be mentioned.

The component (G2) is not particularly limited, as long as it has an acid strength capable of increasing the solubility of the base component (A) in the alkali developing solution. As the component (G2), in terms of the reactivity with the acid dissociable group of the base component and ease in increasing the solubility of the resist film in an alkali developing solution, an imine acid or a sulfonic acid compound is preferable, and sulfonylimide, bis(alkylsulfonyl)imide, tris(alkylsulfonyl)methide and compounds having a fluorine atom within these compounds can be mentioned.

In particular, a compound represented by any one of general formulae (G2-1) to (G2-3) shown below (preferably a compound represented by general formula (G2-2)), a compound in which an anion represented by any one of general formulae (b1) to (b9) described later has "—SO$_3$⁻" replaced by "—SO$_3$H", a compound in which an anion represented by general formula (G1a-3) or (G1a-4) described later has "N" replaced by "NH", and camphorsulfonic acid are preferable. Other examples include acid components such as a fluorinated alkyl group-containing carboxylic acid, a higher fatty acid, a higher alkylsulfonic acid, and a higher alkylarylsulfonic acid.

[Chemical Formula 63]

(G2-1)

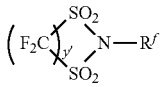

(G2-2)

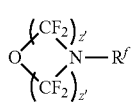

(G2-3)

In the formula (G2-1), w' represents an integer of 1 to 5. In the formula (G2-2), R$^f$ represents a hydrogen atom or an alkyl group (provided that part or all of the hydrogen atoms within the alkyl group may be substituted with a fluorine atom, a hydroxy group, an alkoxy group, a carboxy group or an amino group); and y' represents 2 or 3. In the formula (G2-3), R$^f$ is the same as defined above; and z' represents 2 or 3.

Examples of the compounds represented by the formula (G2-1) include $(C_4F_9SO_2)_2NH$ and $(C_3F_7SO_2)_2NH$.

In the formula (G2-2), the alkyl group for R$^f$ preferably has 1 or 2 carbon atoms, and more preferably 1.

Examples of the alkoxy group with which the hydrogen atom(s) within the alkyl group may be substituted include a methoxy group and an ethoxy group.

An example of a compound represented by the aforementioned formula (G2-2) includes a compound represented by a chemical formula (G2-21) shown below.

[Chemical Formula 64]

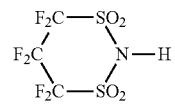

(G2-21)

In the formula (G2-3), R$^f$ is the same as defined for R$^f$ in the formula (G2-2).

An example of a compound represented by the aforementioned formula (G2-3) includes a compound represented by a chemical formula (G2-31) shown below.

[Chemical Formula 65]

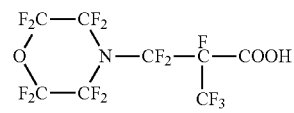

(G2-31)

As the fluorinated alkyl group-containing carboxylic group, for example, $C_{10}F_{21}COOH$ can be mentioned.

Examples of the higher fatty acid include higher fatty acids having an alkyl group of 8 to 20 carbon atoms, and specific examples thereof include dodecanoic acid, tetradecanoic acid, and stearic acid.

The alkyl group of 8 to 20 carbon atoms may be either linear or branched. Further, the alkyl group of 8 to 20 carbon atoms may have a phenylene group, an oxygen atom or the like interposed within the chain thereof. Furthermore, the alkyl group of 8 to 20 carbon atoms may have part of the hydrogen atoms substituted with a hydroxy group or a carboxy group.

Examples of the higher alkylsulfonic acid include sulfonic acids having an alkyl group preferably with an average of 9 to 21 carbon atoms, more preferably 12 to 18 carbon atoms, and specific examples thereof include decanesulfonic acid, dodecanesulfonic acid, tetradecanesulfonic acid, tetradecanesulfonic acid, pentadecanesulfonic acid and octadecanesulfonic acid.

Examples of the higher alkylarylsulfonic acid include alkylbenzenesulfonic acids and alkylnaphthalenesulfonic acids having an alkyl group preferably with an average of 6 to 18 carbon atoms, more preferably 9 to 15 carbon atoms, and specific examples thereof include dodecylbenzenesulfonic acid and decylnaphthalenesulfonic acid.

Examples of the acid components include alkyldiphenyletherdisulfonic acids preferably with an average of 6 to 18 carbon atoms, more preferably 9 to 15, and preferable examples thereof include dodecyldiphenyletherdisulfonic acid.

Examples of the component (G2) other than those described above include organic carboxylic acid, a phosphorus oxo acid or derivative thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorous oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

When the component (G) includes the component (G2), as the component (G2), one type may be used, or two or more types may be used in combination. Among these, as the component (G2), one or more compounds selected from the group consisting of sulfonylimide, bis(alkylsulfonyl)imide, tris(alkylsulfonyl)methide and compounds having a fluorine atom within these compounds is preferably used, and one or more compounds having a fluorine atom within these compounds is particularly preferably used.

In addition, when the resist composition includes the component (G2), the amount of the component (G2) in the resist composition, relative to 100 parts by weight of the component (A) is preferably from 0.5 to 20 parts by weight, more preferably from 1 to 15 parts by weight, and still more preferably from 1 to 10 parts by weight. When the amount of the component (G2) is at least as large as the lower limit of the above-mentioned range, the solubility of the resist film in an alkali developing solution is likely to be increased. On the other hand, when the amount of the component (G2) is no more than the upper limit of the above-mentioned range, an excellent sensitivity can be obtained.

Acid-Generator Component; Component (B)

In the present invention, as the acid supply component (Z), an acid generator component which is decomposed by heat or light and acts as an acid (hereafter, referred to as "component (B)") can be used.

The component (B) is different from the compound (G), and generates an acid by exposure in the step (2) or by baking (PEB) in the step (3). The component (B) itself is not necessary to exhibit acidity.

As the component (B), there is no particular limitation, and any of the known acid generators for use in conventional chemically amplified resist compositions can be used.

As the acid generators, a thermal-acid generator which generates an acid by heating, and a photo-acid generator which generates an acid upon exposure can be mentioned.

Examples of these acid generators are numerous, and include onium salt acid generators such as iodonium salts and sulfonium salts; oximesulfonate acid generators; diazomethane-based acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

These acid generator components are known as photo-acid generators (PAG), but also have a function as thermal-acid generators (TAG). Therefore, as the acid generator component capable of using in the present invention, any acid generators can be appropriately selected from those which have been conventionally known as acid generators for use in a chemically amplified resist.

The "thermal-acid generator component which generates acid by heating" is a component which generates an acid by heating at a temperature preferably lower than a PEB temperature in the step (3), specifically, at a temperature of 200° C. or lower, preferably at a temperature of 100° C. or lower, more preferably at a temperature of 50 to 150° C. By virtue of using the thermal-acid generator which generates an acid at a heating temperature equal to or lower than PEB temperature, the operation becomes easy. Moreover, it becomes easy to control the generation of acid from the thermal-acid generator and the deprotection reaction of the base component at different temperatures, respectively. By virtue of using a thermal-acid generator which preferably generates acid at 50° C. or higher, and more preferably at 50 to 100° C., the stability thereof in the resist composition becomes excellent.

In the onium salt acid generators, as the component (B), an anion moiety preferably has at least one anion group selected from a group consisting of a sulfonate anion, a carboxylate anion, a sulfonylimide anion, a bis(alkylsulfonyl)imide anion and a tris(alkylsulfonyl)methide anion is preferable. Further, specific examples of the anion moiety include the same anion moiety as described above for the aforementioned component (G1).

In addition, as the cation moiety, the cation moiety represented by general formula (b-c1) or general formula (b-c2) shown below can be mentioned.

[Chemical Formula 66]

In formula, $R^{1\prime\prime}$ to $R^{3\prime\prime}$ and $R^{5\prime\prime}$ to $R^{6\prime\prime}$ each independently represents an aryl group which may have a substituent, an alkyl group which may have a substituent, or an alkenyl group which may have a substituent. In formula (b-c1), two of $R^{1\prime\prime}$ to $R^{3\prime\prime}$ may be bonded to each other to form a ring with the sulfur atom.

In formula (b-c1), $R^{1\prime\prime}$ to $R^{3\prime\prime}$ each independently represents an aryl group which may have a substituent, an alkyl group which may have a substituent or an alkenyl group which may have a substituent. Two of $R^{1\prime\prime}$ to $R^{3\prime\prime}$ may be mutually bonded to form a ring with the sulfur atom.

Examples of the aryl group for $R^{1\prime\prime}$ to $R^{3\prime\prime}$ include an unsubstituted aryl group of 6 to 20 carbon atoms; a substituted aryl group in which part or all of the hydrogen atoms of the aforementioned unsubstituted aryl group has been substituted with an alkyl group, an alkoxy group, a halogen atom, a hydroxy group, an oxo group (=O), an aryl group, an alkoxyalkyloxy group, an alkoxycarbonylalkyloxy group, —C(=O)—O—$R^{6\prime}$, —O—C(=O)—$R^{7\prime}$ or —O—$R^{8\prime}$. Each of $R^{6\prime}$, $R^{7\prime}$ and $R^{8\prime}$ independently represents a linear or branched saturated hydrocarbon group of 1 to 25 carbon atoms, a cyclic saturated hydrocarbon group of 3 to 20 carbon atoms or a linear or branched, aliphatic unsaturated hydrocarbon group of 2 to 5 carbon atoms.

The unsubstituted aryl group for $R^{1\prime\prime}$ to $R^{3\prime\prime}$ is preferably an aryl group having 6 to 10 carbon atoms because it can be synthesized at a low cost. Specific examples thereof include a phenyl group and a naphthyl group.

The alkyl group as the substituent for the substituted aryl group represented by $R^{1\prime\prime\prime}$ to $R^{3\prime\prime\prime}$ is preferably an alkyl group having 1 to 5 carbon atoms, and a methyl group, an ethyl group, a propyl group, an n-butyl group, or a tert-butyl group is most desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is most desirable.

The halogen atom as the substituent for the substituted aryl group is preferably a fluorine atom.

As the aryl group as a substituent in the substituted aryl group, the same aryl groups as those described above for $R^{1\prime\prime\prime}$ to $R^{3\prime\prime\prime}$ can be used.

Examples of alkoxyalkyloxy groups as the substituent for the substituted aryl group include groups represented by general formula shown below:

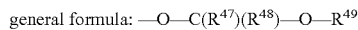

general formula: —O—C($R^{47}$)($R^{48}$)—O—$R^{49}$

[In the formula, $R^{47}$ and $R^{48}$ each independently represent a hydrogen atom or a linear or branched alkyl group; and $R^{49}$ represents an alkyl group.]

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

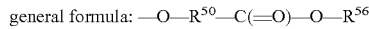

general formula: —O—$R^{50}$—C(=O)—O—$R^{56}$

In the formula, $R^{50}$ represents a linear or branched alkylene group, and $R^{56}$ represents a tertiary alkyl group.

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

The alkyl group for $R^{56}$ is a tertiary alkyl group, and examples thereof include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula: —O—$R^{50}$—C(=O)—O—$R^{56}$ has been substituted with $R^{56\prime}$ can also be mentioned. $R^{56\prime}$ represents a hydrogen atom, an alkyl group, a fluorinated alkyl group or an aliphatic cyclic group which may contain a hetero atom.

The alkyl group for $R^{56\prime}$ is the same as defined for the alkyl group for the aforementioned $R^{49}$.

Examples of the fluorinated alkyl group for $R^{56\prime}$ include groups in which part or all of the hydrogen atoms within the alkyl group for $R^{49}$ has been substituted with a fluorine atom.

Examples of the aliphatic cyclic group for $R^{56\prime}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for $R^{56\prime}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56\prime}$ containing a hetero atom in the ring structure include groups represented by formulas (L1) to (L6) and (S1) to (S4) described above.

As the aliphatic cyclic group for $R^{56\prime}$ in which a hydrogen atom has been substituted with a hetero atom, an aliphatic cyclic group in which a hydrogen atom has been substituted with an oxygen atom (=O) can be mentioned.

In the groups —C(=O)—O—$R^{6\prime}$, —O—C(=O)—$R^{7\prime}$, —O—$R^{8\prime}$, each of $R^{6\prime}$, $R^{7\prime}$ and $R^{8\prime}$ independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The linear or branched, saturated hydrocarbon group preferably has 1 to 25 carbon atoms, more preferably 1 to 15, and still more preferably 4 to 10.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched, saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group, but excluding tertiary alkyl groups.

The linear or branched, saturated hydrocarbon group may have a substituent. Examples of the substituent include an alkoxy group, a halogen atom, a halogenated alkyl group, a hydroxyl group, an oxygen atom (═O), a cyano group and a carboxy group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated alkyl group include a fluorine atom, a chlorine atom, a bromine atom and an iodine atom, and a fluorine atom is preferable.

Example of the halogenated alkyl group as the substituent for the linear or branched, saturated hydrocarbon group includes a group in which part or all of the hydrogen atoms within the aforementioned linear or branched, saturated hydrocarbon group have been substituted with the aforementioned halogen atoms.

The cyclic saturated hydrocarbon group of 3 to 20 carbon atoms for $R^{6'}$, $R^{7'}$ and $R^{8'}$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one hydrogen atom has been removed therefrom, can be used. Further, the ring may contain an ester bond (—C(═O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched alkyl group, or a lower alkyl group can be used.

Alternatively, $R^{6'}$, $R^{7'}$ and $R^{8'}$ may be a combination of a linear or branched alkyl group and a cyclic group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6'}$, $R^{7'}$ and $R^{8'}$ include a vinyl group, a propenyl group (an allyl group) and a butynyl group.

Examples of the branched aliphatic unsaturated hydrocarbon group for $R^{6'}$, $R^{7}$, and $R^{8'}$ include a 1-methylpropenyl group and a 2-methylpropenyl group.

The aforementioned linear or branched, aliphatic unsaturated hydrocarbon group may have a substituent. Examples of substituents include the same substituents as those which the aforementioned linear or branched alkyl group may have.

Among the aforementioned examples, as $R^{7'}$ and $R^{8'}$, in terms of improvement in lithography properties and shape of the resist pattern, a linear or branched, saturated hydrocarbon group of 1 to 15 carbon atoms or a cyclic saturated hydrocarbon group of 3 to 20 carbon atoms is preferable.

Examples of the alkyl group for $R^{1'''}$ to $R^{3'''}$ include linear, branched or cyclic alkyl groups of 1 to 10 carbon atoms. Among these, alkyl groups of 1 to 5 carbon atoms are preferable as the resolution becomes excellent. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkenyl group for $R^{1'''}$ to $R^{3'''}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

When two of $R^{1'''}$ to $R^{3'''}$ are bonded to each other to form a ring with the sulfur atom, it is preferable that the two of $R^{1'''}$ to $R^{3'''}$ form a 3 to 10-membered ring including the sulfur atom, and it is particularly desirable that the two of $R^{1'''}$ to $R^{3'''}$ form a 5 to 7-membered ring including the sulfur atom.

Specific examples of the cation moiety within the compound represented by the formula (b-c1) are shown below.

[Chemical Formula 67]

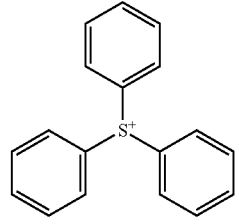

(b-1-1)

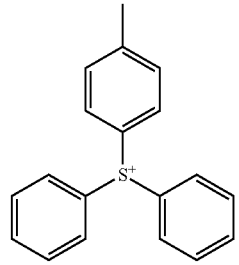

(b-1-2)

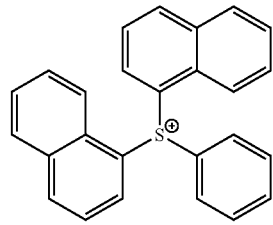

(b-1-3)

[Chemical Formula 68]
(b-1-4)
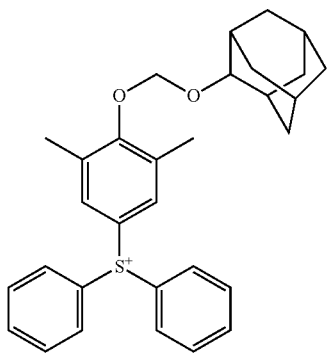
(b-1-5)
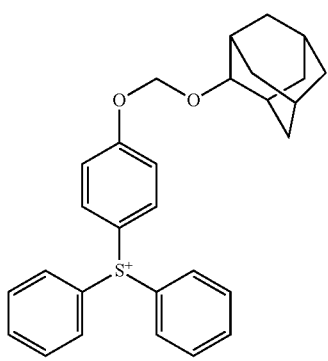
(b-1-6)
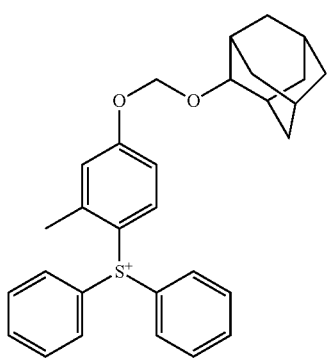
[Chemical Formula 69]
(b-1-7)
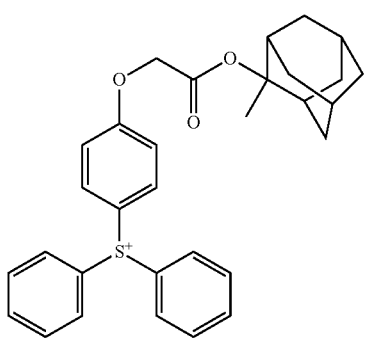
(b-1-8)
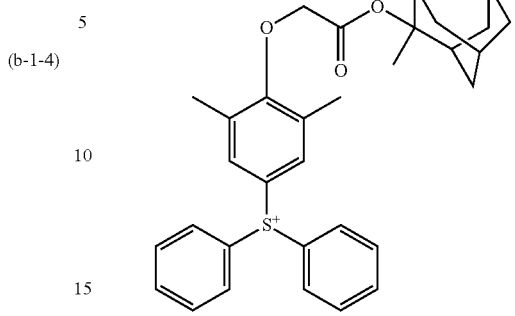
(b-1-9)
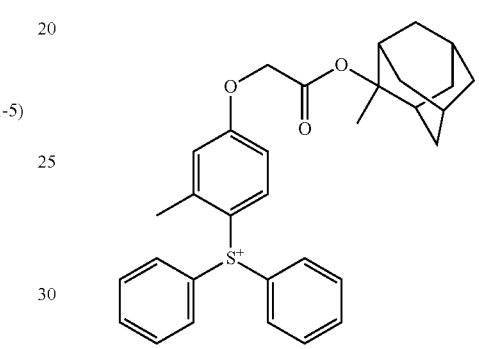
[Chemical Formula 70]
(b-1-10)
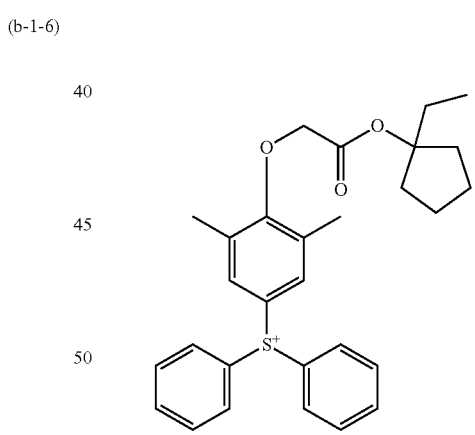
(b-1-11)
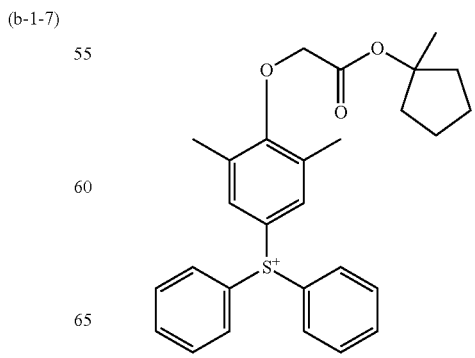

(b-1-12)
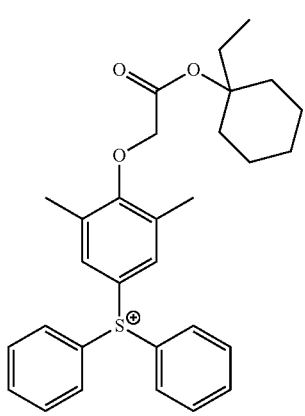
(b-1-13)
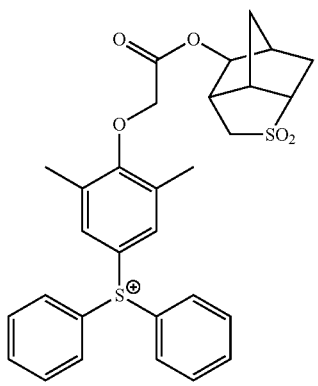
[Chemical Formula 71]
(b-1-14)
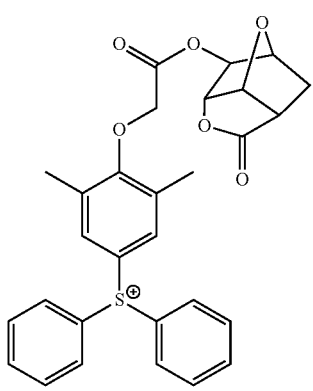
(b-1-15)
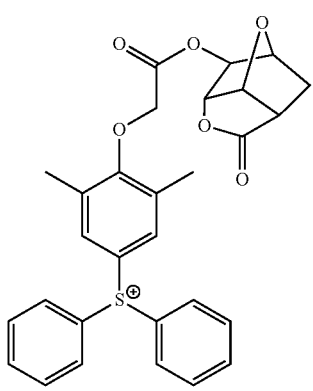
(b-1-16)
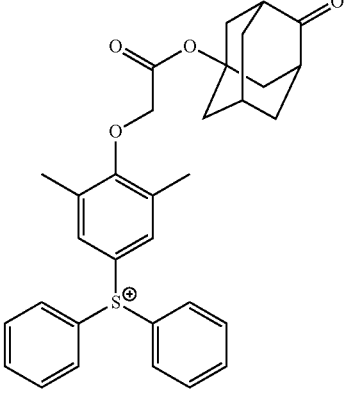
[Chemical Formula 72]
(b-1-17)
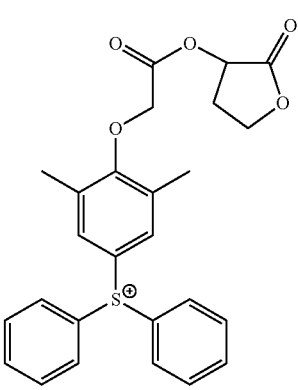
(b-1-18)
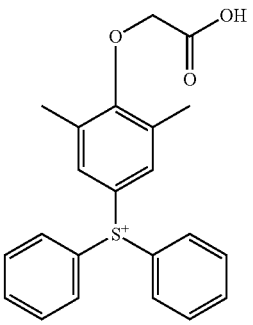
(b-1-19)
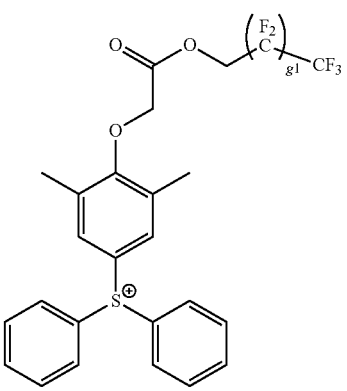
In the formula, g1 represents a recurring number, and is an integer of 1 to 5.

[Chemical Formula 73]
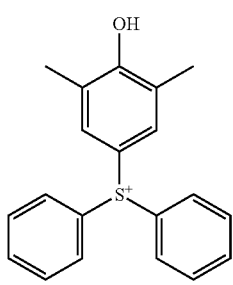
(b-1-20)
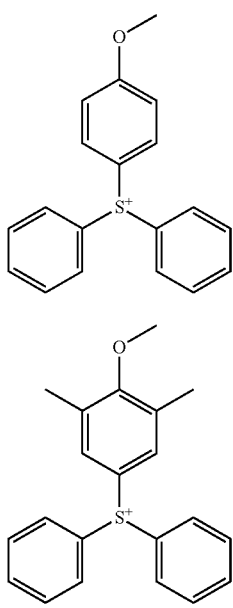
(b-1-21)
(b-1-22)
[Chemical Formula 74]
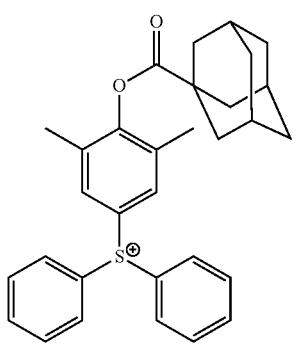
(b-1-23)
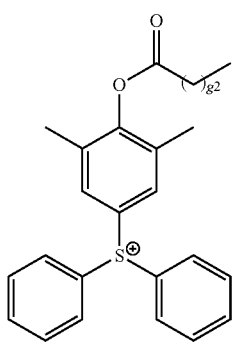
(b-1-24)
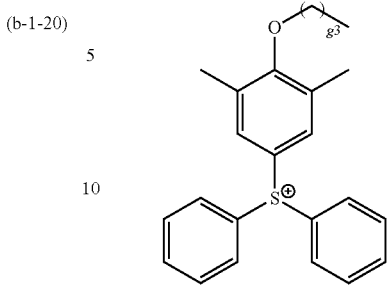
(b-1-25)
In the formula, g2 and g3 represent recurring numbers, wherein g2 is an integer of 0 to 20, and g3 is an integer of 0 to 20.
[Chemical Formula 75]
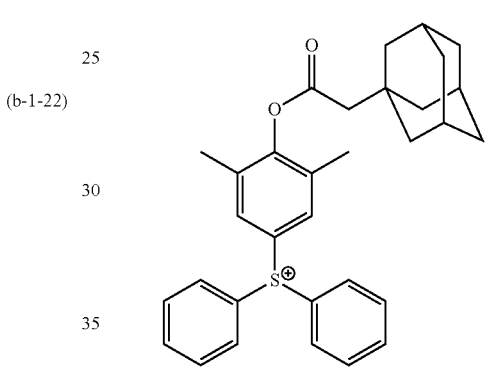
(b-1-26)
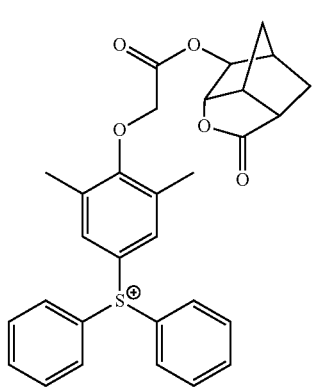
(b-1-27)
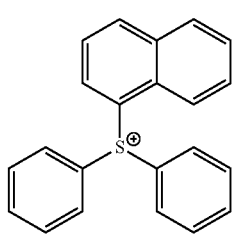
(b-1-28)

[Chemical Formula 76]
(b-1-29)
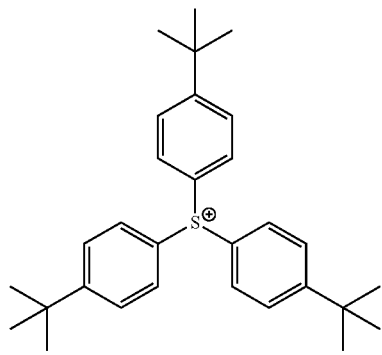
(b-1-30)
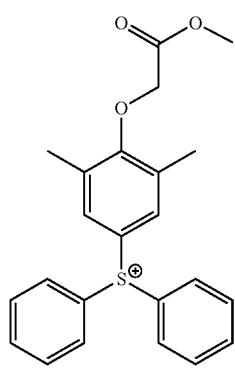
(b-1-31)
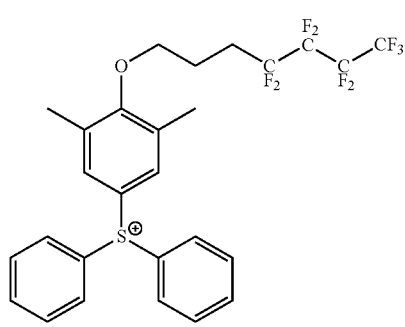
[Chemical Formula 77]
(b-1-32)
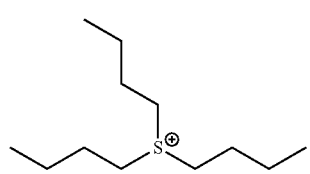
(b-1-33)
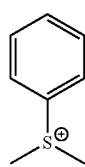
[Chemical Formula 78]
(b-1-34)
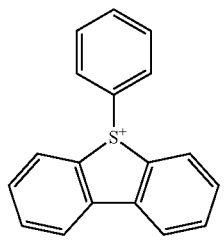
(b-1-35)
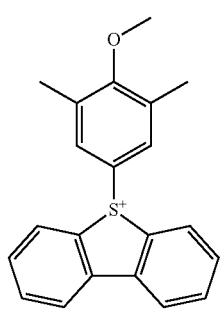
(b-1-36)
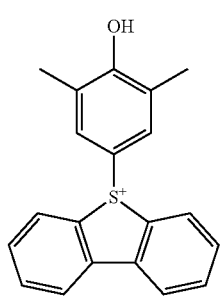
(b-1-37)
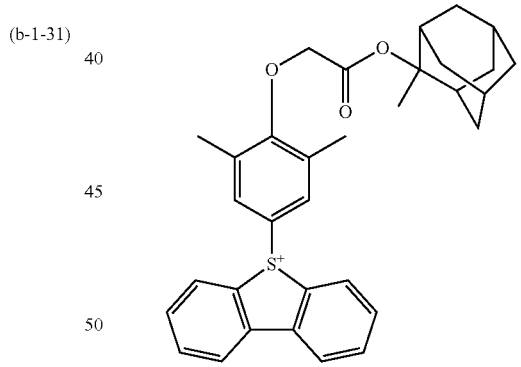
(b-1-38)
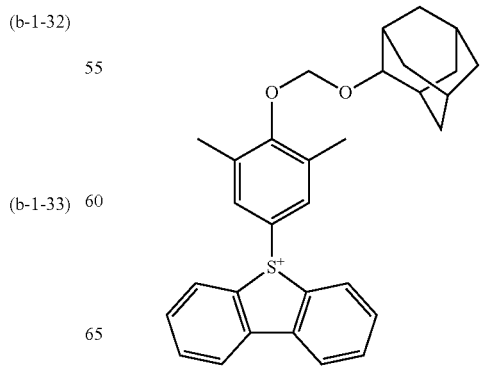

(b-1-39)
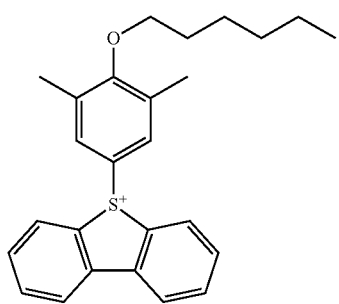
(b-1-40)
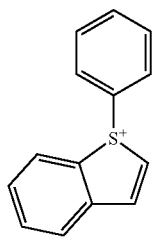
(b-1-41)
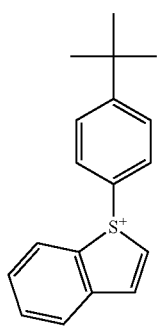
[Chemical Formula 79]
(b-1-42)
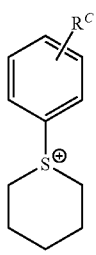
(b-1-43)
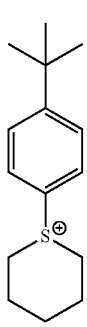
(b-1-44)
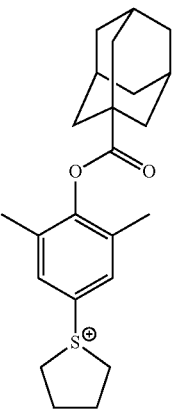
(b-1-45)
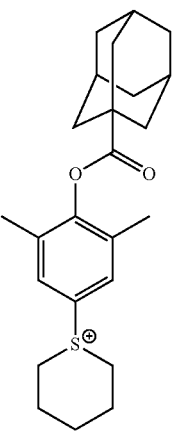
(b-1-46)
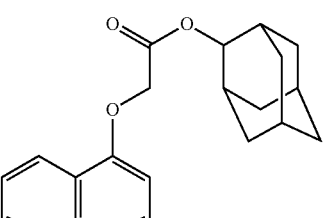
(b-1-47)
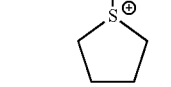
(b-1-48)
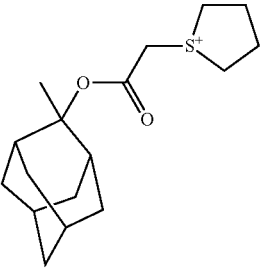

In formula (b-1-42), $R^C$ represents a substituent. Examples of the substituent include the same substituents as those described above in relation to the substituted aryl group (i.e., an alkyl group, an alkoxy group, an alkoxyalkyloxy group, an alkoxycarbonylalkyloxy group, a halogen atom, a hydroxy group, an oxo group (=O), an aryl group, —C(=O)—O—$R^{6'''}$, —O—C(=O)—$R^{7''}$ and —O—$R^{8''}$).

In formula (b-c2), $R^{5'''}$ and $R^{6'''}$ each independently represents an aryl group which may have a substituent, an alkyl group which may have a substituent or an alkenyl group which may have a substituent.

As the aryl group for $R^{5'''}$ and $R^{6'''}$, the same aryl groups as those described above for $R^{1''}$ to $R^{3''}$ can be used.

As the alkyl group for $R^{5'''}$ and $R^{6'''}$, the same alkyl groups as those described above for R" to $R^{3''}$ can be used.

As the alkenyl group for $R^{5'''}$ and $R^{6'''}$, the same as the alkenyl groups for $R^{1''}$ to $R^{3''}$ can be used.

Specific examples of the cation moiety of the compound represented by general formula (b-c2) include diphenyliodonium and bis(4-tert-butylphenyl)iodonium.

In the present description, an oximesulfonate acid generator is a compound having at least one group represented by general formula (B-1) shown below, and has a feature of generating acid by irradiation (exposure). Such oxime-sulfonate acid generators are widely used for a chemically amplified resist composition, and can be appropriately selected for use.

[Chemical Formula 80]

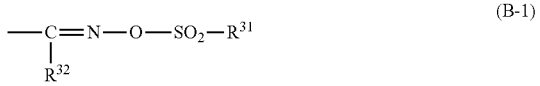

(B-1)

In the formula (B-1), $R^{31}$ and $R^{32}$ each independently represent an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "having a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. As the alkyl group or aryl group for $R^{32}$, the same alkyl groups or aryl groups as those described above for $R^{31}$ can be used.

As $R^{32}$, a cyano group, an alkyl group of 1 to 8 carbon atoms having no substituent or a fluorinated alkyl group of 1 to 8 carbon atoms is particularly desirable.

Preferable examples of the oxime sulfonate-based acid generator include compounds represented by general formula (B-2) or (B-3) shown below.

[Chemical Formula 81]

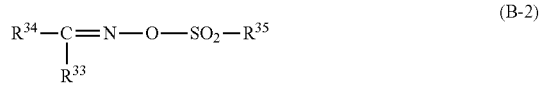

(B-2)

In the formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 82]

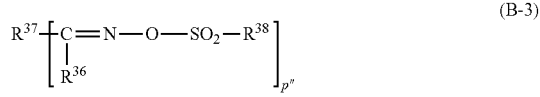

(B-3)

In the formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oximesulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

[Chemical Formula 83]

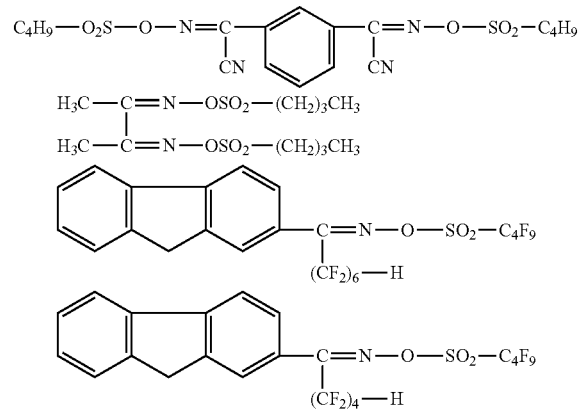

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be mentioned.

As the component (B), one type of these acid generators may be used alone, or two or more types may be used in combination.

In the case where the resist composition of the present invention contains the component (B), when the component (B) is a thermal-acid generator, the amount of the component (B) relative to 100 parts by weight of the component (A) is preferably 0.5 to 30 parts by weight, and more preferably 1 to 20 parts by weight. When the component (B) is an photo-acid generator, the amount of the component (B) relative to 100 parts by weight of the component (A) is preferably 0.5 to 30 parts by weight, and more preferably 1 to 20 parts by weight. When the amount of the component (B) is within the above-mentioned range, formation of a resist pattern can be satisfactorily performed. In addition, when the amount of the component (B) is at least as large as the lower limit of the above-mentioned range, solubility of the resist film in the developing solution is likely to increase and resolution is increased. On the other hand, when the amount is no more than the upper limit of the above-mentioned range, sensitivity becomes excellent. In addition, in the case of the photo-acid generator, when the amount is no more than the upper limit of the above-mentioned range, the transparency of the resist film becomes excellent.

In the case where the resist composition of the present invention contains the component (B), the amount of the component (B) relative to the combined total amount of the component (G) and component (B) is preferably 50% by weight or less, and more preferably 20% by weight or more.

<Other Components>

To the resist composition used for the method of forming a resist pattern according to the present invention, a component other than the aforementioned components, such as an acid amplifier component, a fluorine additive, an amine and the like may be added.

Acid Amplifier Component; Component (H)

In the method of forming a resist pattern according to the present invention, the component (H) is decomposed under action of an acid and generates free acids, the component (H) is further decomposed under the action of the free acids and further generates free acids. In this manner, a chained-decomposition of the component (H) is progressed under action of an acid, and a large number of free acid molecules is generated.

The component (H) is not particularly limited, as long as it is decomposable by the action of acid, and is capable of further generating acid to self-catalytically amplify acid. Preferable examples of the component (H) include compounds having a bridged-carbon ring skeleton structure (hereafter, referred to simply as "bridged-carbon ring").

Here, the term "compound having a bridged-carbon ring skeleton structure" refers to a compound which has a structure of a bridging bond formed by a plurality of carbon rings in a molecule thereof.

By virtue of bridged bonds, the molecule of the compound having a bridged-carbon ring skeleton structure becomes rigid, and the thermal stability of the compound can be improved.

The number of carbon rings is preferably 2 to 6, and more preferably 2 or 3.

The bridged-carbon ring may have part or all of the hydrogen atoms substituted with an alkyl group or an alkoxy group. The alkyl group preferably has 1 to 6 carbon atoms, more preferably 1 to 3 carbon atoms, and specific examples thereof include a methyl group, an ethyl group and a propyl group. The alkoxy group preferably has 1 to 6 carbon atoms, more preferably 1 to 3 carbon atoms, and specific examples thereof include a methoxy group and an ethoxy group. In addition, the bridged-carbon ring may have a unsaturated bond such as a double bond.

In the present invention, the bridged-carbon ring preferably has a hydroxy group on the ring structure and a sulfonate group represented by general formula (Hs) shown below on a carbon atom adjacent to a carbon atom bonded to the hydroxy group.

[Chemical Formula 84]

(Hs)

In the formula $R^O$ represents an aliphatic group, an aromatic group or a heterocyclic group.

In the formula (Hs), $R^O$ represents an aliphatic group, an aromatic group or a heterocyclic group.

In the $R^O$, examples of the aliphatic group include a linear or cyclic alkyl group or a linear or cyclicalkenyl group, and the number of carbon atoms thereof is preferably 1 to 12, and more preferably 1 to 10.

The aromatic group may be either a monocyclic aromatic group or a polycyclic aromatic group, and specific examples thereof include an aryl group.

The heterocyclic group may be either a monocyclic group or a polycyclic group, and groups derived from conventionally known various heterocyclic compounds can be mentioned.

The aliphatic group, aromatic group and heterocyclic group may have a substituent. Examples of the substituent include a halogen atom, an alkyl group, an alkoxy group, an amino group, a substituted amino group and an oxygen atom (═O).

Specific examples of the aliphatic group and aromatic group include a methyl group, an ethyl group, a propyl group, a butyl group, an acyl group, a hexyl group, a vinyl group, a propylene group, an allyl group, a cyclohexyl group, a cyclooctyl group, a bycyclo hydrocarbon group, a tricyclo hydrocarbon group, a phenyl group, a tolyl group, a benzyl group, a phenethyl group, a naphthyl group, a naphthylmethyl group or substituted compound thereof.

Examples of the heterocyclic group include five-membered ring compound containing one hetero atom such as furan, thiophene, pyrrole, benzofuran, thionaphthene, indole and carbazole or fused-ring compounds thereof; five-membered ring compounds containing two hetero atoms such as oxazole, thiazole and pyrazole or fused-ring compounds thereof; six-membered ring compounds containing one hetero atom such as pyran, pyrone, coumarin, pyridine, quinoline, isoquinoline and acridine or fused-ring compounds thereof; and six-membered ring compounds containing two hetero atoms such as pyridazine, pyrimidine, pyrazine and phthalazine or fused-ring compounds thereof.

In the present invention, in the case where the component (H) has a hydroxy group and a sulfonate group represented by the general formula (Hs) on the bridged carbon ring, the component (H) is decomposed under action of an acid thereby instantly generating acid ($R^OSO_3H$).

In this manner, one acid increases in one reaction, and the reaction is accelerated as the reaction proceeds, thereby serially decomposing the component (H).

The strength of the generated acid is preferably an acid dissociation constant (pKa) of 3 or less, and more preferably 2 or less. When pKa is 3 or less, the generated acid is likely to induce a self-decomposition. On the other hand, when the acid is weaker than the acid having a pKa of 3 or less, a self-decomposition is less likely to occur.

Examples of free acids ($R^OSO_3H$) generated by the aforementioned reaction include methanesulfonic acid, ethanesulfonic acid, propanesulfonic acid, butanesulfonic acid, pentanesulfonic acid, hexanesulfonic acid, heptanesulfonic acid, octanesulfonic acid, cyclohexanesulfonic acid, camphorsulfonic acid, trifluoromethanesulfonic acid, 2,2,2-trifluoromethanesulfonic acid, benzenesulfonic acid, p-toluenesulfonic acid, p-bromobenzenesulfonic acid, p-nitrobenzenesulfonic acid, 2-thiophenesulfonic acid, 1-naphthalenesulfonic acid, 2-naphthalenesulfonic acid, and the like.

Specific examples of the component (H) include compounds represented by general formulas (H1) to (H4) shown below (hereafter, these compounds corresponding to the general formulas referred to as compounds (H1) to (H4), respectively).

[Chemical Formula 85]

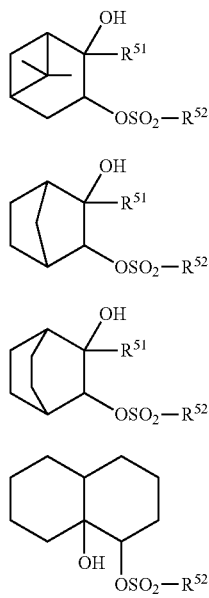

In the formula, $R^{51}$ represents a hydrogen atom, an aliphatic group or an aromatic group; and $R^{52}$ represents an aliphatic group, an aromatic group or a heterocyclic group.

In the general formulas (H1) to (H3), $R^{51}$ represents a hydrogen atom, an aliphatic group or an aromatic group. In the $R^{51}$, the aliphatic group and aromatic group is the same groups as those described above for the aliphatic group and aromatic group for the aforementioned $R^0$. As $R^{51}$, an aliphatic group or an aromatic group is preferable, an aliphatic group is more preferable, a lower alkyl group is particularly preferable, and a methyl group is most preferable.

In the general formulas (H1) to (H4), $R^{52}$ represents an aliphatic group, an aromatic group or a heterocyclic group which is the same as those described above for $R^0$. As $R^{52}$, an aliphatic group or an aromatic group is preferable, and an aliphatic group is more preferable.

In the compounds (H1) to (H4), the compound (H1) has a cross-linking bond on 1st and 3rd positions of the bicyclo compound, the compounds (H2) and (H3) has a cross-linking bond on 1st and 4th positions of the bicyclo compound, and the compound (H4) has a cross-linking bond on 1st and 6th positions of the bicyclo compound (decalin).

Therefore, in the compounds (H1) to (H4), the conformational changes of the cyclohexane ring is highly suppressed, and the ring structure exhibits rigidity.

As the component (H), for example, a compound in which the bridged-carbon ring has a hydroxy group and a sulfonate group represented by general formula (Hs) bonded to the carbon atom adjacent to the carbon atom bonded to the hydroxy group bonded thereto (such as the compounds (H1) to (H4)) can be readily synthesized by reacting a diol compound with a halogenated sulfonic acid. The diol compound has two isomers, that is, a cis-isomer and a trans-isomer, and the cis isomer is thermally stable and is preferably used. In addition, the compound can be stored stably as long as the acid does not coexist.

Specific examples of the component (H) are shown below.

[Chemical Formula 86]

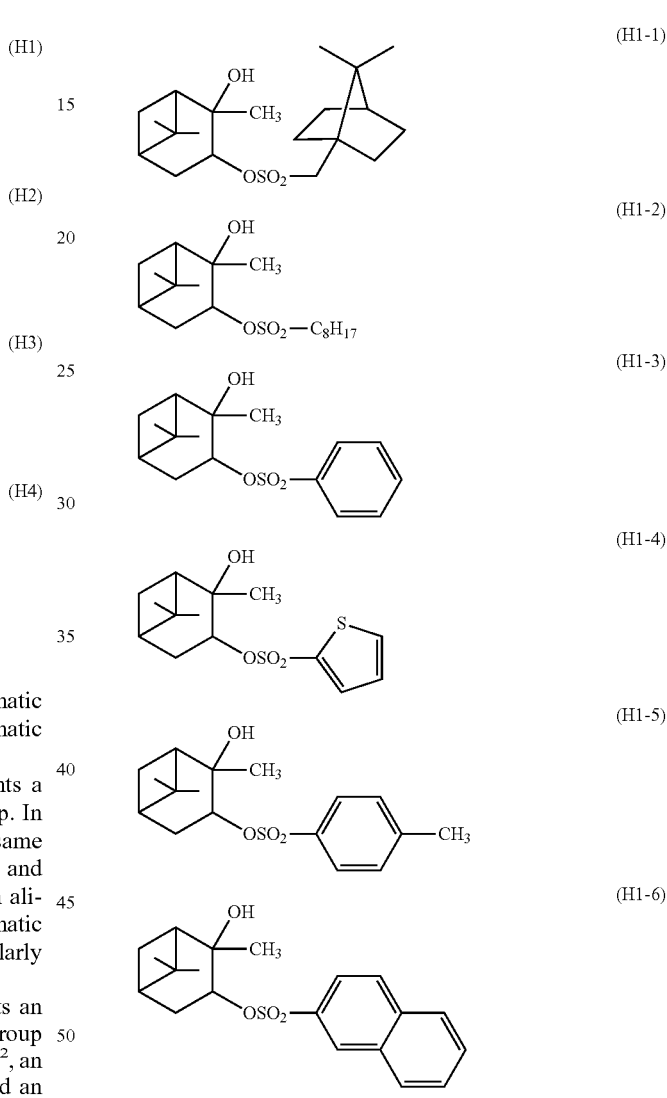

[Chemical Formula 87]

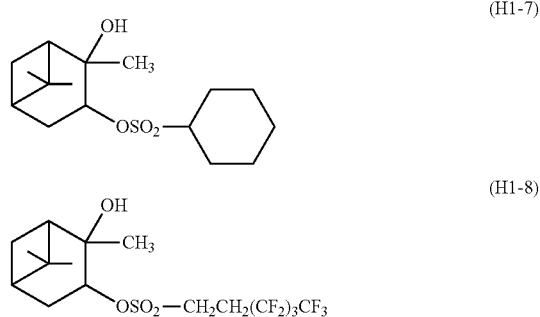

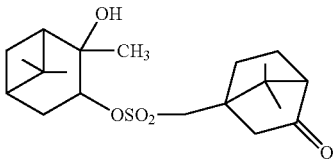

(H1-9)

[Chemical Formula 88]

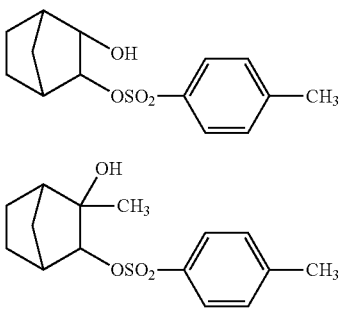

(H2-1)

(H2-2)

Among these, as the component (H), in terms of effect of the present invention (resolution) and excellent lithography properties, the compounds (H1) and (H2) are preferable, and the compound (H1) is particularly preferred. Specifically, it is preferable to use at least one selected from the compounds represented by chemical formulas (H1-1) to (H1-9), and in particular, a compound represented by chemical formula (H1-9) is most preferable.

As the component (H), one type of compound may be used, or two or more types of compounds may be used in combination.

When the resist composition of the present invention contains the component (H), the amount of the component (H) relative to 100 parts by weight of the component (A) is preferably 0.1 to 30 parts by weight, and more preferably 1 to 20 parts by weight. When the amount of the component (H) is at least as large as the lower limit of the above-mentioned range, the resolution can be enhanced. On the other hand, when the amount of the component (H) is no more than the upper limit of the above-mentioned range, the sensitivity becomes excellent.

When the component (H) is used in combination with the component (G), the mixing ratio of the component (H) to the component (G) ((H)/(G)) in terms of molar ratio is preferably in the range of 9:1 to 1:9, more preferably in the range of 9:1 to 5:5, and particularly preferably 9:1 to 6:4. When the amount of the component (H) is at least as large as the lower limit of the above-mentioned range, the resolution can be enhanced. On the other hand, when the amount of the component (H) is no more than the upper limit of the above-mentioned range, the sensitivity becomes excellent.

In addition, when the component (H) is used in combination with the component (B), the mixing ratio of the component (H) to the component (B) ((H)/(B)) in terms of molar ratio is preferably in the range of 9:1 to 1:9, more preferably in the range of 9:1 to 5:5, and particularly preferably 9:1 to 6:4. When the amount of the component (H) is at least as large as the lower limit of the above-mentioned range, the resolution can be enhanced. On the other hand, when the amount of the component (H) is no more than the upper limit of the above-mentioned range, the sensitivity becomes excellent.

Fluorine Additive; Component (F)

In the method of forming a resist pattern according to the present invention, the resist composition may further include a fluorine additive (hereafter, referred to as "component (F')") for imparting water repellency to the resist film.

As the component (F), for example, a fluorine-containing polymeric compound described in Japanese Unexamined Patent Application, First Publication No. 2010-002870.

As the component (F), a polymer having a structural unit (f1-1) represented by general formula (f1-1) shown below can be used. The polymer is preferably a polymer (homopolymer) consisting of a structural unit represented by formula (f1-1) shown below; a copolymer of a structural unit represented by formula (f1-1) shown below and the aforementioned structural unit (a1); or a copolymer of a structural unit represented by formula (f1-1) shown below, a structural unit derived from acrylic acid or methacrylic acid and the aforementioned structural unit (a1). As the structural unit (a1) to be copolymerized with a structural unit represented by the formula (f1-1) shown below, a structural unit represented by the formula (a1-0-11) is preferable, a structural unit represented by the formula (a1-1-02) is more preferable, and a structural unit represented by the formula (a1-1-32) is particularly preferable.

[Chemical Formula 89]

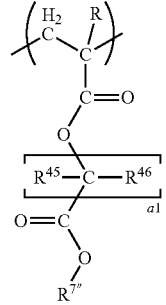

(f1-1)

In the formula, R is the same as defined above; each of $R^{45}$ and $R^{46}$ independently represents a hydrogen atom, a halogen atom, an alkyl group of 1 to 5 carbon atoms or a halogenated alkyl group of 1 to 5 carbon atoms, provided that a plurality of $R^{45}$ to $R^{46}$ may be the same or different from each other; a1 represents an integer of 1 to 5; and $R^{7\prime\prime}$ represents an organic group containing a fluorine atom.

In formula (f1-1), R is the same as defined above. As R, a hydrogen atom or a methyl group is preferable.

Examples of the halogen atom for $R^{45}$ and $R^{46}$ in the formula (f1-1) include a fluorine atom, a chlorine atom, a bromine atom and an iodine atom, and a fluorine atom is particularly desirable. Examples of the alkyl group of 1 to 5 carbon atoms for $R^{45}$ and $R^{46}$ include the same alkyl group of 1 to 5 carbon atoms as those defined above for R defined above, and a methyl group or an ethyl group is preferable. Specific examples of the halogenated alkyl group of 1 to 5 carbon atoms for $R^{45}$ or $R^{46}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly preferred. Among these, $R^{45}$ and $R^{46}$ are preferably a hydrogen atom, a fluorine atom or an alkyl group of 1 to 5 carbon atoms, and more preferably a hydrogen atom, a fluorine atom, a methyl group or an ethyl group.

In formula (f1-1), a1 represents an integer of 1 to 5, preferably an integer of 1 to 3, and more preferably 1 or 2.

In formula (f1-1), $R^{7''}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and particularly preferably 1 to 10 carbon atoms.

The hydrocarbon group having a fluorine atom preferably has 25% or more of the hydrogen atoms within the hydrocarbon group fluorinated, more preferably 50% or more, and most preferably 60% or more, as the hydrophobicity of the resist film during immersion exposure is enhanced.

As $R^{7''}$, a fluorinated hydrocarbon group of 1 to 5 carbon atoms is particularly preferable, and most preferably methyl group, —$CH_2$—$CF_3$, —$CH_2$—$CF_2$—$CF_3$, —$CH(CF_3)_2$, —$CH_2$—$CH_2$—$CF_3$ and —$CH_2$—$CH_2$—$CF_2$—$CF_2$—$CF_2$—$CF_3$.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight of the component (F) is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

When the resist composition of the present invention includes the component (F), the component (F) is used in an amount within a range from 0.5 to 10 parts by weight, relative to 100 parts by weight of the component (A).

Amine; Component (D)

In the method of forming a resist pattern according to the present invention, a nitrogen-containing organic compound (D) (hereafter referred to as the component (D)) may be added to the resist composition.

When the resist composition contains the component (G) as an acid supply component, in the resist composition liquid, the solubility of the component (A) in the alkali developing solution is likely to be increased by the action of the component (G). The occurrence of this phenomenon can be suppressed by adjusting the acidity of the component (G) at an appropriate level, and also can be suppressed by adding the component (D), thereby reducing the acidity of the component (G) in the resist composition liquid. When the composition (D) is used, it is preferable that raw materials such as the component (G) can be freely selected.

In addition, during storage of the resist composition, by virtue of the component (D), the storage stability after preparation of the resist composition liquid can be enhanced. Furthermore, by removing the component (D) from the resist film before neutralizing in the step (3), lithography properties and pattern shape become particularly excellent, because the neutralization of the base generated from the component (C) in the step (3) with the acid derived from the component (Z) is not suppressed by the component (D).

A multitude of these components (D) have already been proposed, and any of these known compounds may be used. It is particularly desirable that the pKa of the component (D) is equal or less than the pKa of the cation moiety within the component (G1). That is, the pKa of the component (D) is preferably 7 or less, and more preferably 6 or less.

When the resist composition of the present invention contains the component (G1), it is more preferable that the pKa of the component (D) is equal or less than the pKa of the cation moiety of the component (G1) so as to prevent from exchanging of a cation of the component (G1) with a cation of the component (G1).

When the resist composition of the present invention contains the component (G2), it is desirable that the basicity of the component (D) is low enough to prevent from extremely reducing the acidity of the component (G2), and the pKa of the component (D) is preferably 7 or less, and more preferably 6 or less.

As the component (D) which satisfies the aforementioned pKa, an amine in which one of "$H^+$" bonded to an nitrogen atom (N) has been removed from an amine represented by the formula (G1c-1) described in relation to the component (G1) can be mentioned.

Specifically, a compound in which "$NH_3^+$" at the terminal of the specific examples of the compounds represented by the formulas (G1c-11) and (G1c-13) has been replaced by "$NH_2$"; and a compound in which "$NH^+$" within the ring in the specific examples of the compounds represented by the formula (G1c-12) has been replaced by "N" are preferable.

In addition, it is desirable that the component (D) is an amine having a relatively low boiling point. By virtue of the amines having a relatively low boiling point, when forming a resist film on a substrate in the step (1), the component (D) can be easily removed from the resist film.

As the component (D) which satisfies the above boiling point, an amine having a boiling point of 130° C. or lower is preferable, and an amine having a boiling point of 100° C. or lower is more preferable, and an amine having a boiling point of 90° C. or lower is particularly preferable.

Specific examples of the component (D) which satisfies the above pKa and boiling point include: aliphatic amine compounds having a fluorinated alkyl group such as trifluoroethylamine (2,2,2-trifluoroethylamine), pentafluoropropylamine (2,2,3,3,3-pentafluoropropylamine), heptafluorobutylamine (1H,1H-heptafluorobutylamine), nonafluoropentylamine (1H, 1H-nonafluoropentylamine), undecafluorohexylamine (1H,1H-undecafluorohexylamine), his (2,2,2-trifluoroethyl)amine, bis(2,2,3,3,3-pentafluoropropyl)amine, and 1-(2,2,2-trifluoro ethyl)pyrrolidine; pyridine-based compound such as pyridine and pentafluoropyridine; and oxazole-based compound such as oxazole and isoxazole.

As the component (D), one type of compound may be used alone, or two or more types may be used in combination.

When the resist composition of the present invention contains the component (D), the amount of the component (D) relative to 100 parts by weight of the component (A) is preferably within a range from 0.01 to 20.0 parts by weight, more preferably from 1 to 15 parts by weight, and particularly preferably from 2 to 10 parts by weight. By ensuring the above-mentioned range, the storage stability is improved and lithography properties and resist pattern shape are also improved.

In the present invention, if desired, other miscible additives can also be added to the resist composition. Examples of such miscible additives include additive resins for improving the performance of the resist film, surfactants for improving the applicability, dissolution inhibitors, plasticizers, stabilizers, colorants, halation prevention agents, dyes, sensitizer and base amplifiers.

As the sensitizers, conventional sensitizers can be used, and specific examples thereof include benzophenone-type sensitizers, such as benzophenone and p,p'-tetramethyldiaminobenzophenone; carbazole-type sensitizers; acetophen-type sensitizers; naphthalene-type sensitizers; phenol-type sensitizers; anthracene-type sensitizers, such as 9-ethoxyanthracene; biacetyl; eosin; rose bengal; pyrene; phenothiazine; and anthrone. In the resist composition, the amount of the sensitizer, relative to 100 parts by weight of the component (A) is preferably from 0.5 to 20 parts by weight.

A base amplifier is decomposed by the action of base in a chain reaction, and is capable of generating a large amount of base using a small amount of base. Therefore, by blending a base amplifier, the sensitivity of the resist composition can be improved. As the base amplifier, for example, those described in Japanese Unexamined Patent Application, First Publication No. 2000-330270 and Japanese Unexamined Patent Application, First Publication No. 2008-174515 can be used.

<Organic Solvent>

The resist composition used for the present invention can be prepared by dissolving the materials for the resist composition in an organic solvent (hereafter, referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), cyclohexanone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of PGMEA, EL, or PGMEA with a polar solvent and a mixed solvent of PGMEA, EL, or PGMEA with γ-butyrolactone are also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

The resist composition according to the present invention described above can be used satisfactorily when forming a negative pattern in an alkali developing process.

In the method of forming a negative pattern, a resist film is formed by applying a resist composition containing a base component that exhibits increased solubility in an alkali developing solution by the action of acid and a photo-base generator component that generates a base upon exposure onto the substrate, and the resist film is then subjected to exposure, and then bake (post exposure bake (PEB) is conducted. During this process, at the exposed portions of the resist film, an acid provided to the resist film in advance is neutralized by the base generated from the photo-base generator component upon exposure. On the other hand, at the unexposed portions of the resist film, the solubility of the base component in an alkali developing solution is increased by the action of the acid. Therefore, the resist film after PEB is subjected to an alkali development, the unexposed portion of the resist film is dissolved and removed, and thereby forming a negative-tone resist pattern.

In the method of forming a negative pattern, it is important that an acid provided to the resist film in advance is not deactivated prior to exposure and acts on the base component effectively at unexposed portions by bake treatment (PEB).

The photo-base generator component selected in the present invention, that is, the compound represented by the general formula (C1-1-1) (component (C1-1-1) has a specific structure, and therefore, before exposure and at unexposed portions, it does not act as a quencher which traps the acid provided to the resist film in advance. On the other hand, at exposed portions, the photo-base generator component generates a base having a strength sufficient for neutralizing the acid and sufficient for suppressing a deprotection reaction of the base component that is caused by the action of acid, or generates a base having a strength sufficient for making a contrast between the exposed portions and unexposed portions. As a result, a negative pattern having a high resolution can be formed.

In addition, when at least one of $R^1$ and $R^2$ represents an alkyl group in the formula (C1-1-1), the photoabsorption properties of the component (C1-1-1) is suppressed at an appropriate level, and therefore, during exposure, the optical transparency of the exposed portions of the resist film can be enhanced and the base generation efficiency in the vicinity of substrate can be enhanced, and the rectangularity of the resist pattern can be enhanced.

In addition, when at least one of $R^1$ and $R^2$ represents a phenyl group, the diffusion of a base generated from the component (C1-1-1) to unexposed portions in the resist film can be suppressed, the residual of unexposed portions which could not be completely dissolved can be reduced, and the footing of the pattern to a side of the unexposed portion (trapezoidal shape of the resist pattern) can be suppressed.

As described above, by virtue of the resist composition containing a photo-base generator component containing a component (C1-1-1) in the method of forming a negative pattern, a negative pattern having a high resolution and excellent shape can be formed.

Furthermore, the resist composition according to the present invention can be preferably used in a step (1) of the method of forming a resist pattern containing steps (1) to (4) described later.

<<Method of Forming a Resist Pattern>>

A method of forming a resist pattern according to a second and third aspects of the present invention includes: a step (1) in which a resist composition containing a base component that exhibits increased solubility in an alkali developing solution by the action of acid and a photo-base generator component that generates a base upon exposure is applied to a substrate to form a resist film; a step (2) in which the resist film is subjected to exposure; a step (3) in which baking is conducted after the step (2), such that, at an exposed portion of the resist film, the base generated from the photo-base generator component upon exposure and an acid provided to the resist film in advance are neutralized, and at an unexposed portion of the resist film, the solubility of the base component in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed.

A "negative-tone resist pattern" refers to a resist pattern in which an unexposed portion of the resist film is dissolved and removed by an alkali developing solution, and an exposed portion remains as a pattern.

An "acid provided to the resist film in advance" includes an acid derived from an acid supply component which is added to the resist composition used for forming the resist film in advance, or an acid derived from an acid supply component and attached to the resist film prior to baking in step (3).

Examples of the base component include the same components as those exemplified above in the description of the base component (component (A)).

Examples of the acid supply component include an acidic compound component and an acid-generator component. The acidic compound component is a component which exhibits acidity by itself, that is, a compound which has a function as a proton donor. Examples of the acidic compound include the same compounds as those exemplified above in the description of the aforementioned acidic compound component (component (G)).

As the acid generator component, a thermal-acid generator component which generates acid by heating, and a photo-acid generator component which generates acid upon exposure can be mentioned. Examples of the acid generator include the same compounds as those exemplified above in the description of the aforementioned acid generator component (component (B)).

As the acid supply component, one type may be used, or two or more types may be used in combination. For example, an acidic compound component and an acid generator component are used in combination, and a thermal-acid generator component and an photo-acid generator component are also used in combination.

Examples of the acid supply component include the same components as those exemplified above in the description of the acid supply component (component (Z)).

Examples of the photo-base generator component include the same groups as those exemplified above in the description of the aforementioned photo-base generator component (component (C)).

In addition, in the second aspect of the present invention, the photo-base generator component (C) includes a compound represented by general formula (C1-1-1) shown below. Examples of the compound represented by the general formula (C1-1-1) include the same compounds as those exemplified above in the description of the aforementioned photo-base generator component (component (C)).

[Chemical Formula 90]

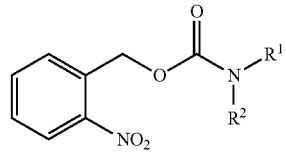

(C1-1-1)

In the formula, each of $R^1$ and $R^2$ independently represents a hydrogen atom, an alkyl group which may have a substituent, or a phenyl group which may have a substituent, provided that at least one of $R^1$ and $R^2$ represents an alkyl group or a phenyl group, and $R^1$ and $R^2$ may be mutually bonded to form a ring with the nitrogen atom in the formula.

In the method of forming a resist pattern according to the present invention, as the resist composition used in the step (1), the same resist compositions as those described above can be mentioned.

Examples of the compound represented by the general formula (C1-1-1) include the same compounds as those exemplified above in the description of the (C1-1-1) component.

Hereinbelow, the method of forming a resist pattern according to the present invention will be described with embodiments, with reference to the drawings. However, the present invention is not limited to these embodiments.

First Embodiment

FIG. 1 shows an example of one embodiment of the method of forming a resist pattern according to the present invention. In this embodiment, a resist composition containing a base component (component (A)) that exhibits increased solubility in an alkali developing solution by the action of acid, a photo-base generator component (component (C)) that generates a base upon exposure, and an acidic compound component (component (G)) is used.

In this embodiment, the resist composition containing a base component (component (A)) that exhibits increased solubility in an alkali developing solution by the action of acid, a photo-base generator component (component (C)) containing a compound represented by the general formula (C1-1-1) (component (C1-1-1)), and an acidic compound component (component (G)) as an acid supply component (component (Z)) may be used.

Firstly, as shown in FIG. 1(a), the resist composition is applied to a substrate 1 to form a resist film 2 (step (1); FIG. 1(a)).

Next, as shown in FIG. 1(b), the resist film 2 is subjected to exposure through a photomask 3 having a predetermined pattern formed thereon. As a result, in the exposed region (exposed portions) of the resist film 2, a base is generated from the photo-base generator component upon exposure (step (1); FIG. 1(b)).

Thereafter, baking (post exposure bake (PEB)) is conducted at a temperature of 100° C. or lower. By PEB, at unexposed portions 2b in the resist film 2, by the action of the acidic compound component in the resist film, the solubility of the base component in the alkali developing solution is increased. On the other hand, at exposed portions 2a, a neutralization reaction between the base generated from the photo-base generator component upon exposure and the acidic compound component in the resist film 2 proceeds, so that the solubility of the base component in an alkali developing is either unchanged or only slightly changed. As a result, a difference in the dissolution rate in an alkali developing solution (dissolution contrast) occurs between the exposed portions 2a and the unexposed portions 2b (step (3); FIG. 1(c)).

Thereafter, developing is conducted using an alkali developing solution. By conducting development, the exposed portions 2a of the resist film 2 remains, and the unexposed portions 2b of the resist film 2 are dissolved and removed by the alkali developing solution. As a result, as shown in FIG. 1(d), a resist pattern constituted from the exposed portions 2a is formed on the substrate 1.

Each of these steps will be described in more detail below.

[Step (1)]

In this embodiment, a resist film 2 is formed by applying a resist composition containing a base component that exhibits increased solubility in an alkali developing solution by the action of acid, a photo-base generator component that generates a base upon exposure and an acidic compound component to a substrate.

The resist composition may include an acid generator component (photo-acid generator or thermal-acid generator) as an acid generator component, in addition to an acidic compound. As the thermal acid supply component and the photo-acid generator component, any one or both of these may be used.

The specific examples of the resist composition will be described later.

The substrate 1 is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate 1, any one of the above-mentioned substrates provided with an inorganic and/or organic film on the surface thereof may be used, and a substrate provided with an organic film on the surface thereof is preferred. As the inorganic film, an inorganic antireflection film (inorganic BARC) can be used. As the organic film, an organic antireflection film (organic BARC) and an organic film such as a lower-layer organic film used in a multilayer resist method can be used. When an organic film is provided, a pattern can be formed on the substrate with a high aspect ratio, and is useful in the production of semiconductors.

Here, a "multilayer resist method" is method in which at least one layer of organic film (lower-layer film) and at least one layer of resist film are provided on a substrate, and a resist pattern formed on the upper resist film is used as a mask to conduct patterning of the lower-layer film. This method is considered as being capable of forming a pattern with a high aspect ratio. The multilayer resist method is broadly classified into a method in which a double-layer structure consisting of an upper-layer resist film and a lower-layer film are formed, and a method in which a multilayer structure having at least three layers consisting of an upper-layer resist film, a lower-layer film and at least one intermediate layer (thin metal film or the like) provided between the upper-layer resist film and the lower-layer film. In the multilayer resist method, a desired thickness can be ensured by the lower-layer film, and as a result, the thickness of the resist film can be reduced, and an extremely fine pattern with a high aspect ratio can be formed.

An inorganic film can be formed, for example, by coating an in organic anti-reflection film composition such as a silicon-based material on a substrate, followed by baking.

An organic film can be formed, for example, by dissolving a resin component and the like for forming the film in an organic solvent to obtain an organic film forming material, coating the organic film forming material on a substrate using a spinner or the like, and baking under heating conditions preferably in the range of 200 to 300° C. for 30 to 300 seconds, more preferably for 60 to 180 seconds. The organic film forming material does not need to have susceptibility to light or electron beam like a resist film, and the organic film forming material may or may not have such susceptibility. More specifically, a resist or a resin generally used in the production of a semiconductor device or a liquid crystal display device can be used.

Further, it is preferable that the organic film forming material can be subjected to etching, particularly dry etching, so that, by etching the organic film using a resist pattern, the resist pattern can be transferred to the organic film, and an organic film pattern can be formed. It is particularly desirable to use an organic film forming material which can be subjected to oxygen plasma etching or the like. As such an organic film forming material, a material conventionally used for forming an organic film such as an organic BARC can be used. Examples of such an organic film forming material include the ARC series manufactured by Brewer Science Ltd., the AR series manufactured by Rohm and Haas Company, and the SWK series manufactured by Tokyo Ohka Kogyo Co., Ltd.

In this embodiment, the acidic compound in the resist composition acts as an acid by baking (PEB) in the step (3) described later.

At exposed portions 2a of the resist film 2, the acid (acidic compound) causes neutralization with the base generated from the photo-base generator component upon exposure. At unexposed portions 2b of the resist film 2, the acid (acidic compound) acts on the base component, thereby increasing the solubility of the base component in an alkali developing solution.

In addition, by virtue of the photo-acid generator component containing a component (C1) (in particular, a component (C1-1-1)), the acid (acidic compound) is less likely to be deactivated by the action of the photo-base generator component before exposure.

As a result, by baking in the step (3), the acid (acidic compound) acts on the base component at unexposed portions.

The detailed description of the resist composition is the same as those described above for the resist composition of the present invention.

The method of applying the resist composition to the substrate 1 to form a resist film 2 is not particularly limited, and the resist film 2 can be formed by a conventional method.

For example, the resist composition can be applied to the substrate 1 by a conventional method such as spin-coat method using a spin coater or barcoat method using a barcoater to form a coating film, followed by drying, thereby forming a resist film 2.

As the drying method of the coating film, any method which can vaporize organic solvents (resist solvent) in the coating film can be applied. For example, a method of conducting prebake (PAB) and a method of drying on a cooling plate at room temperature can be mentioned.

In the present invention, the term "prebake" refers to a heat treatment which is conducted on a hot plate or the like at 70° C. or higher after applying a resist composition to a substrate before conducting exposure.

The prebake temperature is preferably 80 to 150° C., and more preferably 80 to 100° C.

The prebake time is preferably 40 to 120 seconds, and more preferably 60 to 90 seconds.

When conducting prebake, even if a thick resist film is to be formed, the organic solvent is easily vaporized. On the other hand, by drying the resist composition at a room temperature and not conducting prebake, it is possible to reduce the number of processes for forming a resist pattern and to enhance the resolution of obtained resist pattern.

The presence or absence of the prebake can be appropriately determined in view of the aforementioned advantages, depending on the raw materials of the resist composition to be used, or depending on the target of the pattern to be formed.

The thickness of the resist film 2 formed in the step (1) is preferably 50 to 500 nm, and more preferably 50 to 450 nm. By ensuring that the thickness of the resist film satisfies the above-mentioned range, a resist pattern with a high level of resolution can be formed, and a satisfactory level of etching resistance can be achieved.

In addition, when not conducting prebake, the thickness of the resist film formed in the step (1) is preferably 300 nm or less, more preferably 200 nm or less, and particularly preferably 50 to 150 nm. When the thickness of the resist film 2 is 300 nm or less, even if prebake is not conducted, an organic solvent is less likely to be remained according to an application method such as spin-coating at room temperature, and film thickness uniformity of the resist film 2 (in-plane uniformity of the substrate 1) is enhanced.

The effect obtained by not conducting prebake can be achieved especially in the case of thin resist film.

[Step (2)]

In this present embodiment, the resist film 2 formed in the step (1) is subjected to selective exposure through a photomask 3.

As a result, at exposed portions, a base is generated from the photo-base generator component upon exposure.

In addition, when the resist composition contains a photo-acid generator component as an acid supply component in addition to an acidic compound component, at exposed portions, an acid is generated from the photo-acid generator component.

With respect to the exposure dose, an amount capable of generating a base from the photo-base generator component in an amount necessary to neutralize the acid present in the exposed portions 2a is sufficient.

The wavelength to be used for exposure is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, and soft X-rays. In terms of forming a fine resist pattern, ArF excimer laser, EUV or EB is preferable, and ArF excimer laser is particularly desirable.

The photomask 3 is not particularly limited, and a conventional mask can be used. For example, a binary mask in which the transmittance of the light shielding portion is 0% or a halftone-phase shift mask (HT-mask) in which the transmittance of the light shielding portion is 6% can be used. The unexposed portions can be selectively formed by using a halftone-phase shift mask.

As a binary mask, those in which a chromium film, a chromium oxide film, or the like is formed as a light shielding portion on a quartz glass substrate are generally used.

A phase shift mask is a photomask provided with a portion (shifter) which changes the phase of light. Thus, by using a phase shift mask, incidence of light to unexposed portions can be suppressed, and the dissolution contrast to an alkali developing solution can be improved between unexposed portions and exposed portions. As a phase shift mask other than a halftone-phase shift mask, a Levenson-phase shift mask can be mentioned. As any of these phase shift masks, commercially available masks can be used.

Specific examples of the half-tone type phase shift masks include those in which an MoSi (molybdenum silicide) film, a chromium film, a chromium oxide film, an oxynitriding silicon film, or the like is formed as a light shielding portion (shifter) exhibiting a transmittance of about several 10% (generally 6%) on a substrate generally made of quartz glass.

In the present embodiment, exposure is conducted through a photomask 3, but the present invention is not limited to this embodiment. For example, the exposure may be conducted without using a mask, e.g., selective exposure by drawing with electron beam (EB) or the like.

The exposure of the resist film 2 can be either a general exposure (dry exposure) conducted in air or an inert gas such as nitrogen, or immersion exposure (immersion lithography) through an immersion medium.

In step (2), in terms of forming a resist pattern with a high resolution, it is preferable to conduct exposure through an immersion medium.

In immersion lithography, exposure (immersion exposure) is conducted in a state where the region between the lens and the resist film 2 formed on the substrate 1 (which was conventionally filled with air or an inert gas such as nitrogen) is filled with a solvent (a immersion medium) that has a larger refractive index than the refractive index of air.

More specifically, in immersion lithography, the region between the resist film 2 formed in the above-described manner and lens at the lowermost portion of the exposure apparatus is filled with a solvent (an immersion medium) that has a larger refractive index than the refractive index of air, and in this state, the resist film 2 is subjected to exposure (immersion exposure) through a predetermined photomask 3.

The immersion medium preferably exhibits a refractive index larger than the refractive index of air but smaller than the refractive index of the resist film 2 to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film 2 include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the immersion medium after the exposure can be removed by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

The step (2) may include an operation in which a latent image of a first line and space pattern is formed by subjecting the resist film 2 to first exposure through a photomask 3, and a latent image of a second line and space pattern is formed so as to intersect with the first line and space pattern by subjecting the resist film to second exposure through the photomask 3 (i.e., a double patterning method).

The "latent image" is a region where is irradiated radiation that has passed through the transmission portion of the photomask in the resist film.

By conducting the aforementioned operation, a lattice-like latent image is formed on the resist film 2 in which the linear latent images of the first line and space pattern intersect with the latent images of the second line and space pattern. By performing the steps (3) and (4) described later to the resist film 2, the regions where a latent image is not formed (unexposed portions) are dissolved and removed, whereas the exposed portions are not removed and retained, thereby forming a hole pattern.

[Step (3)]

In the step, post exposure bake (PEB) is conducted to the resist film which is subjected to exposure in the step (2).

By PEB, an acidic compound blended in the resist composition acts as an acid in the entire resist film 2, and at unexposed portions 2b, by the action of the acidic compound component, the solubility of the base component in the alkali developing solution is increased. On the other hand, at exposed portions 2a, a neutralization reaction between the base generated from the photo-base generator component upon exposure and the acidic compound component proceeds, so that the amount of acid which would act on the base component decreases. As a result, at exposed portions, the solubility of the base component in an alkali developing solution is either unchanged or only slightly changed. As a result, a difference in the dissolution rate in an alkali developing solution (dissolution contrast) occurs between the exposed portions 2a and the unexposed portions 2b.

When the resist composition contains a thermal-acid generator component as an acid supply component in addition to an acidic compound component, an acid is generated from the thermal-acid generator component in the entire resist film 2 by PEB in this step. As described above, at exposed portions, the acid is either neutralized with a base generated from an photo-base generator component or only slightly changed. As a result, a difference in the dissolution rate in an alkali developing solution (dissolution contrast) occurs between the exposed portions 2a and the unexposed portions 2b.

By obtaining a dissolution contrast, when conducting an alkali developing in the step (4) described later, a negative resist pattern having a high resolution can be formed.

In the third embodiment of the present invention, by conducting the aforementioned PEB at a temperature of 100° C. or lower, the sensitivity is improved as compared to the case of conducting a PEB at a temperature greater than 100° C. Further, the resolution is also improved. It is presumed that the resolution can be improved since the diffusion of acid in the resist film is suppressed at an appropriate level.

According to the method of forming a resist pattern of the second aspect of the present invention, in the baking, the temperature conditions is preferably from 50 to 200° C., more preferably from 80 to 150° C., and still more preferably from 90 to 130° C.

The baking time is preferably from 10 to 300 seconds, more preferably from 40 to 120 seconds, and still more preferably from 60 to 90 seconds.

According to the method of forming a resist pattern of the third aspect of the present invention, the PEB temperature is preferably 60 to 100° C., and more preferably 70 to 100° C. When PEB is conducted at a temperature of 60° C. or higher, a deprotection reaction is sufficiently proceeded, the pattern roughness becomes particularly excellent.

In the method of forming a resist pattern of the third aspect according to the present invention, PEB time is not particularly limited, but is preferably 10 to 300 seconds, more preferably 40 to 120 seconds, and still more preferably 60 to 90 seconds.

It is noted that the bake treatment in the step (3) is not necessary a treatment to control the beginning of neutralization reaction.

[Step (4)]

In the present embodiment, after the step (3), by conducting alkali developing, the unexposed portions 2b of the resist film 2 are dissolved and removed, and the exposed portions 2a are retained, thereby forming a negative resist pattern.

Specific examples of the alkali developing solution include inorganic alkalis, such as sodium hydroxide, potassium hydroxide, sodium carbonate, sodium silicate, sodium metasilicate and aqueous ammonia; primary amines, such as ethylamine and n-propyl amine; secondary amines, such as diethylamine and di-n-butylamine; tertiary amines, such as triethylamine and methyldiethylamine; alcoholamines, such as dimethylethanolamine and triethanolamine; quaternary ammonium salts, such as tetramethylammonium hydroxide and tetraethylammonium hydroxide; and cyclic amines, such as pyrrole and piperidine.

Among these examples, as the alkali developing solution, an aqueous alkali solution containing at least one member selected from the group consisting of primary amines, secondary amines, tertiary amines and quaternary ammonium salts is preferable, and an aqueous solution of tetramethylammonium hydroxide (TMAH) is particularly desirable.

Further, the aforementioned aqueous alkali solution having alcohols, surfactants added thereto in an appropriate amount may be used.

In general, the alkali concentration within the alkali developing solution (i.e., concentration of inorganic alkalis, quaternary ammonium salts or amine compounds, based on the total weight of the alkali developing solution) is from 0.01 to 20% by weight.

The alkali developing treatment can be conducted by a conventional method.

After the alkali developing, a rinse treatment using pure water or the like can be conducted.

Further, after the alkali developing, post bake treatment may be conducted. Post bake (which is performed in order to remove water content after the alkali developing and rinsing) is generally conducted at about 100° C. preferably for 30 to 90 seconds.

In the aforementioned first embodiment, a resist composition containing an acidic compound as an acid supply component is used, and a resist composition containing an acid generator component (thermal-acid generator and photo-acid generator) instead of an acidic compound component or together with an acidic compound component may be used. In addition, an acid amplifier component may be used together with at least one of an acid compound or an acid generator component, since the concentration of acid when conducting a bake treatment such as PEB is enhanced.

As the acid generator component, one or both of a component which generates acid by heating (thermal-acid generator) and a component which generates acid upon exposure (photo-acid generator) can be used.

In the case where the thermal-acid generator component is used as an acid generator component, an acid is generated from the thermal-acid generator component in the whole resist film 2 by the bake treatment (PEB) in the step (3). At unexposed portions 2b in the resist film 2, the solubility of the base component in an alkali developing solution can be increased by the action of the acid provided from the thermal-acid generator by bake treatment (PEB). On the other hand, at exposed portions 2a, a neutralization reaction between the acid generated from the thermal-acid generator by baking (PEB) and the base generated from the photo-base generator component upon exposure in the aforementioned step (2) proceeds, and the solubility of the base component in an alkali developing is either unchanged or only slightly changed. As a result, a difference in the dissolution rate in an alkali developing solution (dissolution contrast) occurs between the exposed portions 2a and the unexposed portions 2b.

When a resist composition containing a thermal-acid generator is used, it is preferable that the aforementioned prebake is not performed. By not conducting a prebake treatment, an acid derived from the thermal-acid generator does not act on the base component after applying a resist composition on a substrate and before conducting exposure. As a result, the contrast between exposed portions 2a and unexposed portions 2b in the resist film 2 is increased, and thereby forming a negative pattern having a high resolution.

In addition, by selecting appropriately the type of photomask, base component and photo-base generator component appropriately, a photo-acid generator can be used as an acid generator component. For example, an embodiment in which a resist composition containing a photo-acid generator having a relatively long diffusion length and a photo-base generator having a relatively short diffusion length is used and a photomask having a transparency (halftone-phase shift mask) is used as a photomask can be mentioned. The diffusion length of the acid can be adjusted by controlling the skeleton or polarity of the anion moiety of a photo-acid generator, whereas the diffusion length of the base can be adjusted by controlling the molecular weight or skeleton of the base generated from the photo-based generator after photo decomposition.

In the embodiment, at exposed portions 2a, a base is generated from a photo-base generator component and an acid is generated from a photo-acid generator upon exposure in the step (2). At the unexposed portions 2b, the protecting group within the base component is dissociated (deprotection reaction is proceeded) by the action of the acid which is generated at exposed portions 2a and diffused to unexposed portions 2b by the bake treatment in the step (3), thereby increasing the solubility of the base component in an alkali developing solution. On the other hand, at exposed portions 2a, a neutralization reaction between the base and the acid generated in the step (2) proceeds, and the solubility of the base component in an alkali developing is either unchanged or only slightly changed. As a result, a difference in the dissolution rate in an alkali developing solution (dissolution contrast) occurs between the exposed portions 2a and the unexposed portions 2b.

Second Embodiment

Figure 2:
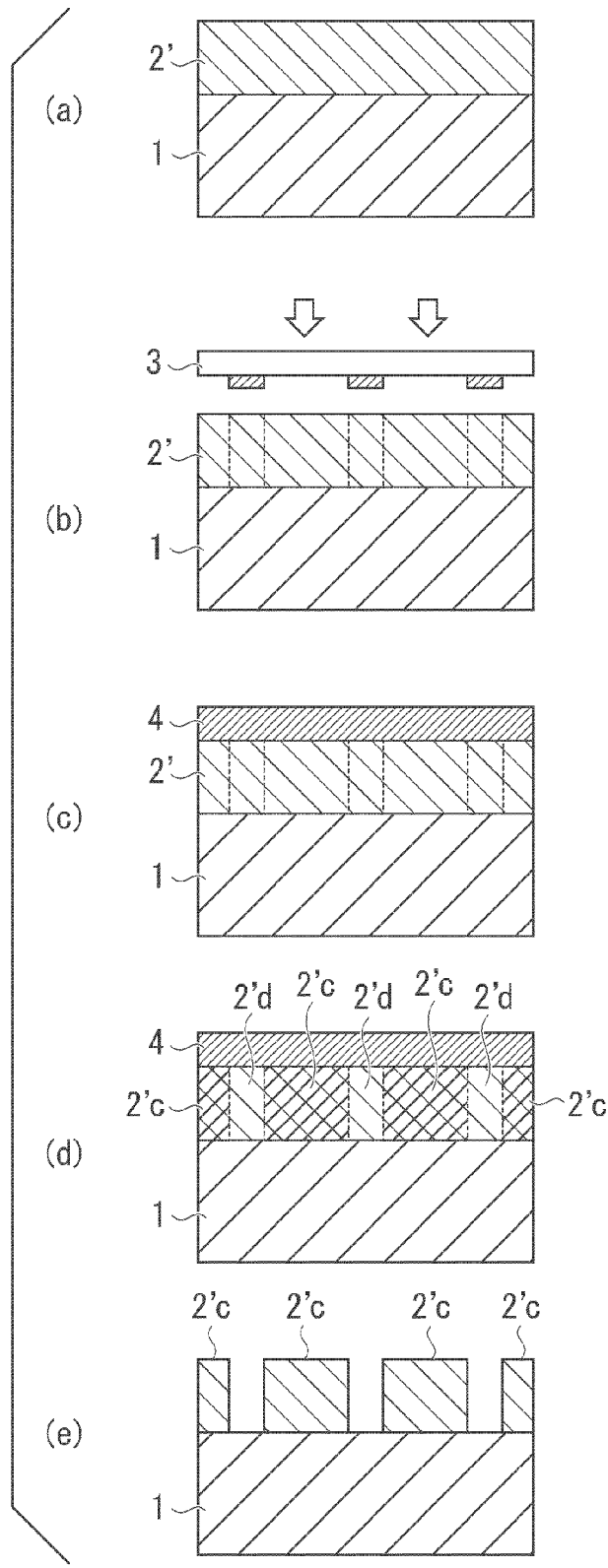
FIG. 2 is a schematic diagram showing an example of one embodiment of the method of forming a resist pattern according to the present invention.

FIG. 2 shows an example of another embodiment of the method of forming a resist pattern according to the present invention. In this embodiment, a resist composition containing a base component that exhibits increased solubility in an alkali developing solution by the action of acid and a photo-base generator component that generates a base upon exposure, and an organic film-forming composition containing an acidic compound component are used.

Firstly, as shown in FIG. 2(a), the resist composition is applied to a substrate 1 to form a resist film 2' (step (1); FIG. 2 (a)).

Next, as shown in FIG. 2 (b), the resist film 2' is subjected to exposure through a photomask 3 having a predetermined pattern formed thereon. As a result, in the exposed region (exposed portions) of the resist film 2', a base is generated from the photo-base generator component upon exposure (step (2); FIG. 2. (b)).

After exposure, the organic film-forming composition is applied to the resist film 2' (step (5); FIG. 2. (c)).

Subsequently, a bake treatment (PEB) is conducted. As a result, an organic film 4 is formed, and the acidic component contained in the organic film 4 is diffused to the resist film 2', thereby providing the acid to the resist film 2'. As a result, at exposed portions 2' c of the resist film 2', a base generated from the photo-base generator component upon exposure is neutralized by an acid provided from the organic film 4. Therefore, the solubility of the base component in the alkali developing solution is either unchanged or only slightly changed. On the other hand, in the unexposed portions 2' d, the solubility of the base component in an alkali developing solution can be increased by the action of the acid provided from the organic film 4. As a result, a difference in the dissolution rate in an alkali developing solution (dissolution contrast) occurs between the exposed portions 2' c and the unexposed portions 2' d (step (3); FIG. 2(d)). In the method of forming a resist pattern according to the third aspect, the bake treatment (PEB) is conducted at 100° C.

Thereafter, developing is conducted using an alkali developing solution. By conducting development, the exposed portions 2' c of the resist film 2' are retained, and the unexposed portions 2' d of the resist film 2' are dissolved and removed. As a result, as shown in FIG. 2(e), a resist pattern constituted from a plurality of resist patterns 2c arranged at intervals is formed on the substrate 1 (step (4); FIG. 2(e)).

[Step (1) and Step (2)]

The step (1) and the step (2) in this embodiment can be performed in the same manner as in the step (1) and the step (2) in the aforementioned first embodiment, respectively. Provided that, the resist composition used in this embodiment may not contain the acid compound component.

[Step (5)]

In this embodiment, after the step (2), an organic film-forming composition containing an acid supply component is coated on the resist film 2' by a conventional method, e.g., a method using a spinner or the like. In this manner, an organic film-forming composition is applied to the resist film 2' and the resist film 2' is allowed to come into contact with an acid in a step prior to the step (3) described below, thereby enabling to provide the acid to the resist film 2' by the baking in the step (3).

In this embodiment, an organic film-forming composition containing an acidic compound component is used, and an organic film-forming composition containing an acid generator component instead of an acidic compound component or together with an acidic compound component may be used. Provided that, in the case where the photo-acid generator component is used as an acid generator component, the step (5) is conducted between the step (1) and the step (2). As a result, an acid is generated from the photo-acid generator component upon exposure in the step (2), and the acid is provided to the resist film 2' by the bake treatment in the step (3).

The organic film-forming composition may include an acid generator component (photo-acid generator or thermal-acid generator) as an acid generator component, in addition to an acidic compound. As the thermal-acid generator and the photo-acid generator, any one or both of these may be used.

The specific examples of the organic film-forming composition will be described later.

The coating conditions of the organic film-forming composition are adjusted to depending on the desired film thickness of the organic film 4.

The thickness of the organic film 4 can be appropriately selected depending on the types of acid supply component blended to the organic film-forming composition or the process conditions such as immersion exposure. The thickness of the organic film is preferably 10 to 300 nm, more preferably 20 to 200 nm, and still more preferably 30 to 150 nm. The thickness of the organic film is within the range, the sufficient amount of acid can be supplied to the resist film 2' and a resist pattern having a high resolution can be formed.

[Step (3)]

In this embodiment, after the aforementioned step (5), a bake treatment (post exposure bake (PEB)) is conducted at 100° C. or lower.

The step (3) in this embodiment can be performed in the same manner as in the step (3) in the aforementioned first embodiment.

By virtue of PEB, an organic film 4 is formed on the resist film 2', and the acidic compound component contained in the organic film 4 is diffused to the resist film 2', thereby providing the acid to the resist film 2'. At unexposed portions 2' d in the resist film 2', the solubility of the base component in an alkali developing solution can be increased by the action of the acid provided from the organic film 4. On the other hand, at exposed portions 2' c, a neutralization reaction between the base generated from the photo-base generator component upon exposure and the acid provided from the organic film 4 proceeds, thereby reducing the amount of acid which acts on the base component, so that the solubility of the base component in an alkali developing is either unchanged or only slightly changed. As a result, a difference in the dissolution rate in an alkali developing solution (dissolution contrast) occurs between the exposed portions 2' c and the unexposed portions 2' d.

In the case where the step (5) is conducted prior to the step (2) when an organic film-forming composition containing an photo-acid generator component as an acid supply component in addition to an acidic compound component, an acid is generated from the photo-acid generator component upon exposure in the step (2). The acid is supplied to the resist film 2' in the step (3) as well as the aforementioned acidic compound component. At exposed portions, the acid is either neutralized with a base generated from an photo-base generator component or diffused to unexposed portions 2d' from exposed portions 2c' by PEB such that the acid acts on the base component thereby increasing the solubility of the base component in an alkali developing solution.

When the resist composition contains a thermal-acid generator component as an acid supply component in addition to an acidic compound component, an acid is generated from the thermal-acid generator component by PEB in this step. The acid is supplied to the resist film 2' in the step (3) as well as the aforementioned acidic compound component. At exposed portions, the acid is either neutralized with a base generated from an photo-base generator component or diffused to unexposed portions 2d' from exposed portions 2c' by PEB such that the acid acts on the base component thereby increasing the solubility of the base component in an alkali developing solution.

By obtaining a dissolution contrast, when conducting an alkali developing in the step (4) described later, a negative resist pattern having a high resolution can be formed. It is noted that the bake treatment in the step (3) is not necessary a treatment to control the beginning of neutralization reaction.

[Step (4)]

In the present embodiment, after the step (3), by conducting alkali developing, the unexposed portions 2' d of the resist film 2' are dissolved and removed, and the exposed portions 2' c are retained, thereby forming a negative resist pattern.

As the alkali developing solution, the same as those described above can be used.

The alkali developing can be conducted by a conventional method, for example, using a tetramethylammonium hydroxide (TMAH) solution having a concentration of 0.1 to 10% by weight.

After the alkali developing, a rinse treatment using pure water or the like can be conducted.

Further, after the alkali developing, post bake treatment may be conducted. Post bake (which is performed in order to remove water content after the alkali developing and rinsing) is generally conducted at about 100° C. preferably for 30 to 90 seconds.

With respect to the organic film 4 formed on the resist film 2', it is preferable to select the material for forming the organic film 4 (e.g., an alkali-soluble resin), so as to dissolve and remove the organic film 4 in the alkali developing treatment in the step (4). Alternatively, the resist film 4 can be removed by a conventional method between the step (3) and the step (4).

As above, a method of forming a resist pattern according to the present invention is described with embodiments. However, the present invention is not limited to these embodiments.

For example, in the aforementioned first embodiment and second embodiment, a resist composition or an organic film-forming composition containing an acidic compound as an acid supply component are exemplified. However, an acid generator (thermal-acid generator or photo-acid generator) may be used instead of the acidic compound or together with an acidic compound. As the thermal-acid generator component and the photo-acid generator component, any one or both of these may be used. Provided that, in the case where the photo-acid generator component is used as an acid generator component, the step (5) is conducted between the step (1) and the step (2). As a result, an acid is generated from the photo-acid generator component upon exposure in the step (2), and the acid is provided to the resist film 2' by the bake treatment in the step (3). In addition, an acid amplifier component may be used together with an acid compound and/or an acid generator component since the concentration of acid when conducting a bake treatment such as PEB is enhanced.

In the case where the thermal-acid generator is used as an acid generator component, an acid is generated from the thermal-acid generator component in the whole resist film 2 by the bake treatment (PEB) in the step (3). At the unexposed portions 2b in the resist film 2, the solubility of the base component in an alkali developing solution can be increased by the action of the acid generated from the thermal-acid generator by bake treatment (PEB). On the other hand, at exposed portions 2a in the resist film 2, a neutralization reaction between the acid generated from the thermal-acid generator by baking (PEB) and the base generated from the photo-base generator component in the aforementioned step (2) proceeds, and the solubility of the base component upon exposure in an alkali developing is either unchanged or only slightly changed. As a result, a difference in the dissolution rate in an alkali developing solution (dissolution contrast) occurs between the exposed portions 2a and the unexposed portions 2b.

Therefore, when a thermal-acid generator is used instead of an acidic compound, by not conducting a prebake treatment, an acid derived from the thermal-acid generator does not act on the base component, the contrast between exposed portions 2a and unexposed portions 2b in the resist film 2 is improved, and thereby forming a negative pattern having a high resolution.

In addition, by selecting the type of photomask, base component and photo-base generator component appropriately, a photo-acid generator can be used instead of an acidic compound.

For example, an embodiment in which a resist composition containing a photo-acid generator having a relatively long diffusion length and a photo-base generator having a relatively short diffusion length is used and a photomask having a transparency (halftone-phase shift mask) is used as a photomask can be mentioned. The diffusion length of the acid can be adjusted by controlling the skeleton or polarity of the anion moiety of a photo-acid generator, whereas the diffusion length of the base can be adjusted by controlling the molar weight or skeleton of the base generated from the photo-base generator after photo decomposition.

In the embodiment, at exposed portions, a base is generated from a photo-base generator component and an acid is generated from a photo-acid generator upon exposure in the step (2). At unexposed portions 2b, the protecting group within the base component is dissociated (deprotection reaction is proceeded) by the action of the acid which is generated at the exposed portions 2a and diffused to the unexposed portions 2b by bake treatment in the step (3), thereby increasing the solubility of the base component in an alkali developing solution. On the other hand, at exposed portions 2a, a neutralization reaction between the base and the acid generated in the step (2) proceeds, and the solubility of the base component in an alkali developing is either unchanged or only slightly changed. As a result, a difference in the dissolution rate in an alkali developing solution (dissolution contrast) occurs between the exposed portions 2a and the unexposed portions 2b, and therefore, a negative pattern having a high resolution can be formed.

As a modification example of the aforementioned first embodiment, a method including a step (5) in which an organic film-forming composition containing an acid supply component is applied to the resist film to form an organic film, between the step (2) and step (3) can be mentioned. After exposure, by virtue of applying the aforementioned organic film-forming composition to the resist film and subsequently conducting a bake treatment (PEB), an organic film can be formed on the resist film, and an acid derived from an acid supply component in the organic film is diffused to the resist film from the organic film, and therefore, an acid is further supplied to the resist film.

Next, By conducting alkali developing, a negative resist pattern having a high contrast can be formed.

The step (5) is the same as those described in the second embodiment.

In the case where the photo-acid generator component is used as an acid supply component, the step (5) is conducted between the step (1) and the step (2).

In the aforementioned second embodiment and the modification example of the aforementioned first embodiment, for providing acid to the resist film 2', an organic film-forming composition is coated on the resist film 2' to form an organic film 4. However, in the aforementioned embodiment, an acidic active rinse may be applied to the resist film 2' instead of forming an organic film 4. As the acidic active rinse, an aqueous solution containing the component (G2) described later can be used.

In the method of forming a resist pattern according to the present invention, after forming a negative resist pattern in the manner as described above, etching of the substrate 1 may be conducted using the negative resist pattern as a mask. By conducting such etching to transfer the resist pattern to the substrate 1, a semiconductor device or the like can be produced.

The etching can be conducted by a conventional method. For example, when the substrate 1 has an organic film formed thereon, the etching of the organic film is preferably conducted by dry etching. Among dry etching, especially in terms of production efficiency, oxygen-plasma etching or etching using a $CF_4$ gas or a $CHF_3$ gas is preferable, and oxygen-plasma etching is particularly desirable.

Etching of the substrate is preferably performed using a halogen gas, more preferably using a fluorinated carbon-based gas, and most preferably using a $CF_4$ gas or a $CHF_3$ gas.

According to the method of forming a resist pattern of the present invention described above, by use of the developing process combined with an alkali developing solution and a chemically amplified resist composition which had been used as a positive resist composition, a negative resist pattern having a high resolution can be formed.

Therefore, by the method of forming a resist pattern according to the present invention, a resist pattern (such as an isolated trench pattern, an extremely small, dense contact hole pattern, or the like), in which a region where the optical strength becomes weak is likely to be generated in the film thickness direction, can be formed with high resolution.

Further, by the method of forming a resist pattern according to the present invention, it is possible to enhance the densities of the resist pattern, and to form a contact hole pattern having an excellent shape in which individual holes are closed to each other, for example, a contact hole pattern in which a distance between holes is in the range of 30 to 50 nm.

Furthermore, the method of forming a resist pattern according to the present invention can be performed by existing exposure apparatuses and existing chemically amplified resist compositions.

Moreover, in the method of forming a resist pattern according to the present invention, by virtue of bake treatment (PEB) at a temperature of 100° C. or lower, the high sensitivity can be achieved.

<Organic Film-Forming Composition>

In the method of forming a resist pattern according to the present invention, as described in the second embodiment, an organic film-forming composition containing an acid supply component can be used in order to supply acid to the resist film.

The organic film-forming composition may contain other components such as a resin and an organic solvent, in addition to an acid supply component.

As the acid supply component in the organic film-forming composition, the same as the component (Z) described above in relation to the resist composition can be mentioned.

As the acid supply component, one type may be used, or two or more types of compounds may be used in combination.

When the organic film-forming composition contains an acid supply component, a resin and an organic solvent, the amount of the acid supply component relative to 100 parts by weight of the resin is preferably 0.1 to 60 parts by weight. When the acid supply component is an acidic compound component, the amount of the acid supply component relative to 100 parts by weight of the resin is preferably 0.1 to 50 parts by weight, and 1 to 20 parts by weight is still more preferable. When the acid supply component is an acid generator component, the amount of the acid supply component relative to 100 parts by weight of the resin is preferably 1 to 60 parts by weight, and 1 to 50 parts by weight is still more preferable. When the amount of the acid supply component is at least as large as the lower limit of the above-mentioned range, a sufficient amount of acid is supplied to the resist film, the solubility of the resist film at unexposed portions in the developing solution is likely to increase, and resolution is increased. On the other hand, when the amount of the acid supply component is no more than the upper limit of the above-mentioned range, the sensitivity becomes excellent. Further, when these components are dissolved in the organic solvent, a uniform solution can be obtained and the storage stability becomes satisfactory.

[Resin]

The resin is not particularly limited, and a conventional resin can be used.

It is preferable to use an alkali-soluble resin because in step (4), the formed organic film can be removed simultaneously with the formation of a resist pattern by alkali developing.

As the alkali-soluble resin, any resin having an alkali-soluble group may be used, and examples thereof include conventional resins such as novolak resins, hydroxystyrene resins, acrylic resins and polycycloolefin resins.

Specific examples of the alkali-soluble group include a phenolic hydroxy group, a carboxy group, a fluorinated alcohol group, a sulfonate group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, and a group containing any of these groups.

As an example of an alkali-soluble resin, a polymer (A') having a structural unit derived from a polycycloolefin (hereafter, this structural unit is referred to as "structural unit (a'1)") can be preferably used.

As the structural unit (a'1), structural units having a basic skeleton represented by general formula (a'1-0) shown below are preferred.

[Chemical Formula 91]

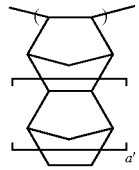

(a' 1-0)

In the formula, a' represents 0 or 1.

In general formula (a'1-0), a' represents 0 or 1. In terms of industrial availability, a' is preferably 0.

In the present description, a "structural unit having a basic skeleton represented by general formula (a'1-0)" may be either a structural unit represented by general formula (a'1-0) per se (i.e., a structural unit derived from bicyclo[2.2.1]-2-heptene(norbornene) or a structural unit derived from tetracyclo[4.4.0.1$^{2.5}$.1$^{7.10}$]-3-dodecene), or a structural unit having a substituent on the ring skeleton. In other words, a "structural unit having a basic structure represented by general formula (a'1-0)" includes structural units in which part or all of the hydrogen atoms bonded to the carbon atoms that constitute the cyclic structure (namely, bicyclo[2.2.1]-2-heptane or tetracyclo[4.4.0.1$^{2.5}$.1$^{7.10}$]-3-dodecane) are substituted with an atom or a substituent other than hydrogen.

As the structural unit (a'1), a structural unit represented by general formula (a'1-1) shown below can be exemplified.

[Chemical Formula 92]

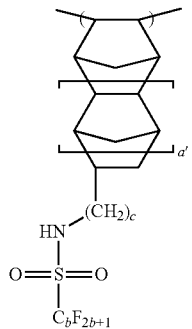

(a' 1-1)

In the formula (a'1-1), each of a' is the same as defined above for a' in the formula (a'1-0).

c represents an integer of 1 to 5, and is preferably an integer of 1 to 3, and most preferably an integer of 1.

b represents an integer of 1 to 5, and is preferably an integer of 1 to 3, and most preferably an integer of 1.

As the structural unit (a'1), one type of structural unit may be used alone, or two or more types of structural units may be used in combination.

The proportion of the structural unit (a1') within the polymer (A'), relative to the combined total of all the structural units that constitute the polymer (A'), is preferably within a range from 1 to 50 mol %, more preferably from 1 to 45 mol %, and still more preferably from 5 to 35 mol %. When the amount of the structural unit (a'1) is within the above-mentioned range, the predetermined alkali solubility can be easily obtained.

A monomer for deriving a structural unit (a'1) can be synthesized, for example, by a method disclosed in U.S. Pat. No. 6,420,503.

In addition, the polymer (A') may contain a structural unit derived from a polycycloolefin having a fluorinated alkyl group as a substituent (hereafter, referred to as "structural unit (a'2)"), in addition to the structural unit (a'1). Specifically, the polymer (A') may contain a structural unit represented by the general formula (a'2-1) shown below.

[Chemical Formula 93]

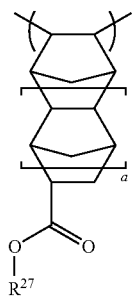

(a' 2-1)

In the formula, $R^{27}$ represents a fluorinated alkyl group; and a represents an integer of 0 or 1.

In general formula (a'2-1), a' represents 0 or 1. In terms of industrial availability, a' is preferably 0.

In the formula (a'2-1), $R^{27}$ represents a fluorinated alkyl group, and the fluorinated alkyl group is a group in which part or all of the hydrogen atoms of a linear, branched or cyclic alkyl group have been substituted with fluorine atoms.

The linear or branched alkyl group is preferably an alkyl group of 1 to 10 carbon atoms, more preferably an alkyl group of 1 to 8 carbon atoms, and still more preferably an alkyl group of 1 to 5 carbon atoms. Examples of alkyl groups include a methyl group, an ethyl group, a propyl group, an isopropyl group, an n-butyl group, an isobutyl group, a pentyl group, an isopentyl group and a neopentyl group. Among these, a propyl group is particularly desirable.

The cyclic alkyl group preferably has 4 to 12 carbon atoms, more preferably 4 to 10 carbon atoms, and most preferably 6 to 10 carbon atoms.

Among these, as the fluorinated alkyl group for $R^{27}$, a group in which one hydrogen atom within a linear or branched alkyl group has been substituted with a perfluoroalkyl group (a group in which an alkylene group has been bonded to a perfluoroalkyl group) is preferably used, and —$(CH_2)_f$—$CF_3$ and —$(CH_2)_f$—$C_2F_5$[f=1~3] are more preferable, and —$CH_2$—$CF_3$ and —$CH_2$—$C_2F_5$ are particularly preferable.

In particular, in the fluorinated alkyl group, the fluorination ratio (percentage (%) of the number of carbon atoms based on the total number of fluorine atoms and hydrogen atoms within the fluorinated alkyl group) is preferably 30 to 90%, and more preferably 50 to 80%. When the fluorination ratio is at least 30%, the effect of improving the hydrophobicity of a surface of organic film under the immersion exposure condition can be achieved. In addition, when the fluorination ratio is 90% or less, development properties are improved The structural unit represented by the formula (a'2-1) may have a substituent on the ring skeleton constituting a main chain. Examples of the substituent include an alkyl group of 1 to 5 carbon atoms, a fluorine atom and a fluorinated alkyl group.

When the structural unit (a'2) is included in the polymer (A'), the amount of the structural unit (a'2) based on the combined total of all the structural units that constitute the polymer (A') is preferably within the range from 5 to 75 mol %, more preferably from 10 to 70 mol %, and still more preferably 15 to 60 mol %. When the amount of the structural unit (a'2) is within the above-mentioned range, hydrophobicity of the surface of the organic film is improved and controllability of the dissolution rate into the alkali developing solution becomes excellent.

The monomer for deriving the structural unit represented by the formula (a'2-1) can be synthesized, for example, by a method disclosed in Japanese Unexamined Patent Application, First Publication No. 2000-235263, that is, "method of reacting a fluorinated alkyl ester of (meth)acrylic acid with either cyclopentadiene or dicyclopentadiene in the condition of Diels-Alder reaction which is a conventional reaction".

As the polymer (A'), one type may be used alone, or two or more types may be used in combination.

In the present invention, as the polymer (A'), a polymeric compound that includes a combination of structural units such as that shown below is particularly desirable.

[Chemical Formula 94]

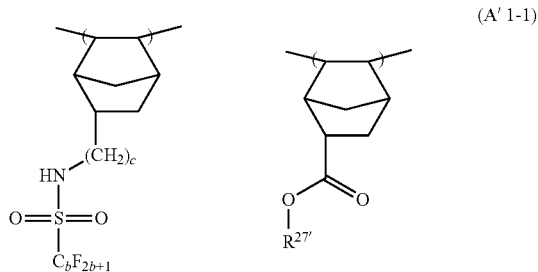

(A' 1-1)

In the formula, b and c are the same as defined above; and $R^{27'}$ represents an fluorinated alkyl group of 1 to 5 carbon atoms.
c is preferably an integer of 1 to 3, and most preferably 1.
b is preferably an integer of 1 to 3, and most preferably 1.
$R^{27'}$ is preferably —$CH_2$—$CF_3$ or —$CH_2$—$C_2F_5$.

The weight average molecular weight (Mw) (the polystyrene equivalent value determined by gel permeation chromatography) of the polymer (A') is not particularly limited, but is preferably 1,000 to 50,000, more preferably 1,500 to 30,000, and most preferably 2,000 to 20,000. When the weight average molecular weight is within the range, the polymer (A') exhibits a satisfactory solubility in an organic solvent for using as a resin composition to form an organic film, an alkali developing properties is excellent, and film formability is also excellent.

Further, the dispersity (Mw/Mn) of the polymer (A') is not particularly limited, but is preferably 1.0 to 5.0, more preferably 1.0 to 3.0, and most preferably 1.0 to 2.5.

The polymer (A') can be obtained, for example, by a conventional radical polymerization or the like of the monomers corresponding with each of the structural units, using a radical polymerization initiator such as azobisisobutyronitrile (AIBN).

In addition, when the polymer (A') contains the cyclic-main chain structural unit, the polymer (A') can be synthesized, for example, by a method disclosed in Japanese Unexamined Patent Application, First Publication No. 2006-291177.

[Organic Solvent]

The organic solvent blended into the organic film-forming composition may be any organic solvent which can dissolve the respective components to give a uniform solution. For example, one or more kinds of any organic solvent can be appropriately selected from those which have been conventionally known as solvents for a chemically amplified resist. Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

Alternatively, as the organic solvent blended in the organic film-forming composition, an alcohol organic solvent, a fluorine organic solvent or an ether organic solvent having no hydroxyl group can be used. These organic solvents are less likely to dissolve the resist film which is formed from the aforementioned resist composition, and therefore is particularly used as an organic solvent for the organic film-forming composition.

The organic solvents described later can be used individually, or at least 2 solvents may be mixed together. In terms of coatability and properties of dissolving of materials such as the resin component and the like, an alcohol organic solvent is preferable.

The term "alcohol organic solvent" refers to a compound in which at least one hydrogen atom within an aliphatic hydrocarbon has been substituted with a hydroxyl group, and is a liquid at normal temperature (room temperature) and normal pressure (atmospheric pressure). The structure of the main chain constituting the aforementioned aliphatic hydrocarbon may be a chain-like structure or a cyclic structure, or may include a cyclic structure within the chain-like structure, or may include an ether bond within the chain-like structure.

A "fluorine organic solvent" is a compound containing a fluorine atom and is in the form of a liquid at normal temperature (room temperature) and normal pressure (atmospheric pressure).

An "ether organic solvent having no hydroxyl group" refers to a compound that contains an ether bond (C—O—C) within the molecule but has no hydroxyl group, and is in the form of a liquid at normal temperature (room temperature) and normal pressure (atmospheric pressure). The ether organic solvent having no hydroxyl group is preferably a compound having neither a hydroxyl group nor a carbonyl group.

As the alcohol organic solvent, a monohydric alcohol, a dihydric alcohol or a dihydric alcohol derivative is preferable.

Although it depends on the number of carbon atoms, as the monohydric alcohol, a primary or secondary alcohol is preferable, and a primary monohydric alcohol is particularly desirable.

The term "monohydric alcohol" refers to a compound in which a hydrocarbon compound composed of only carbon and hydrogen has one hydrogen atom substituted with a hydroxy group, and which does not include polyhydric alcohol derivatives having two or more hydroxy groups. The hydrocarbon compound may have a chain-like structure or a cyclic structure.

The term "dihydric alcohol" refers to a compound in which the aforementioned hydrocarbon compound has two hydrogen atoms substituted with hydroxy groups, and which does not include polyhydric alcohol derivatives having three or more hydroxy groups.

Examples of the dihydric alcohol derivative include compounds in which a dihydric alcohol has one hydroxy group substituted with a substituent (e.g., alkoxy group, alkoxyalkyloxy group or the like).

The boiling point of the alcohol organic solvent is preferably 80 to 160° C., more preferably 90 to 150° C., and in terms of coatability, stability of the composition during storage, and heat temperature, most preferably 100 to 135° C.

Specific examples of the alcohol organic solvent having a chain-like structure include propylene glycol (PG), 1-butoxy-2-propanol (PG), n-hexanol, 2-heptanol, 3-heptanol, 1-heptanol, 5-methyl-1-hexanol, 6-methyl-2-heptanol, 1-octanol, 2-octanol, 3-octanol, 4-octanol, 2-ethyl-1-hexanol, 2-(2-butoxyethoxy)ethanol, n-pentylalcohol, s-pentylalcohol, t-pentylalcohol, isopentylalcohol, isobutanol (also referred to as isobutylalcohol or 2-methyl-1-propanol), isopropylalcohol, 2-ethylbutanol, neopentylalcohol, n-butanol, s-butanol, t-butanol, 1-propanol, 2-methyl-1-butanol, 2-methyl-2-butanol and 4-methyl-2-pentanol.

Further, specific examples of those having a cyclic structure include cyclopentane methanol, 1-cyclopentylethanol, cyclohexanol, cyclohexane methanol (CM), cyclohexane ethanol, 1,2,3,6-tetrahydrobenzyl alcohol, exo-norborneol, 2-methylcyclohexanol, cycloheptanol, 3,5-dimethylcyclohexanol, and benzyl alcohol.

Among alcohol organic solvents, a monohydric alcohol or a dihydric alcohol derivative having a chain-like structure is preferable, 1-butoxy-2-propanol (BP), isobutanol (2-methyl-1-propanol), 4-methyl-2-pentanol or n-butanol is more preferable, and isobutanol (2-methyl-1-propanol) or 1-butoxy-2-propanol (BP) is particularly desirable.

As an example of a fluorine organic solvent, perfluoro-2-butyltetrahydrofuran can be given.

Preferable examples of the ether organic solvent having no hydroxyl group include compounds represented by general formula (s-1) shown below.

$R^{40}$—O—$R^{41}$ . . . (s-1) (In the formula, each of $R^{40}$ and $R^{41}$ independently represents a monovalent hydrocarbon group, provided that $R^{40}$ and $R^{41}$ may be mutually bonded to form a ring; and —O— represents an ether bond.

In the aforementioned formula, as the hydrocarbon group for $R^{40}$ and $R^{41}$, for example, an alkyl group, an aryl group or the like can be mentioned, and an alkyl group is preferable. It is more preferable that both of $R^{40}$ and $R^{41}$ represent an alkyl group, and it is particularly desirable that $R^{40}$ and $R^{41}$ represent the same alkyl group.

The alkyl group for $R^{40}$ and $R^{41}$ is not particularly limited and includes, for example, a linear, branched or cyclic alkyl group having 1 to 20 carbon atoms. Part or all of the hydrogen atoms of the alkyl group may or may not be substituted with halogen atoms or the like.

The alkyl group preferably has 1 to 15 carbon atoms, and more preferably 1 to 10 carbon atoms, because the coatability onto the resist film becomes satisfactory. Specific examples include an ethyl group, a propyl group, an isopropyl group, an n-butyl group, an isobutyl group, an n-pentyl group, an isopentyl group, a cyclopentyl group and a hexyl group, and an n-butyl group and an isopentyl group are particularly desirable.

The halogen atom, with which hydrogen atoms of the alkyl group may be substituted, is preferably a fluorine atom.

The aryl group for $R^{40}$ and $R^{41}$ is not particularly limited. For example, an aryl group having 6 to 12 carbon atoms, and in which part or all of the hydrogen atoms of the aryl group may or may not be substituted with alkyl groups, alkoxy groups, halogen atoms, or the like can be used.

The aryl group is preferably an aryl group having 6 to 10 carbon atoms because it can be synthesized at a low cost. Specific examples thereof include a phenyl group, a benzyl group and a naphthyl group.

The alkyl group, with which hydrogen atoms of the aryl group may be substituted, is preferably an alkyl group having 1 to 5 carbon atoms, and more preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and more preferably a methoxy group or an ethoxy group.

The halogen atom, with which hydrogen atoms of the aryl group may be substituted, is preferably a fluorine atom.

Alternatively, in the aforementioned formula, $R^{40}$ and $R^{41}$ may be mutually bonded to form a ring.

In this case, $R^{40}$ and $R^{41}$ each independently represents a linear or branched alkylene group (preferably an alkylene group of 1 to 10 carbon atoms) and the terminal of $R^{40}$ and the terminal of $R^{41}$ are bonded to form a ring. Further, a carbon atom of the alkylene group may be substituted with an oxygen atom.

Specific examples of such ether-based organic solvents include 1,8-cineole, tetrahydrofuran and dioxane.

The boiling point (at normal pressure) of the ether organic solvent having no hydroxyl group is preferably within a range from 30 to 300° C., more preferably from 100 to 200° C., and still more preferably from 140 to 180° C. When the boiling point of the ether organic solvent is at least as large as the lower limit of the above-mentioned temperature range, the organic solvent is less likely to evaporate during the spin coating process when applying a resist composition, thereby suppressing coating irregularities and improving the resulting coating properties. On the other hand, when the boiling point of the ether organic solvent is no more than the upper limit of the above-mentioned temperature range, the organic solvent is satisfactorily removed from the organic film by a bake treatment, thereby improving formability of the organic film. Further, when the boiling point of the ether organic solvent is within the above-mentioned temperature range, the stability of the composition upon storage are further improved. The above-mentioned temperature range for the boiling point of the ether organic solvent is also preferable from the viewpoints of the heating temperature.

Specific examples of the ether organic solvent having no hydroxyl group include 1,8-cineole (boiling point: 176° C.), dibutyl ether (boiling point: 142° C.), diisopentyl ether (boiling point: 171° C.), dioxane (boiling point: 101° C.), anisole (boiling point: 155° C.), ethylbenzyl ether (boiling point: 189° C.), diphenyl ether (boiling point: 259° C.), dibenzyl ether (boiling point: 297° C.), phenetole (boiling point: 170° C.), butylphenyl ether, tetrahydrofuran (boiling point: 66° C.), ethylpropyl ether (boiling point: 63° C.), diisopropyl ether (boiling point: 69° C.), dihexyl ether (boiling point: 226° C.), and dipropyl ether (boiling point: 91° C.).

In the present invention, the ether organic solvent having no hydroxyl group is preferably a cyclic or chain-like, ether-based organic solvent, and it is particularly desirable that the ether organic solvent having no hydroxyl group be at least one member selected from the group consisting of 1,8-cineole, dibutyl ether and diisopentyl ether.

The amount of the organic solvent blended in the organic film-forming composition is not particularly limited, and is appropriately adjusted to a concentration which enables coating of a coating solution to a resist film. For example, in the case where an organic film-forming composition containing an acid or acid generator component, a resin and an organic solvent is used, the amount of the organic solvent is preferably an amount such that the concentration of a resin becomes within the range from 0.2 to 10% by weight, and more preferably 1 to 5% by weight.

To the organic film-forming composition, if desired, surfactants, sensitizers, crosslinking agents, annihilation agents, stabilizers preservatives, coloring agents, plasticizers, antifoaming agents and the like can be appropriately added.

As the surfactants, nonionic surfactants, anionic surfactants, cationic surfactants, amphoteric surfactants, silicone surfactants, polyalkylene oxide-based surfactants, fluorinated surfactant and the like can be mentioned. In the case where surfactants are used, the amount thereof is preferably within a range from 0.01 to 0.5 parts by weight, and more preferably within a range from 0.02 to 0.1 parts by weight, relative to 100 parts by weight of the resin.

By the method of forming a resist pattern according to the present invention, by use of the developing process combined with an alkali developing solution and a chemically amplified resist composition which had been used as a positive resist composition, a negative resist pattern having a high resolution and an excellent shape can be formed.

In addition, by the method of forming a resist pattern according to the present invention, the resolution of the resist pattern (such as an isolated trench pattern, an extremely small, dense contact hole pattern, or the like), in which a region where the optical strength becomes weak is likely to be generated in the film thickness direction, becomes excellent.

By using a double patterning process in the method of forming a resist pattern according to the present invention, the number of steps can be reduced as compared to a double patterning in which the lithography step and the patterning step are required to be conducted at least two times, respectively.

In addition, the method of forming a resist pattern of the present invention can be conducted using a conventional exposure apparatus and a conventional equipment.

EXAMPLES

As follows is a description of examples of the present invention, although the scope of the present invention is by no way limited by these examples.

Production of Resist Composition 1

Production Examples 1A to 5A

The components shown in Table 1 were mixed together and dissolved to obtain resist compositions A to E.

TABLE 1

| | Component (A) | Component (C) | Component (Z) | Component (D) | Component (F) | Component (S) |
|---|---|---|---|---|---|---|
| Resist composition A | (A)-1A [100] | (C)-1A [20] | (G)-1 [4] | — | (F)-1 [3] | (S)-1 [3721.5] |
| Resist composition B | (A)-2A [100] | (C)-2A [15] | (G)-2 [10] | — | (F)-1 [3] | (S)-2 [3750.8] |
| Resist composition C | (A)-3A [100] | (C)-2A [15] | (G)-2 [10] | — | (F)-1 [3] | (S)-2 [3750.8] |
| Resist composition D | (A)-1A [100] | (C)-1A [10] | (G)-3 [10] | (D)-1 [4] | (F)-1 [3] | (S)-1 [3721.5] |
| Resist composition E | (A)-4A [100] | (C)-1A [10] | (G)-3 [10] | (D)-1 [4] | (F)-1 [3] | (S)-1 [3721.5] |

In Table 1, the values in brackets [ ] indicate the amount (in terms of parts by weight) of the component added, and the reference characters indicate the following.

(A)-1A: a copolymer represented by formula (A)-1A shown below [Mw=7,000, Mw/Mn=1.57, l/m/n=35/45/20 (compositional ratio of the copolymer (molar ratio)]

(A)-2A: a copolymer represented by formula (A)-2A shown below [Mw=7,000, Mw/Mn=1.56, l/m/n/o/p=35/25/20/15/5 (compositional ratio of the copolymer (molar ratio)]

(A)-3A: a copolymer represented by formula (A)-3A shown below [Mw=10,000, Mw/Mn=1.61, l/m/n=40/40/20 (compositional ratio of the copolymer (molar ratio)]

(A)-4A: a copolymer represented by formula (A)-4A shown below [Mw=7,000, Mw/Mn=1.87, l/m/n=40/40/20 (compositional ratio of the copolymer (molar ratio)]

(C)-1A and (C)-2A: compounds represented by chemical formulas (C)-1A and (C)-2A shown below (G)-1: a compound represented by formula (G)-1 shown below (pKa=−11.55)

(G)-2: a compound represented by formula (G)-2 shown below (pKa of cation moiety=5.7, pKa of anion moiety=−3.36)

(G)-3: a compound represented by formula (G)-3 shown below (pKa of cation moiety=5.7, pKa of anion moiety=−11.55)

(D)-1: heptafluorobutylamine ($CF_3CF_2CF_2CH_2NH_2$, boiling point=69° C., pKa=5.6)

(F)-1: a compound represented by formula (F)-1 shown below [Mw=24,000, Mw/Mn=1.38, l=100 (compositional ratio of the copolymer (molar ratio)]

(S)-1: a mixed solvent of PGMEA/PGME=6/4 (weight ratio)

(S)-2: a mixed solvent of PGMEA/PGME/cyclohexanone=45/30/25 (weight ratio)

[Chemical Formula 95]

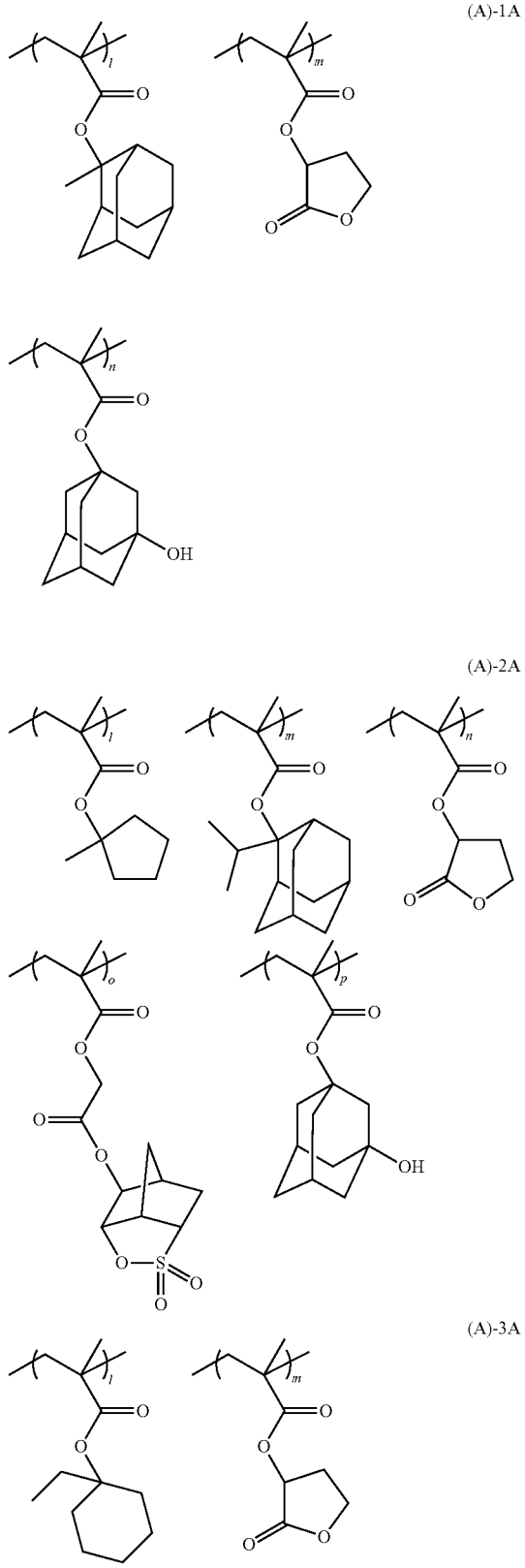

-continued

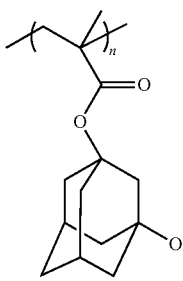

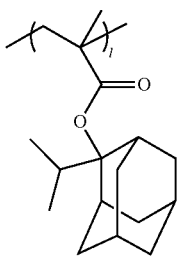
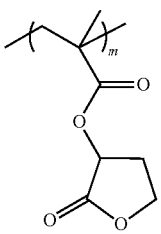

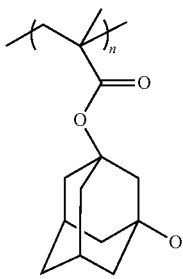

[Chemical Formula 96]

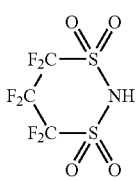 (C)-1A

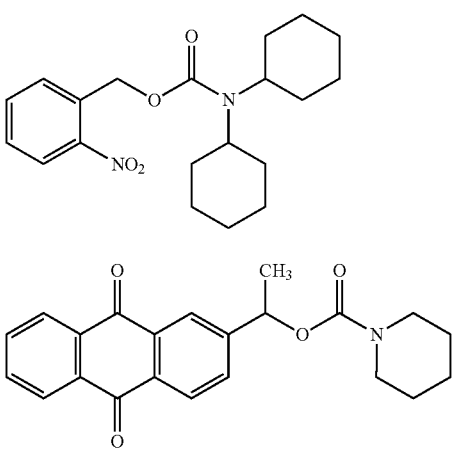

[Chemical Formula 97]

(G)-1

-continued (G)-3

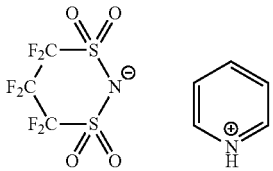

(G)-2

(A)-4A 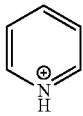

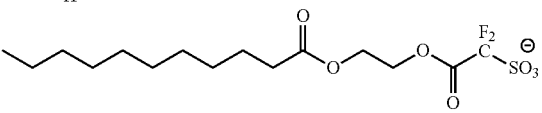

[Chemical Formula 98]

(F)-1

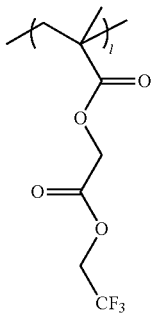

Examples 1A to 9A and Comparative Examples 1A to 10A

Formation of Resist Pattern 1

(Step (1))

An organic antireflection film composition (product name: ARC29A, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 79 nm.

Then, each of the resist compositions A to E obtained above was applied onto the anti-reflection film using a spinner, and was then prebaked (PAB) at a temperature indicated in Table 2 for 60 seconds and dried, thereby forming a resist film having a film thickness of 100 nm. It is noted that the PAB temperature of 23° C. means that the resist film had left to settle for 60 seconds on a cooling plate and a substantive bake treatment had not been conducted.

(Step (2))

Subsequently, the resist film was irradiated with an ArF excimer laser (193 nm) through a photomask targeting a space-and-line (SL) pattern with a space width of 140 nm and a pitch of 280 nm, using an ArF exposure apparatus NSR-S302 (manufactured by Nikon Corporation; NA (numerical aperture)=0.60, ⅔ annular illumination).

(Step (3))

Further, a post exposure bake (PEB) was conducted for 60 seconds at a temperature indicated in Table 2.

(Step (4))

Next, alkali development for 30 seconds at 23° C. in a 2.38% by weight aqueous solution of tetramethylammonium hydroxide (TMAH) (trade name: NMD-3; manufactured by Tokyo Ohka Kogyo Co., Ltd.) was conducted.

As a result, in Examples 1A to 9A and Comparative Examples 1A to 5A, an SL pattern with a space width of 140 nm and a pitch of 280 nm was formed on the resist film. On the other hand, in Comparative Examples 6A to 10A, an SL pattern could not be resolved.

<Evaluation of Sensitivity>

The optimum exposure dose Eop (mJ/cm$^2$) with which an SL pattern having a space width of 140 nm and a pitch of 280 nm was formed was determined. The results are indicated as "sensitivity" in Table 2.

<Evaluation of Resolution>

The critical resolution (nm) of the SL pattern formed with the above Eop was determined using a scanning electron microscope (product name: S-9380, manufactured by Hitachi High-Technologies Corporation). The results are indicated under "resolution" in Table 2.

TABLE 2

| | Resist composition | PAB temperature (° C.) | PEB temperature (° C.) | Sensitivity (mJ/cm$^2$) | Resolution (nm) |
|---|---|---|---|---|---|
| Example 1A | E | 23 | 80 | 5 | 120 |
| Example 2A | B | 70 | 90 | 5 | 120 |
| Example 3A | C | 70 | 90 | 4 | 120 |
| Example 4A | E | 23 | 90 | 20 | 120 |
| Example 5A | A | 70 | 100 | 10 | 120 |
| Example 6A | B | 70 | 100 | 13 | 120 |
| Example 7A | C | 70 | 100 | 25 | 140 |
| Example 8A | D | 70 | 100 | 6 | 140 |
| Example 9A | E | 23 | 100 | 35 | 120 |
| Comparative Example 1A | A | 70 | 110 | 75 | 120 |
| Comparative Example 2A | B | 70 | 110 | 55 | 120 |
| Comparative Example 3A | C | 70 | 110 | 61 | 140 |
| Comparative Example 4A | D | 70 | 110 | 59 | 140 |
| Comparative Example 5A | E | 23 | 110 | 79 | 120 |
| Comparative Example 6A | A | 70 | 120 | Not resolved | |
| Comparative Example 7A | B | 70 | 120 | Not resolved | |
| Comparative Example 8A | C | 70 | 120 | Not resolved | |
| Comparative Example 9A | D | 70 | 120 | Not resolved | |
| Comparative Example 10A | E | 23 | 120 | Not resolved | |

As seen from the results, in Examples 1A to 9A in which PEB treatment was conducted at a temperature of 100° C. or lower, a negative pattern having high resolution could be formed, and further, the sensitivity when forming a negative pattern was excellent degree as 50 mJ/cm$^2$ or less. On the other hand, in Comparative Examples 1A to 5A in which PEB treatment was conducted at 110° C., sensitivity was deteriorated as compared to Examples 1A to 9A, and in Comparative Examples 6A to 10A in which PEB treatment was conducted at 120° C., a negative pattern could not be resolved.

Production of Resist Composition 2

Examples 1B to 7B and Comparative Examples 1B to 3B

The components shown in Table 3 were mixed together and dissolved to obtain resist compositions.

TABLE 3

| Resist composition | Component (A) | Component (C) | Component (Z) | Component (D) | Component (F) | Component (S) |
|---|---|---|---|---|---|---|
| Example 1B | (A)-1B | (C)-1B | (G)-3 | (D)-1 | (F)-1 | (S)-1 |
| | [100] | [10.0] | [10.0] | [5.0] | [3.0] | [3700] |
| Example 2B | (A)-1B | (C)-2B | (G)-3 | (D)-1 | (F)-1 | (S)-1 |
| | [100] | [9.6] | [10.0] | [5.0] | [3.0] | [3700] |
| Example 3B | (A)-1B | (C)-3B | (G)-3 | (D)-1 | (F)-1 | (S)-1 |
| | [100] | [7.8] | [10.0] | [5.0] | [3.0] | [3700] |
| Example 4B | (A)-1B | (C)-4B | (G)-3 | (D)-1 | (F)-1 | (S)-1 |
| | [100] | [8.6] | [10.0] | [5.0] | [3.0] | [3700] |
| Example 5B | (A)-1B | (C)-5B | (G)-3 | (D)-1 | (F)-1 | (S)-1 |
| | [100] | [8.7] | [10.0] | [5.0] | [3.0] | [3700] |
| Example 6B | (A)-1B | (C)-6B | (G)-3 | (D)-1 | (F)-1 | (S)-1 |
| | [100] | [7.7] | [10.0] | [5.0] | [3.0] | [3700] |
| Example 7B | (A)-1B | (C)-7B | (G)-3 | (D)-1 | (F)-1 | (S)-1 |
| | [100] | [7.5] | [10.0] | [5.0] | [3.0] | [3700] |
| Comparative Example 1B | (A)-1B | (C)-8B | (G)-3 | (D)-1 | (F)-1 | (S)-1 |
| | [100] | [6.9] | [10.0] | [5.0] | [3.0] | [3700] |
| Comparative Example 2B | (A)-1B | (C)-9B | (G)-3 | (D)-1 | (F)-1 | (S)-1 |
| | [100] | [8.9] | [10.0] | [5.0] | [3.0] | [3700] |
| Comparative Example 3B | (A)-1B | (C)-10B | (G)-3 | (D)-1 | (F)-1 | (S)-1 |
| | [100] | [9.4] | [10.0] | [5.0] | [3.0] | [3700] |

In Table 3, the values in brackets [ ] indicate the amount (in terms of parts by weight) of the component added, and the reference characters indicate the following.

(A)-1B: a copolymer represented by chemical formula (A1-1B) shown below [Mw=7,000, Mw/Mn=1.56]

In the chemical formula, the subscript numerals shown on the bottom right of the parentheses ( ) indicate the percentage (mol %) of the respective structural units.

[Chemical Formula 99]

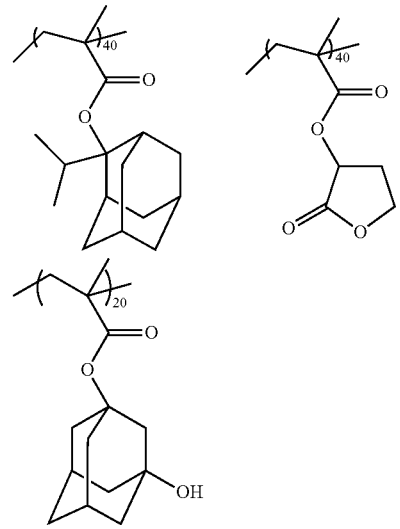

(A1-1B)

(C)-1B to (C)-10B: compounds represented by chemical formulas (C)-1B to (C)-10B shown below

[Chemical Formula 100]

(C)-1B
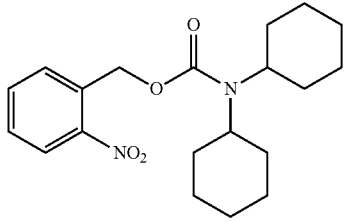

(C)-2B
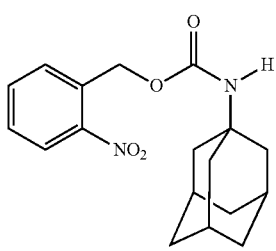

(C)-3B
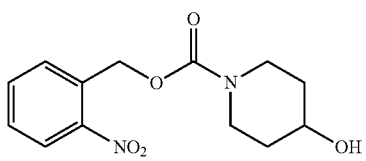

(C)-4B
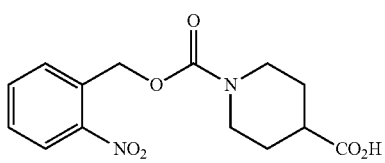

(C)-5B
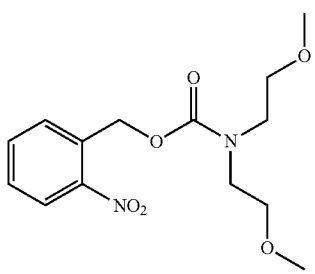

(C)-6B
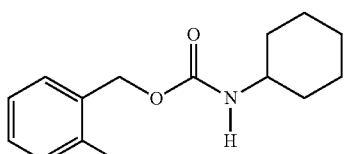

(C)-7B
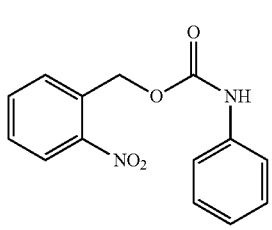

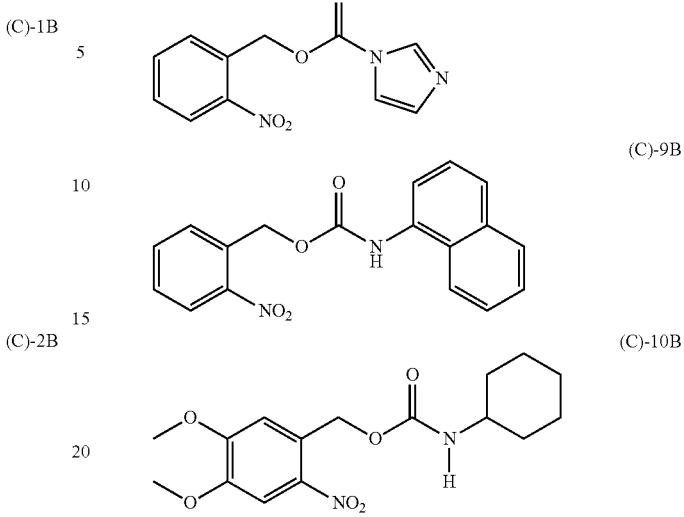

(G)-3: a compound represented by chemical formula (G)-3 shown below (D)-1: heptafluorobutylamine ($CF_3CF_2CF_2CH_2NH_2$, boiling point=69° C., pKa=5.6)

(F)-1: a polymer represented by chemical formula (F)-1 shown below [Mw=24,000, Mw/Mn=1.38]

In the chemical formula, the subscript numerals shown on the bottom right of the parentheses ( ) indicate the percentage (mol %) of the respective structural units.

(S)-1: a mixed solvent of propylene glycol monomethyl ether acetate/propylene glycol monomethyl ether=6/4 (weight ratio)

[Chemical Formula 101]

(G)-3
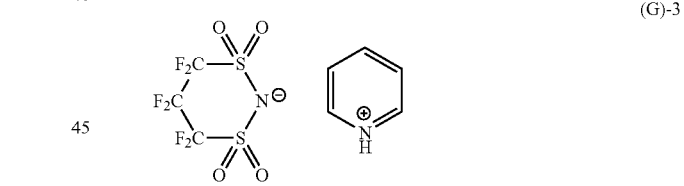

(F)-1
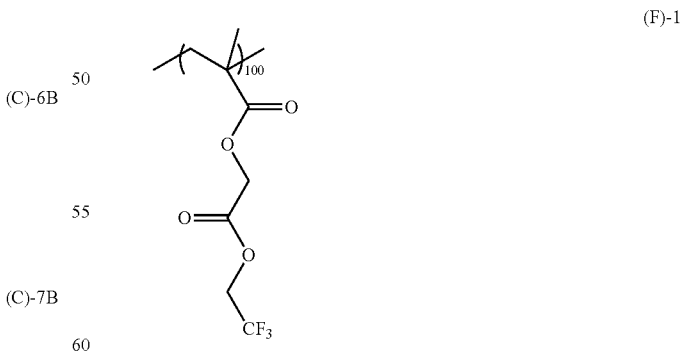

Formation of Resist Pattern 2

Step (1)

An organic antireflection film composition (product name: ARC29A, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 79 nm.

Next, each of the resist compositions was applied to the organic antireflection film by spin-coating, and resist films having a film thickness of 100 nm were formed, respectively.

Step (2)

Subsequently, the obtained resist film was not subjected to prebake (PAB), left to settle for 60 seconds on a cooling plate, and the resist film was irradiated with an ArF excimer laser (193 nm) through a photomask (6% half tone) targeting an SL pattern with a space width of 140 nm and a pitch of 280 nm, using an ArF exposure apparatus NSR-S302 (manufactured by Nikon Corporation; NA (numerical aperture)=0.60, ⅔ annular illumination).

Step (3)

Further, a post exposure bake (PEB) was conducted for 60 seconds at 90° C.

Step (4)

Next, alkali development for 30 seconds at 23° C. in a 2.38% by weight aqueous solution of tetramethylammonium hydroxide (TMAH) (trade name: NMD-3; manufactured by Tokyo Ohka Kogyo Co., Ltd.) was conducted.

[Evaluation of Sensitivity]

The optimum exposure dose Eop (mJ/cm$^2$) with which an SL pattern having a space width of 140 nm and a pitch of 280 nm was formed was determined. The results are shown in Table 4.

[Evaluation of Resolution]

The resolution when forming a resist pattern targeting an SL pattern having a space width of 140 nm and a pitch of 280 nm was evaluated according to the evaluation criteria as described below. The results are shown in Table 4.

(Evaluation Criteria)

A: The unexposed portions of the resist film was dissolved and removed, excellent contrast could be obtained, and an LS pattern having high resolution could be formed.

B; A resist pattern could be formed, however, the residual film was observed, and resolution was deteriorated.

C: A pattern could not be resolved.

[Evaluation of Resist Pattern Shape]

The cross-sectional shape of the pattern formed in the above [evaluation of resolution] was observed using a scanning electron microscope (product name: SU-8000, manufactured by Hitachi High-Technologies Corporation), and the cross-sectional shape was evaluated according to the evaluation criteria described below. The results are shown in Table 4.

(Criteria for Evaluation)

A: high rectangularity and excellent shape

B: moderate T-top shape

C: rounded top shape

<Evaluation of Presence or Absence of Residual Film>

According to the aforementioned <formation of resist pattern 2>, a resist film having a thickness of 100 nm was formed in the step (1), and the steps (1) to (4) were conducted in the same manner as the aforementioned <formation of resist pattern 2>, except that irradiation of ArF excimer laser (193 nm) was not conducted in the step (2), and then "presence or absence of residual film" of the resist film formed on the substrate was evaluated according to the evaluation criteria as described below. The results are shown in Table 4.

(Evaluation Criteria)

A: A residual film was not observed.

B: A residual film was observed.

<Evaluation of Photoabsorption Property of Component (C)>

The photoabsorption properties of the photo-base generator component were evaluated according to the following procedure.

Step (1): the resist compositions of the aforementioned Examples and Comparative Examples, and resist compositions of the aforementioned Examples and Comparative Examples to which the component (C) has not been added were applied to an 8-inch silicon wafer using a spinner, respectively, and resist films were formed.

Step (2): Extinction coefficient at a wavelength of 193 nm using a spectroscopic ellipsometer (product name: VUV-VASE VU-302, manufactured by J. A. Woollam Co., Inc.).

Step (3): From the result, with respect to each of Examples and Comparative Examples, a difference in the extinction coefficient caused by the presence or absence of the components (C) was calculated.

Calculated values in each case were determined as a value relative to 100% of Example 1B. The results are indicated as "absorbance of component (C)" in Table 4.

The larger value of the "absorbance of component (C)" means the poorer transparency of the resist film.

TABLE 4

|  | Base generated from component (C) upon exposure | Eop (mJ/cm$^2$) | Resolution | Resist pattern shape | Residual film | Absorbance of component (C) (%) |
| --- | --- | --- | --- | --- | --- | --- |
| Example 1B | Dicyclohexylamine (secondary amine) | 23.0 | A | A | A | 100 |
| Example 2B | Adamantaneamine (primary amine) | 10.5 | A | A | A | 84 |
| Example 3B | Hydroxypiperidine (secondary amine) | 20.5 | A | A | A | 105 |
| Example 4B | Piperidinecarboxylic acid (secondary amine) | 13.0 | A | A | A | 106 |
| Example 5B | Dimethoxyethylamine (secondary amine) | 8.5 | A | A | A | 83 |
| Example 6B | Monocyclohexylamine (primary amine) | 20.0 | A | A | A | 78 |
| Example 7B | Aniline (primary amine) | 14.5 | A | B | A | 179 |
| Comparative Example 1B | Imidazole (secondary amine) | — | B | — | B | 90 |

TABLE 4-continued

|  | Base generated from component (C) upon exposure | Eop (mJ/cm²) | Resolution | Resist pattern shape | Residual film | Absorbance of component (C) (%) |
|---|---|---|---|---|---|---|
| Comparative Example 2B | Naphthylamine (primary amine) | — | C | — | A | 111 |
| Comparative Example 3B | Monocyclohexylamine (primary amine) | — | C | — | A | 101 |

From the results shown in Table 4, it was confirmed that the resist composition of Examples 1B to 7B were capable of forming a negative pattern having high resolution and having a excellent shape.

The result of comparison between the results of Examples 1B to 6B and the result of Example 7B, it was confirmed that the component (C) (that is, (C)-1 to (C)-6) in which at least one of $R^1$ and $R^2$ in the general formula (C1-1-1) had contained an alkyl group was capable of suppressing the photo-absorption properties, as compared to the component (C) (that is, (C)-7) in which at least one of $R^1$ and $R^2$ had contained a phenyl group. From the results, it was presumed that the resist compositions of Examples 1B to 6B had exhibited high rectangularity, as compared to the resist composition of Example 7B.

The result of comparison between the results of Example 7B and the result of Comparative Example 2B, it was presumed that in terms of property of a base generated upon exposure, in the case where one of $R^1$ and $R^2$ was a naphthyl group ((C)-9) having more aromatic rings than a phenyl group, the amount of base generated upon exposure was insufficient, and therefore, when using the resist composition of Comparative Example 2B, a resist pattern could not be resolved.

In addition, with respect to the resist composition of Comparative Example 3B, it was presumed that because the amount of base generated upon exposure was insufficient, a resist pattern could not be resolved, as well as the resist composition of Comparative Example 2B. As described above, it was confirmed that even if the component (C) had contained a benzene ring having a nitro group on ortho position, when the benzene ring has a substrate other than the nitro group (in Comparative Example 3B, two alkoxy groups), the generation efficiency of a base upon exposure was changed, and therefore the effect of the present invention could not be obtained.

When the resist composition of Comparative Example 1B was used, the residual film was observed. From the result, it is presumed that part of the acidic compound component ((G)-3) was deactivated prior to exposure, and therefore, the resolution was deteriorated.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition comprising:
   a base component (A) that exhibits increased solubility in an alkali developing solution by the action of acid;
   a photo-base generator component (C) that generates a base upon; and
   an acidic compound component (G),
   the photo-base generator component (C) comprising a compound represented by general formula (C1-1-1) shown below:

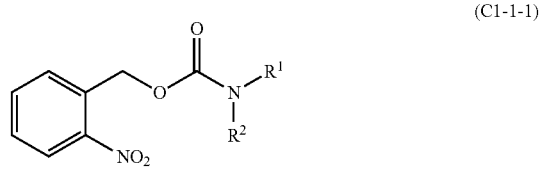

(C1-1-1)

wherein each of $R^1$ and $R^2$ independently represents a hydrogen atom, an alkyl group which may have a substituent, or a phenyl group which may have a substituent, provided that at least one of $R^1$ and $R^2$ represents an alkyl group or a phenyl group, and $R^1$ and $R^2$ may be mutually bonded to form a ring together with the nitrogen atom in the formula, and wherein the acidic compound component (G) comprises an acidic salt (G1) or an acid other than the acidic salt (G2), wherein the acidic salt (G1) is an ionic compound consisting of a nitrogen-containing cation moiety represented by any one of general formulas (G1c-11) to (G1c-13) shown below and at least one counteranion selected from the group consisting of counteranions represented by formulae (b1) to (b9) and (G1a-3) shown below, and wherein the acid other than the acidic salt (G2) is an acid component represented by formula (G2-31) shown below;

(G1c-11)

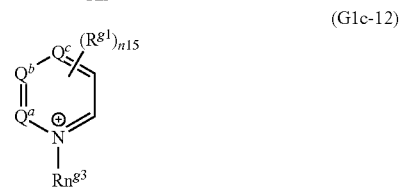

(G1c-12)

-continued (G1c-13)

wherein $Rf^{g1}$ represents a fluorinated alkyl group of 1 to 12 carbon atoms; each of $Rn^{g1}$ and $R^{g2}$ independently represents a hydrogen atom or an alkyl group of 1 to 5 carbon atoms, and $Rn^{g1}$ and $R^{g2}$ may be mutually bonded to form a ring; each of $Q^a$ to $Q^c$ independently represents a carbon atom or a nitrogen atom; $Rn^{g3}$ represents a hydrogen atom; each of $Rn^{g4}$ and $Rn^{g5}$ independently represents an aromatic hydrocarbon group or an alkyl group of 1 to 5 carbon atoms; each of $R^{g1}$ and $R^{g2}$ independently represents a hydrocarbon group; each of n15 and n16 represents an integer of 0 to 4; when n15 and n16 represents an integer of 2 or more, a plurality of $R^{g1}$ and $R^{g2}$ with which the hydrogen atoms on the adjacent carbon atom have been substituted may be mutually bonded to form a ring;

(b1)
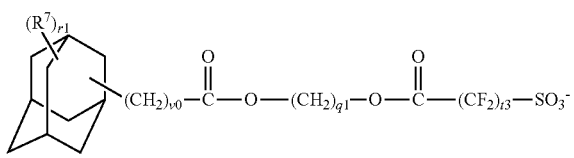

(b2)
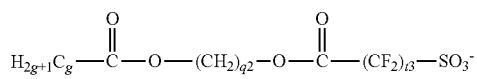

(b3)
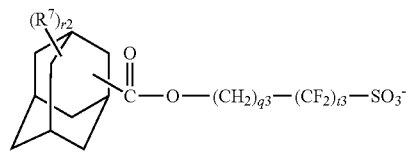

(b4)
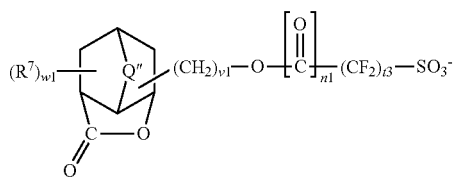

(b5)
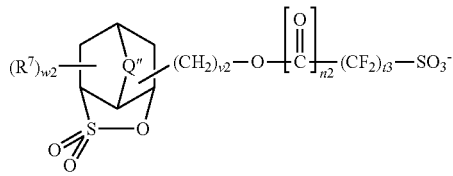

(b6)
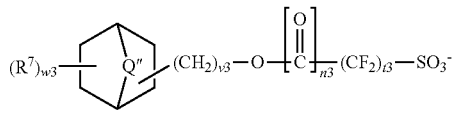

(b7)

(b8)
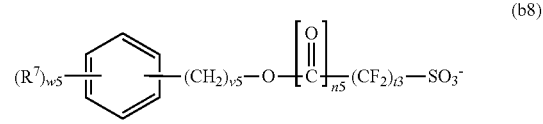

(b9)
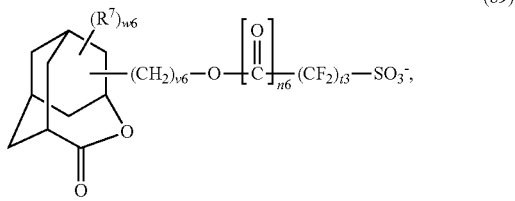

wherein each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n6 independently represents 0 or 1; each of v0 to v6 independently represents an integer of 0 to 3; each of w1 to w6 independently represents an integer of 0 to 3; and Q" is the same as defined above; and (G1a-3)

wherein, X" represents an alkylene group of 2 to 6 carbon atoms in which at least one hydrogen atom has been substituted with a fluorine atom; and (G2-31)
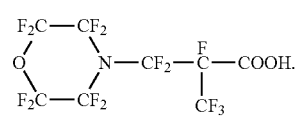

2. A method of forming a resist pattern comprising:
applying a resist composition to a substrate to form a resist film, the resist composition comprising a base component (A) that exhibits increased solubility in an alkali developing solution by the action of acid, a photo-base generator component (C) that generates a base upon exposure and comprises a compound represented by general formula (C1-1-1) shown below, and an acidic compound component (G);
subjecting the resist film to exposure;
baking after subjecting the resist film to exposure, wherein at an exposed portion of the resist film, the base generated from the photo-base generator component (C) upon exposure and an acid provided to the resist film in advance are neutralized, and at an unexposed portion of the resist film, the solubility of the base component (A) in an alkali developing solution is increased by the action of acid provided to the resist film in advance; and subjecting the resist film to an alkali development, thereby forming a negative-tone resist pattern in which the unexposed portion of the resist film has been dissolved and removed:

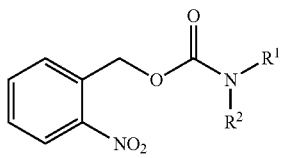
(C1-1-1)

wherein, each of $R^1$ and $R^2$ independently represents a hydrogen atom, an alkyl group which may have a substituent, or a phenyl group which may have a substituent, provided that at least one of $R^1$ and $R^2$ represents an alkyl group or a phenyl group, and $R^1$ and $R^2$ may be mutually bonded to form a ring together with the nitrogen atom in the formula, wherein the acidic compound component (G) comprises an acidic salt (G1) or an acid other than the acidic salt (G2), wherein the acidic salt (G1) is an ionic compound consisting of a nitrogen-containing cation moiety represented by any one of general formulas (G1c-11) to (G1c-13) shown below and at least one counteranion selected from the group consisting of counteranions represented by formulae (b1) to (b9) and (G1a-3) shown below, and wherein the acid other than the acidic salt (G2) is an acid component represented by formula (G2-31) shown below;

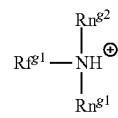
(G1c-11)

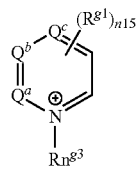
(G1c-12)

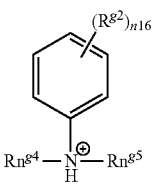
(G1c-13)

wherein $Rf^{g1}$ represents a fluorinated alkyl group of 1 to 12 carbon atoms; each of $Rn^{g1}$ and $R^{g2}$ independently represents a hydrogen atom or an alkyl group of 1 to 5 carbon atoms, and $Rn^{g1}$ and $R^{g2}$ may be mutually bonded to form a ring; each of $Q^a$ to $Q^c$ independently represents a carbon atom or a nitrogen atom; $Rn^{g3}$ represents a hydrogen atom; each of $Rn^{g4}$ and $Rn^{g5}$ independently represents an aromatic hydrocarbon group or an alkyl group of 1 to 5 carbon atoms; each of $R^{g1}$ and $R^{g2}$ independently represents a hydrocarbon group; each of n15 and n16 represents an integer of 0 to 4; when n15 and n16 represents an integer of 2 or more, a plurality of $R^{g1}$ and $R^{g2}$ with which the hydrogen atoms on the adjacent carbon atom have been substituted may be mutually bonded to form a ring;

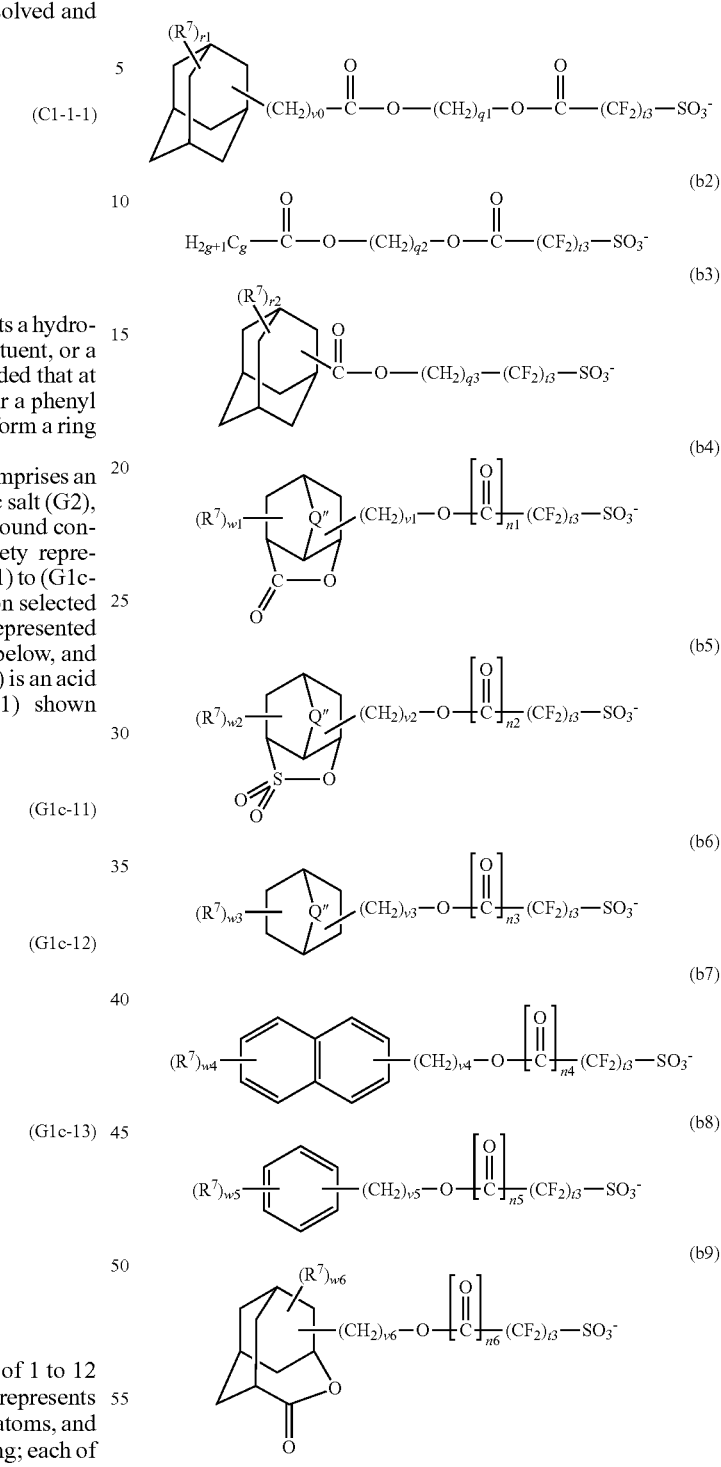

wherein each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n6 independently represents 0 or 1; each of v0 to v6 independently represents an integer of 0 to 3; each of w1 to w6 independently represents an integer of 0 to 3; and Q" is the same as defined above; and (G1a-3)

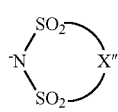

wherein, X" represents an alkylene group of 2 to 6 carbon atoms in which at least one hydrogen atom has been substituted with a fluorine atom; and (G2-31)

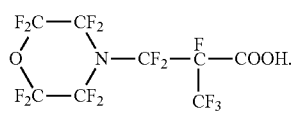

3. The method of forming a resist pattern according to claim 2, wherein the resist composition further comprises an acidic compound component or an acid generator component.

4. A method of forming a resist pattern comprising:

applying a resist composition comprising a base component (A) that exhibits increased solubility in an alkali developing solution by the action of acid, a photo-base generator component (C) that generates a base upon exposure, and an acidic compound component (G) to a substrate to form a resist film;

subjecting the resist film to exposure;

baking after subjecting the resist film to exposure, wherein, at an exposed portion of the resist film, the base generated from the photo-base generator component (C) upon exposure and an acid provided to the resist film in advance are neutralized, and at an unexposed portion of the resist film, the solubility of the base component (A) in an alkali developing solution is increased by the action of acid provided to the resist film in advance; and subjecting the resist film to an alkali development, thereby forming a negative-tone resist pattern in which the unexposed portion of the resist film has been dissolved and removed, wherein the baking is conducted at 100° C. or lower, wherein the acidic compound component (G) comprises an acidic salt (G1) or an acid other than the acidic salt (G2), wherein the acidic salt (G1) is an ionic compound consisting of a nitrogen-containing cation moiety represented by any one of general formulas (G1c-11) to (G1c-13) shown below and at least one counteranion selected from the group consisting of counteranions represented by formulae (b1) to (b9) and (G1a-3) shown below, and wherein the acid other than the acidic salt (G2) is an acid component represented by formula (G2-31) shown below;

(G1c-11)

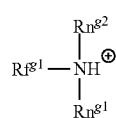

(G1c-12)

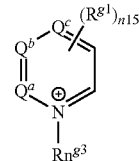

(G1c-13)

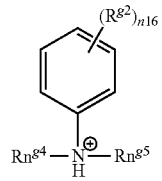

wherein $Rf^{g1}$ represents a fluorinated alkyl group of 1 to 12 carbon atoms; each of $Rn^{g1}$ and $R^{g2}$ independently represents a hydrogen atom or an alkyl group of 1 to 5 carbon atoms, and $Rn^{g1}$ and $R^{g2}$ may be mutually bonded to form a ring; each of $Q^a$ to $Q^c$ independently represents a carbon atom or a nitrogen atom; $Rn^{g3}$ represents a hydrogen atom; each of $Rn^{g4}$ and $Rn^{g5}$ independently represents an aromatic hydrocarbon group or an alkyl group of 1 to 5 carbon atoms; each of $R^{g1}$ and $R^{g2}$ independently represents a hydrocarbon group; each of n15 and n16 represents an integer of 0 to 4; when n15 and n16 represents an integer of 2 or more, a plurality of $R^{g1}$ and $R^{g2}$ with which the hydrogen atoms on the adjacent carbon atom have been substituted may be mutually bonded to form a ring;

(b1)

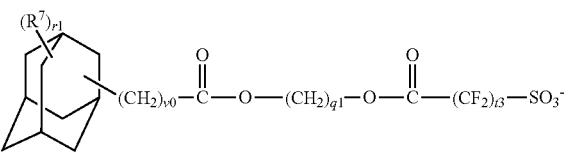

(b2)

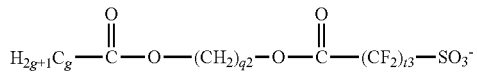

(b3)

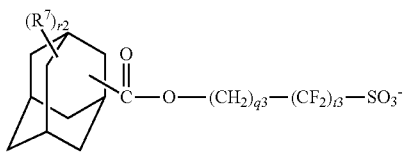

(b4)

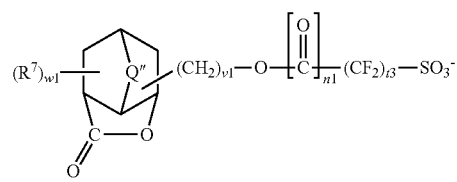

(b5)

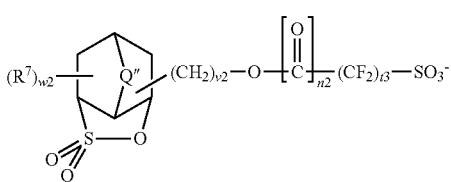

-continued (b6)
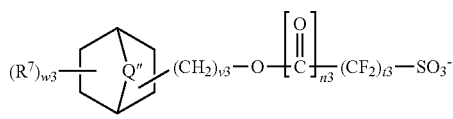

(b7)
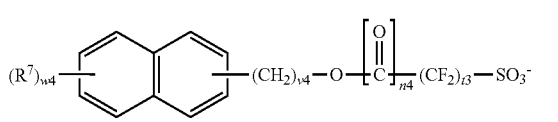

(b8)
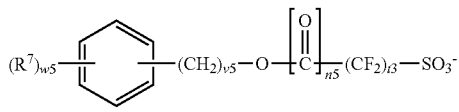

(b9)
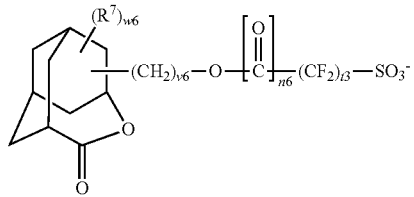

wherein each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n6 independently represents 0 or 1; each of v0 to v6 independently represents an integer of 0 to 3; each of w1 to w6 independently represents an integer of 0 to 3; and Q" is the same as defined above; and (G1a-3)
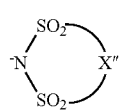

wherein, X" represents an alkylene group of 2 to 6 carbon atoms in which at least one hydrogen atom has been substituted with a fluorine atom; and (G2-31)
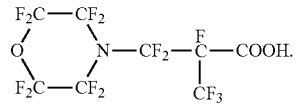

5. The method of forming a resist pattern according to claim 4, wherein the baking is conducted at 60 to 100° C.

6. The method of forming a resist pattern according to claim 4, wherein the photo-base generator component (C) comprises a compound represented by general formula (C1-1-1) shown below:

(C1-1-1)
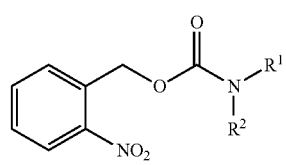

wherein, each of $R^1$ and $R^2$ independently represents a hydrogen atom, an alkyl group which may have a substituent, or a phenyl group which may have a substituent, provided that at least one of $R^1$ and $R^2$ represents an alkyl group or a phenyl group, and $R^1$ and $R^2$ may be mutually bonded to form a ring together with the nitrogen atom in the formula.

7. The resist composition according to claim 1, wherein the acidic compound component (G) comprises the acidic salt (G1).

8. The method of forming a resist pattern according to claim 2, wherein the acidic compound component (G) comprises the acidic salt (G1).

9. The method of forming a resist pattern according to claim 4, wherein the acidic compound component (G) comprises the acidic salt (G1).

* * * * *